United States Patent
Fujikawa et al.

(10) Patent No.: US 7,671,387 B2
(45) Date of Patent: Mar. 2, 2010

(54) LATERAL JUNCTION FIELD EFFECT TRANSISTOR AND METHOD OF MANUFACTURING THE SAME

(75) Inventors: Kazuhiro Fujikawa, Osaka (JP); Shin Harada, Osaka (JP); Kenichi Hirotsu, Osaka (JP); Satoshi Hatsukawa, Osaka (JP); Takashi Hoshino, Osaka (JP); Hiroyuki Matsunami, Kyoto (JP); Tsunenobu Kimoto, Kyoto (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/179,320

(22) Filed: Jul. 24, 2008

(65) Prior Publication Data
US 2008/0277696 A1    Nov. 13, 2008

Related U.S. Application Data

(62) Division of application No. 11/402,701, filed on Apr. 11, 2006, now Pat. No. 7,420,232, which is a division of application No. 10/496,040, filed as application No. PCT/JP02/12608 on Dec. 2, 2002, now Pat. No. 7,049,644.

(30) Foreign Application Priority Data
Mar. 15, 2002    (JP)    ............................. 2002-071944

(51) Int. Cl.
*H01L 29/80*    (2006.01)
(52) U.S. Cl. ............................... 257/270; 257/E21.445
(58) Field of Classification Search ......... 257/270–274, 257/E21.445, 368; 438/196
See application file for complete search history.

(56) References Cited

U.S. PATENT DOCUMENTS

| 3,755,012 A | 8/1973 | George et al. |
| 5,012,305 A | 4/1991 | Khadder et al. |
| 5,264,713 A | 11/1993 | Palmour |

(Continued)

FOREIGN PATENT DOCUMENTS

EP    0 053 854 A1    6/1982

(Continued)

OTHER PUBLICATIONS

T. Fujihira, "Theory of semiconductor superjunction devices", Jpn. J. Appl. Phys. 36:6254-6262 (1997).

(Continued)

*Primary Examiner*—Nathan W Ha
(74) *Attorney, Agent, or Firm*—Fish & Richardson P.C.

(57) ABSTRACT

A lateral junction field effect transistor includes a first gate electrode layer arranged in a third semiconductor layer between source/drain region layers, having a lower surface extending on the second semiconductor layer, and doped with p-type impurities more heavily than the second semiconductor layer, and a second gate electrode layer arranged in a fifth semiconductor layer between the source/drain region layers, having a lower surface extending on a fourth semiconductor layer, having substantially the same concentration of p-type impurities as the first gate electrode layer, and having the same potential as the first gate electrode layer. Thereby, the lateral junction field effect transistor has a structure, which can reduce an on-resistance while maintaining good breakdown voltage properties.

8 Claims, 42 Drawing Sheets

U.S. PATENT DOCUMENTS

| | | | |
|---|---|---|---|
| 6,005,267 A * | 12/1999 | Griffin et al. | 257/280 |
| 6,020,607 A * | 2/2000 | Nagai | 257/266 |
| 6,020,608 A * | 2/2000 | Kamashita | 257/270 |
| 6,855,969 B2 * | 2/2005 | Inoh | 257/250 |
| 2001/0030338 A1 | 10/2001 | Noble | |
| 2003/0151101 A1 | 8/2003 | Rumennik et al. | |
| 2003/0168704 A1 | 9/2003 | Harada et al. | |
| 2004/0217419 A1 | 11/2004 | Rumennik et al. | |

FOREIGN PATENT DOCUMENTS

| | | |
|---|---|---|
| EP | 0 735 589 A2 | 10/1996 |
| GB | 2 355 584 A | 4/2001 |
| JP | 63131579 A | 6/1988 |
| JP | 02005533 A | 1/1990 |
| JP | 2001274414 A | 10/2001 |

OTHER PUBLICATIONS

N. Kaminski et al., "Punch-through behaviour of wide bandgap materials (with example in 6H-SiC) and its benefit to JFETS", Materials Science Forum (264-268):1073-1076 (1998).

R. A. Muggli, "Double gate bipolar compatible n-channel junction FET," IBM Technical Disclousre Bulletin, vol. 24, No. 2, pp. 997-998 (Jul. 1981).

* cited by examiner

US 7,671,387 B2

LATERAL JUNCTION FIELD EFFECT TRANSISTOR AND METHOD OF MANUFACTURING THE SAME

CROSS-REFERENCE TO RELATED APPLICATION(S)

This application is a divisional of U.S. Ser. No. 11/402,701, filed on Apr. 11, 2006, which is a divisional of U.S. Ser. No. 10/496,040, filed on May 19, 2004.

TECHNICAL FIELD

The present invention relates to a lateral junction field effect transistor, and particularly to a structure of a lateral junction field effect transistor, of which on-resistance can be reduced while maintaining good breakdown voltage properties, as well as a method of manufacturing the same.

BACKGROUND ART

In a lateral junction field effect transistor, which may also be referred to as a "lateral JFET" hereinafter, a gate electrode applies a reverse bias voltage to a pn junction located on a side of a channel region, through which carriers pass, so that a depletion layer stretches from the pn junction into the channel region. Thereby, a conductance of the channel region is controlled to perform operations such as switching. Particularly, the lateral JFET is configured to move the carriers parallel to an element surface in the channel region.

The carriers in the channel may be either electrons (n-type) or holes (p-type). However, the JFET having a semiconductor substrate made of SiC usually employs a channel region formed of an n-type impurity region in many cases. For the sake of illustration, therefore, it is assumed in the following description that carriers in a channel are electrons, and thus a channel region is formed of an n-type impurity region. Naturally, the channel region may be formed of a p-type impurity region.

FIG. 72 is a cross section showing a conventional lateral JFET (U.S. Pat. No. 5,264,713, "Junction Field Effect Transistor in Silicon Carbide"). A $p^+$-type epitaxial layer 112 is arranged on an n-type SiC substrate 110, and an $n^-$-type channel layer 114 is arranged on epitaxial layer 112. On one and the other portions of channel layer 114 located on opposite sides of a trench 124, an $n^+$-type source region 116 and an $n^+$-type drain region 118 are arranged, respectively. Source and drain electrodes 120 and 122 are arranged on source and drain regions 116 and 118, respectively. A gate contact layer 130 is formed on a rear surface of SiC substrate 110, and a gate electrode (not shown) is arranged on gate contact layer 130. Trench 124 located between source/drain regions 116 and 118 extends into channel layer 114. A channel C is formed in a portion of epitaxial layer 114 of a second conductivity type located between trench 124 and epitaxial layer 112 of the first conductivity type.

Epitaxial layer 112 is doped with p-type impurities more heavily than epitaxial layer 114 including the channel and doped with n-type impurities, and therefore is configured such that the reverse bias voltage applied to the junction portion enlarges the depletion layer toward the channel. When the depletion layer fills the channel, a current cannot pass through the channel so that an off state is attained. Therefore, a magnitude of the reverse bias voltage can be controlled to fill the channel region with the depletion layer filling, and not to fill it. Thereby, by controlling, e.g., the reverse bias voltage between the gate and source, it is possible to control on/off of the current.

Further, "Theory of Semiconductor Superjunction Devices" (Jpn. J. Appl. Phys. Vol. 36 (1997) Part 1, No. 10. October 1997, pp. 6254-6262) theoretically describes as follows. A structure (superimposed junction structure) including p- and n-type semiconductor layers superimposed together is employed between a channel and a drain of an MOS field effect transistor so that distribution of a voltage applied to a drain in the off state may be similar to that of a parallel plane plate capacitor. Thereby, it is possible to improve a breakdown voltage of an element, and at the same time, it is possible to suppress increase of an on-resistance of the element, or to lower the on-resistance.

In the lateral JFET having the foregoing structures, however, it has been required to lower the on-resistance as one of factors for improving characteristics. Particularly, it is strongly desired in the lateral JFET of the normally-off type to lower the on-resistance.

In the structure shown in FIG. 72, however, if a space between the top of $p^+$-type epitaxial layer 112 and the bottom of gate contact layer 130 is increased in expectation of lowering of the on-resistance, this increases an absolute value of the gate voltage required for turn-off. Therefore, the above space can be increased only to a limited extent, and the on-resistance can be lowered only to a limited extent.

In the normally-off type, the space must be smaller than a space for the depletion layer extended by a diffused potential in a junction between channel layer 114 and gate contact layer 130, and therefore can be increased only to a limited extent so that the on-resistance can be lowered only to a limited extent.

DISCLOSURE OF THE INVENTION

An object of the invention is to provide a lateral junction field effect transistor having a structure, which can reduce an on-resistance while maintaining good breakdown voltage properties.

For achieving the above object, a lateral junction field effect transistor according to an aspect of the invention includes a first semiconductor layer located on a semiconductor substrate, and doped with impurities of a first conductivity type; a second semiconductor layer located on the first semiconductor layer, and doped with impurities of a second conductivity type more heavily than the first semiconductor layer; a third semiconductor layer located on the second semiconductor layer, and doped with impurities of the first conductivity type; a fourth semiconductor layer located on the third semiconductor layer, and doped with impurities of the second conductivity type; a fifth semiconductor layer located on the fourth semiconductor layer, and doped with impurities of the first conductivity type; source/drain region layers formed in the fifth semiconductor layer, spaced from each other by a predetermined distance, having a lower surface extending on the second semiconductor layer, and doped with impurities of the second conductivity type more heavily than the second and fourth semiconductor layers; a first gate electrode layer arranged in the third semiconductor layer between the source/drain region layers, having a lower surface extending on the second semiconductor layer, and doped with impurities of the first conductivity type more heavily than the second semiconductor layer; and a second gate electrode layer arranged in the fifth semiconductor layer between the source/drain region layers, having a lower surface extending on the fourth semiconductor layer, having substantially the same impurity concentration as the first gate electrode layer, and having the same potential as the first gate electrode layer.

A method of manufacturing a lateral junction field effect transistor according to an aspect of the invention includes the steps of forming a first semiconductor layer doped with impurities of a first conductivity type on a semiconductor substrate; forming a second semiconductor layer doped with impurities of a second conductivity type more heavily than the first semiconductor layer on the first semiconductor layer; forming a third semiconductor layer doped with impurities of the first conductivity type on the second semiconductor layer; forming a first gate electrode layer located in the second and third semiconductor layers, and doped with impurities of the first conductivity type more heavily than the second semiconductor layer by implanting the impurities into a predetermined region of the third semiconductor layer; forming a fourth semiconductor layer doped with impurities of the second conductivity type on the third semiconductor layer; forming a fifth semiconductor layer doped with impurities of the first conductivity type on the fourth semiconductor layer; implanting impurities into a predetermined region of the fifth semiconductor layer to form a second gate electrode layer having a lower surface extending on the fourth semiconductor layer, having substantially the same impurity concentration as the first gate electrode layer, and having the same potential as the first gate electrode layer; and implanting impurities into portions of the fifth semiconductor layer on the opposite sides of the first and second gate electrode layers to form source/drain region layers having lower surfaces extending on the second semiconductor layer, and doped with impurities of the second conductivity type more heavily than the second and fourth semiconductor layers.

According to the lateral junction field effect transistor having the above structure and the method of manufacturing the same, the transistor structures are formed in a vertical direction, i.e., in the same direction as the layering or stacking direction of the respective semiconductor layers on the semiconductor substrate. Therefore, an on-resistance of the element can be reduced, as compared with conventional structures.

According to the invention, it is preferable that the second, third, fourth and fifth semiconductor layers substantially have the same impurity concentration and the same layer thickness. This structure can minimize the on-resistance of the lateral junction field effect transistor, and can maximize a value of a breakdown voltage.

According to the invention, it is also preferable that a distance between a top of the first semiconductor layer and a bottom of the first gate electrode layer is smaller than a distance of a depletion layer extended by a diffused potential in a junction between the second semiconductor layer and the first gate electrode layer, and a distance between a top of the third semiconductor layer and a bottom of the second gate electrode layer is smaller than a distance of a depletion layer extended by a diffused potential in a junction between the fourth semiconductor layer and the second gate electrode layer. This structure can achieve a normally-off type of the lateral junction field effect transistor.

According to the invention, it is further preferable that one or more unit transistor structure(s) being substantially the same as the structure having the second semiconductor layer, the third semiconductor layer and the first gate electrode layer are arranged between the third and fourth semiconductor layers. According to this structure, three or more unit transistors can be stacked in the lateral junction field effect transistor.

For achieving the foregoing object, a lateral junction field effect transistor according to another aspect of the invention includes a first semiconductor layer located on a semiconductor substrate, and doped with impurities of a first conductivity type; a second semiconductor layer located on the first semiconductor layer, and doped with impurities of a second conductivity type more heavily than the first semiconductor layer; a third semiconductor layer located on the second semiconductor layer, and doped with impurities of the first conductivity type; a fourth semiconductor layer located on the third semiconductor layer, and doped with impurities of the second conductivity type; a fifth semiconductor layer located on the fourth semiconductor layer, and doped with impurities of the first conductivity type; source/drain region layers formed in the fifth semiconductor layer, spaced from each other by a predetermined distance, having a lower surface extending on the second semiconductor layer, and doped with impurities of the second conductivity type more heavily than the second and fourth semiconductor layers; a first gate electrode layer arranged in the third semiconductor layer between the source/drain region layers, having a lower surface extending on the second semiconductor layer, and doped with impurities of the first conductivity type more heavily than the second semiconductor layer; a second gate electrode layer arranged in the fifth semiconductor layer between the source/drain region layers, having a lower surface extending on the fourth semiconductor layer, having substantially the same impurity concentration as the first gate electrode layer, and having the same potential as the first gate electrode layer; a first impurity doped region of the first conductivity type arranged in the second semiconductor layer between the first semiconductor layer and the first gate electrode layer, having substantially the same impurity concentration as the first gate electrode layer, and having the same potential as the first gate electrode layer; and a second impurity doped region of the first conductivity type arranged in the fourth semiconductor layer between the third semiconductor layer and the second gate electrode layer, having substantially the same impurity concentration as the first gate electrode layer, and having the same potential as the first gate electrode layer.

A method of manufacturing a lateral junction field effect transistor according to another aspect of the invention includes the steps of forming a first semiconductor layer doped with impurities of a first conductivity type on a semiconductor substrate; forming a second semiconductor layer doped with impurities of a second conductivity type more heavily than the first semiconductor layer on the first semiconductor layer; forming a first impurity doped region of the first conductivity type in the second semiconductor layer by implanting the impurities into a predetermined region of the second semiconductor layer; forming a third semiconductor layer doped with impurities of the first conductivity type on the second semiconductor layer; forming a first gate electrode layer located in the second and third semiconductor layers, and doped with impurities of the first conductivity type more heavily than the second semiconductor layer by implanting the impurities; forming a fourth semiconductor layer doped with impurities of the second conductivity type on the third semiconductor layer; implanting impurities into a predetermined region of the fourth semiconductor layer to form a second impurity doped region located in the fourth semiconductor layer, having substantially the same impurity concentration as the first gate electrode layer, and having the same potential as the first gate electrode layer; forming a fifth semiconductor layer doped with impurities of the first conductivity type on the fourth semiconductor layer; implanting impurities into a predetermined region of the fifth semiconductor layer to form a second gate electrode layer having a lower surface extending on the fourth semiconductor layer, having substantially the same impurity concentration as the first gate electrode layer, and having the same potential as the first gate electrode layer; and implanting impurities into predetermined regions of the fifth semiconductor layer on the opposite sides of the first and second gate electrode layers to form source/drain region layers having lower surfaces extending on the second semiconductor layer, and doped with impurities of the second conductivity type more heavily than the second and fourth semiconductor layers.

According to the lateral junction field effect transistor having the above structure and the method of manufacturing the same, the transistor structures are formed in a vertical direction, i.e., in the same direction as the stacking direction of the respective semiconductor layers on the semiconductor substrate. Therefore, the on-resistance of the element can be reduced, as compared with conventional structures.

According to the invention, it is preferable that the second, third, fourth and fifth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between a top of the first semiconductor layer and a bottom of the first impurity doped region is smaller than a distance of a depletion layer extended by a diffused potential in a junction between the second semiconductor layer and the first impurity doped region, a distance between a top of the first impurity doped region and a bottom of the first gate electrode layer is smaller than double a distance of a depletion layer extended by a diffused potential in a junction between the second semiconductor layer and the first gate electrode layer, a distance between a top of the third semiconductor layer and a bottom of the second impurity doped region is smaller than double a distance of a depletion layer extended by a diffused potential in a junction between the fourth semiconductor layer and the second impurity doped region, and a distance between a top of the second impurity doped region and a bottom of the second gate electrode layer is smaller than double a distance of a depletion layer extended by a diffused potential in a junction between the fourth semiconductor layer and the second gate electrode layer. This structure can achieve the normally-off type of the lateral junction field effect transistor.

Preferably, the second semiconductor layer is provided with a plurality of layers of the first impurity doped regions, and the fourth semiconductor layer is provided with a plurality of layers of the second impurity doped regions. By the provision of the plurality of layers of the impurity doped regions, the second and fourth semiconductor layers can be utilized to the maximum extent, and thereby it is possible to achieve the normally-off type of the lateral junction field effect transistor, in which a total channel width is increased and the on-resistance is lowered.

According to the invention, it is further preferable that one or more unit transistor structure(s) being substantially the same as the structure having the second semiconductor layer, the third semiconductor layer, the first gate electrode layer and the first impurity doped region are arranged between the third and fourth semiconductor layers. According to this structure, three or more unit transistors can be stacked in the lateral junction field effect transistor.

For achieving the foregoing object, a lateral junction field effect transistor according to still another aspect of the invention includes a first semiconductor layer located on a semiconductor substrate, and doped with impurities of a first conductivity type; a second semiconductor layer located on the first semiconductor layer, and doped with impurities of a second conductivity type more heavily than the first semiconductor layer; a third semiconductor layer located on the second semiconductor layer, and doped with impurities of the first conductivity type; a fourth semiconductor layer located on the third semiconductor layer, and doped with impurities of the second conductivity type; a fifth semiconductor layer located on the fourth semiconductor layer, and doped with impurities of the first conductivity type; source/drain region layers formed in the fifth semiconductor layer, spaced from each other by a predetermined distance, having a lower surface extending on the second semiconductor layer, and doped with impurities of the second conductivity type more heavily than the second and fourth semiconductor layers; a first gate electrode layer arranged in the third semiconductor layer between the source/drain region layers, having a lower surface extending on the second semiconductor layer, having an upper surface extending on the fourth semiconductor layer, and doped with impurities of the first conductivity type more heavily than the second and fourth semiconductor layers; and a second gate electrode layer arranged in the fifth semiconductor layer between the source/drain region layers, having a lower surface extending on the fourth semiconductor layer, having substantially the same impurity concentration as the first gate electrode layer, and having the same potential as the first gate electrode layer.

A method of manufacturing a lateral junction field effect transistor according to still another aspect of the invention includes the steps of forming a first semiconductor layer doped with impurities of a first conductivity type on a semiconductor substrate; forming a second semiconductor layer doped with impurities of a second conductivity type more heavily than the first semiconductor layer on the first semiconductor layer; forming a third semiconductor layer doped with impurities of the first conductivity type on the second semiconductor layer; forming a fourth semiconductor layer doped with impurities of the second conductivity type on the third semiconductor layer; implanting impurities into a predetermined region of the fourth semiconductor layer to form a first gate electrode layer having a lower surface extending on the second semiconductor layer, having an upper surface extending on the fourth semiconductor layer, and doped with impurities of the first conductivity type more heavily than the second and fourth semiconductor layers; forming a fifth semiconductor layer doped with impurities of the first conductivity type on the fourth semiconductor layer; implanting impurities into a predetermined region of the fifth semiconductor layer to form a second gate electrode layer having a lower surface extending on the fourth semiconductor layer, having substantially the same impurity concentration as the first gate electrode layer, and having the same potential as the first gate electrode layer; and implanting impurities into predetermined regions of the fifth semiconductor layer on the opposite sides of the first and second gate electrode layers to form source/drain region layers having lower surfaces extending on the second semiconductor layer, and doped with impurities of the second conductivity type more heavily than the second and fourth semiconductor layers.

According to the lateral junction field effect transistor having the above structure and the method of manufacturing the same, the transistor structures are formed in a vertical direction, i.e., in the same direction as the stacking direction of the respective semiconductor layers on the semiconductor substrate. Therefore, the on-resistance of the element can be reduced, as compared with conventional structures.

According to the invention, it is preferable that the second, third, fourth and fifth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between a top of the first semiconductor layer and a bottom of the first gate electrode layer is smaller than a distance of a depletion layer extended by a diffused potential in a junction between the second semiconductor layer and the first gate electrode layer, and a distance between a top of the first gate electrode layer and a bottom of the second gate electrode layer is smaller than double a distance of a depletion layer extended by a diffused potential in a junction between the fourth semiconductor layer and the first gate electrode layer. This structure can achieve the normally-off type of the lateral junction field effect transistor.

According to the invention, it is further preferable that one or more unit transistor structure(s) being substantially the same as the structure having the third semiconductor layer, the fourth semiconductor layer and the first gate electrode layer are arranged between the fourth and fifth semiconductor layers. According to this structure, three or more unit transistors can be stacked in the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of a second conductivity type more heavily than the first semiconductor layer; a third semiconductor layer located on the second semiconductor layer, and doped with impurities of the first conductivity type; a fourth semiconductor layer located on the third semiconductor layer, and doped with impurities of the second conductivity type; a fifth semiconductor layer located on the fourth semiconductor layer, and doped with impurities of the first conductivity type; source/drain region layers formed in the fifth semiconductor layer, spaced from each other by a predetermined distance, having a lower surface extending on the second semiconductor layer, and doped with impurities of the second conductivity type more heavily than the second and fourth semiconductor layers; a first gate electrode layer arranged in the third semiconductor layer between the source/drain region layers, having a lower surface extending on the second semiconductor layer, having an upper surface extending on the fourth semiconductor layer, and doped with impurities more heavily than the second and fourth semiconductor layers; a second gate electrode layer of the first conductivity type arranged in the fifth semiconductor layer between the source/drain region layers, having a lower surface extending on the fourth semiconductor layer, having substantially the same impurity concentration as the first gate electrode layer, and having the same potential as the first gate electrode layer; a first impurity doped region of the first conductivity type arranged in the second semiconductor layer between the first semiconductor layer and the first gate electrode layer, having substantially the same impurity concentration as the first gate electrode layer, and having the same potential as the first gate electrode layer; and a second impurity doped region of the first conductivity type arranged in the fourth semiconductor layer between the first and second gate electrode layers, having substantially the same impurity concentration as the first gate electrode layer, and having the same potential as the first gate electrode layer.

A method of manufacturing a lateral junction field effect transistor according to further another aspect of the invention includes the steps of forming a first semiconductor layer doped with impurities of a first conductivity type on a semiconductor substrate; forming a second semiconductor layer doped with impurities of a second conductivity type more heavily than the first semiconductor layer on the first semiconductor layer; forming a third semiconductor layer doped with impurities of the first conductivity type on the second semiconductor layer; forming a fourth semiconductor layer doped with impurities of the second conductivity type on the third semiconductor layer; implanting impurities into a predetermined region of the fourth semiconductor layer to form a first gate electrode layer having a lower surface extending on the second semiconductor layer, having an upper surface extending on the fourth semiconductor layer, and doped with impurities more heavily than the second and fourth semiconductor layers; forming a first impurity doped region of the first conductivity type in the second semiconductor layer by implanting the impurities into a predetermined region of the second semiconductor layer; forming a fifth semiconductor layer doped with impurities of the first conductivity type on the fourth semiconductor layer; implanting impurities into a predetermined region of the fifth semiconductor layer to form a second gate electrode layer of the first conductivity type having a lower surface extending on the fourth semiconductor layer, having substantially the same impurity concentration as the first gate electrode layer, and having the same potential as the first gate electrode layer; forming a second impurity doped region of the first conductivity type in the second semiconductor layer by implanting the impurities into a predetermined region of the fourth semiconductor layer; and forming source/drain region layers located on the opposite sides of the first and second gate electrode layers, having lower surfaces extending on the second semiconductor layer, and doped with impurities of the second conductivity type more heavily than the second and fourth semiconductor layers.

According to the lateral junction field effect transistor having the above structure and the method of manufacturing the same, the transistor structures are formed in a vertical direction, i.e., in the same direction as the stacking direction of the respective semiconductor layers on the semiconductor substrate. Therefore, the on-resistance of the element can be reduced, as compared with conventional structures.

According to the invention, it is preferable that the second, third, fourth and fifth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between a top of the first semiconductor layer and a bottom of the first impurity doped region is smaller than a distance of a depletion layer extended by a diffused potential in a junction between the second semiconductor layer and the first impurity doped region, a distance between a top of the first impurity doped region and a bottom of the first gate electrode layer is smaller than double a distance of a depletion layer extended by a diffused potential in a junction between the second semiconductor layer and the first gate electrode layer, a distance between a top of the first gate electrode layer and a bottom of the second impurity doped region is smaller than double a distance of a depletion layer extended by a diffused potential in a junction between the fourth semiconductor layer and the second impurity doped region, and a distance between a top of the second impurity doped region and a bottom of the second gate electrode layer is smaller than double a distance of a depletion layer extended by a diffused potential in a junction between the fourth semiconductor layer and the second impurity doped region. This structure can achieve the normally-off type of the lateral junction field effect transistor.

Preferably, the second semiconductor layer is provided with a plurality of layers of the first impurity doped regions, and the fourth semiconductor layer is provided with a plurality of layers of the second impurity doped regions. By the provision of the plurality of layers of the impurity doped regions, the second and fourth semiconductor layers can be utilized to the maximum extent, and thereby it is possible to achieve the normally-off type of the lateral junction field effect transistor, in which a total channel width is increased and the on-resistance is lowered.

According to the invention, it is further preferable that one or more unit transistor structure(s) being substantially the same as the structure having the third semiconductor layer, the fourth semiconductor layer, the first gate electrode layer and the second impurity doped region are arranged between the fourth and fifth semiconductor layers. According to this structure, three or more unit transistors can be stacked in the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of a second conductivity type more heavily than the first semiconductor layer; a third semiconductor layer located on the second semiconductor layer, and doped with impurities of the first conductivity type; a fourth semiconductor layer located on the third semiconductor layer, and doped with impurities of the second conductivity type; a fifth semiconductor layer located on the fourth semiconductor layer, and doped with impurities of the first conductivity type; source/drain region layers formed in the fifth semiconductor layer, spaced from each other by a predetermined distance, having a lower surface extending on the second semiconductor layer, and doped with impurities of the second conductivity type more heavily than the second and fourth semiconductor layers; a first gate electrode layer arranged in the fifth semiconductor layer between the source/drain region layers, having a lower surface extending on the second semiconductor layer, and doped with impurities of the first conductivity type more heavily than the second semiconductor layer; and a second gate electrode layer of the first conductivity type arranged in the fifth semiconductor layer between the source/drain region layers, neighboring to the first gate electrode layer, having substantially the same impurity concentration as the first gate electrode layer, and having the same potential as the first gate electrode layer.

A method of manufacturing a lateral junction field effect transistor according to further another aspect of the invention includes the steps of forming a first semiconductor layer doped with impurities of a first conductivity type on a semiconductor substrate; forming a second semiconductor layer doped with impurities of a second conductivity type more heavily than the first semiconductor layer on the first semiconductor layer; forming a third semiconductor layer doped with impurities of the first conductivity type on the second semiconductor layer; forming a fourth semiconductor layer doped with impurities of the second conductivity type on the third semiconductor layer; forming a fifth semiconductor layer doped with impurities of the first conductivity type on the fourth semiconductor layer; implanting impurities into predetermined regions of the fifth semiconductor layer to form first and second gate electrode layers having lower surfaces extending on the second semiconductor layer, doped with impurities of the first conductivity type more heavily than the second semiconductor layer, arranged in a plane direction of the substrate, and spaced from each other by a predetermined distance; and implanting impurities into predetermined regions of the fifth semiconductor layer to form source/drain region layers each extending in a direction of arrangement of the first and second gate electrode layers, located on the opposite sides of the first and second gate electrode layers, having lower surfaces extending on the second semiconductor layer, and doped with impurities of the second conductivity type more heavily than the second and fourth semiconductor layers.

According to the lateral junction field effect transistor having the above structure and the method of manufacturing the same, the transistor structures are formed in a vertical direction, i.e., in the same direction as the stacking direction of the respective semiconductor layers on the semiconductor substrate. Therefore, the on-resistance of the element can be reduced, as compared with conventional structures.

According to the invention, it is preferable that the second, third, fourth and fifth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between the first and second gate electrode layers is smaller than a distance of a depletion layer extended by a diffused potential in a junction between the second semiconductor layer and the first gate electrode layer, and is smaller than double a distance of a depletion layer extended by a diffused potential in a junction between the fourth semiconductor layer and the first gate electrode layer. This structure can achieve the normally-off type of the lateral junction field effect transistor.

According to the invention, the lateral junction field effect transistor preferably includes one impurity doped region of the first conductivity type arranged between the first and second gate electrode layers, having a lower surface extending on the second semiconductor layer, having substantially the same impurity concentration as the first gate electrode layer, and having the same potential as the first gate electrode layer. This structure increases the number of channels, and can further lower the on-resistance.

According to the invention, it is also preferable that a distance between the first gate electrode layer and the impurity doped region and a distance between the impurity doped region and the second gate electrode layer are smaller that a distance of a depletion layer extended by a diffused potential in a junction between the second semiconductor layer and the first gate electrode layer and double a distance of a depletion layer extended by a diffused potential in a junction between the fourth semiconductor layer and the first gate electrode layer. This structure can achieve the normally-off type of the lateral junction field effect transistor.

According to the invention, it is further preferable that the two or more impurity doped regions are employed. This structure increases the number of channels, and can further lower the on-resistance.

According to the invention, it is further preferable that a distance between the first gate electrode layer and the impurity doped region nearest to the first gate electrode layer, a distance between the impurity doped regions, and a distance between the second gate electrode layer and the impurity doped region nearest to the second gate electrode layer are all smaller than a distance of a depletion layer extended by a diffused potential in a junction between the second semiconductor layer and the first gate electrode layer and double a distance of a depletion layer extended by a diffused potential in a junction between the fourth semiconductor layer and the first gate electrode layer. This structure can achieve the normally-off type of the lateral junction field effect transistor.

According to the invention, it is further preferable that one or more structure(s) being substantially the same as the structure having the third and fourth semiconductor layers is arranged between the fourth and fifth semiconductor layers. This structure increases the number of transistor structures, which are arranged on the semiconductor substrate and neighbor to each other in the lateral direction, and can further lower the on-resistance.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of the second conductivity type; source/drain region layers arranged in the second and third semiconductor layers, spaced from each other by a predetermined distance, and doped with impurities of the second conductivity type more heavily than the third semiconductor layer; and a gate electrode layer arranged in the second semiconductor layer between the source/drain region layers, having a side surface on its one side extending on the third semiconductor layer, and doped with impurities of the first conductivity type more heavily than the first semiconductor layer.

A method of manufacturing a lateral junction field effect transistor according to further another aspect of the invention includes the steps of forming a first semiconductor layer doped with impurities of a first conductivity type on a semiconductor substrate; forming a semiconductor layer doped with impurities of a second conductivity type on the first semiconductor layer; forming a second semiconductor layer doped with impurities of the first conductivity type and a third semiconductor layer doped with impurities the second conductivity type by implanting impurities of the first conductivity type into predetermined regions of the semiconductor layer spaced by a predetermined distance from each other in a direction of a plane of the substrate; implanting impurities into predetermined regions of the second and third semiconductor layers to form a gate electrode layer located in the second and third semiconductor layers, and doped with impurities of the first conductivity type more heavily than the first semiconductor layer; and implanting impurities into predetermined regions of the second and third semiconductor layers to form source/drain region layers arranged in a direction of arrangement of the second and third semiconductor layers, located on the opposite sides of the gate electrode layer, and doped with impurities of the second conductivity type more heavily than the third semiconductor layer.

According to the lateral junction field effect transistor having the above structure and the method of manufacturing the same, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second and third semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between the gate electrode layer and a surface of the third semiconductor layer spaced from the gate electrode layer is smaller than a distance of a depletion layer extended by a diffused potential in a junction between the third semiconductor layer and the gate electrode layer. This structure can achieve the normally-off type of the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; a fifth semiconductor layer located on the first semiconductor layer, neighboring to the fourth semiconductor layer, and doped with impurities of the second conductivity type; source/drain region layers arranged in the second, third, fourth and fifth semiconductor layers, spaced from each other by a predetermined distance, and doped with impurities of the second conductivity type more heavily than the third and fifth semiconductor layers; a first gate electrode layer arranged in the second semiconductor layer between the source/drain region layers, having a side surface on its one side extending on the third semiconductor layer, and doped with impurities of the first conductivity type more heavily than the third semiconductor layer; and a second gate electrode layer arranged in the fourth semiconductor layer between the source/drain region layers, having a side surface on its one side extending on the fifth semiconductor layer, having substantially the same impurity concentration as the first gate electrode layer, and having the same potential as the first gate electrode layer.

According to the lateral junction field effect transistor having the above structure, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second, third, fourth and fifth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between the first gate electrode layer and a surface of the third semiconductor layer spaced from the first gate electrode layer is smaller than a distance of a depletion layer extended by a diffused potential in a junction between the third semiconductor layer and the first gate electrode layer, and a distance between the second gate electrode layer and a surface of the fifth semiconductor layer spaced from the second gate electrode layer is smaller than a distance of a depletion layer extended by a diffused potential in a junction between the fifth semiconductor layer and the second gate electrode layer. This structure can achieve the normally-off type of the lateral junction field effect transistor.

According to the invention, it is further preferable that one or more unit transistor structure(s) being substantially the same as the structure having the fourth semiconductor layer, the fifth semiconductor layer and the second gate electrode layer are arranged between the third and fourth semiconductor layers. According to this structure, three or more unit transistors can be arranged in the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; source/drain region layers arranged in the second, third, fourth and fifth semiconductor layers, spaced from each other by a predetermined distance, and doped with impurities of the second conductivity type more heavily than the third semiconductor layer; and a gate electrode layer arranged in the second semiconductor layer between the source/drain region layers, having a side surface on its one side extending on the third semiconductor layer, and doped with impurities of the first conductivity type more heavily than the third semiconductor layer.

According to the lateral junction field effect transistor having the above structure, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second, third and fourth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between the gate electrode layer and the fourth semiconductor layer is smaller than a distance of a depletion layer extended by a diffused potential in a junction between the third semiconductor layer and the gate electrode layer. This structure can achieve the normally-off type of the lateral junction field effect transistor.

According to the invention, it is further preferable that one or more unit transistor structure(s) being substantially the same as the structure having the second semiconductor layer, the third semiconductor layer and the gate electrode layer are arranged between the third and fourth semiconductor layers. According to this structure, three of more unit transistors can be arranged in the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; source/drain region layers arranged in the second and third semiconductor layers, spaced from each other by a predetermined distance, and doped with impurities of the second conductivity type more heavily than the third semiconductor layer; a gate electrode layer arranged in the second semiconductor layer between the source/drain region layers, having a side surface on its one side extending on the third semiconductor layer, and doped with impurities of the first conductivity type more heavily than the third semiconductor layer; and an impurity doped region of the first conductivity type arranged in the third semiconductor layer between the gate electrode layer and the surface of the third semiconductor layer spaced from the gate electrode layer, having substantially the same impurity concentration as the gate electrode layer, and having the same potential as the gate electrode layer.

A method of manufacturing a lateral junction field effect transistor according to further another aspect of the invention includes the steps of forming a first semiconductor layer doped with impurities of a first conductivity type on a semiconductor substrate; forming a semiconductor layer doped with impurities of a second conductivity type on the first semiconductor layer; forming second and third semiconductor layers doped with impurities of the first conductivity type and the second conductivity type, respectively, by implanting impurities of the first conductivity type into predetermined regions of the semiconductor layer spaced by a predetermined distance from each other in a direction of a plane of the substrate; implanting impurities into predetermined regions of the second and third semiconductor layers to form a gate electrode layer of the first conductivity type located in the second and third semiconductor layers, and doped with impurities of the first conductivity type more heavily than the third semiconductor layer, and to form an impurity doped region of the first conductivity type located in the third semiconductor layer, having substantially the same impurity concentration as the gate electrode layer, and having the same potential as the gate electrode layer; and implanting impurities into predetermined regions of the second and third semiconductor layers to form source/drain region layers arranged in a direction of arrangement of the second and third semiconductor layers, located on the opposite sides of the gate electrode layer and the impurity doped region, and doped with impurities of the second conductivity type more heavily than the third semiconductor layer.

According to the lateral junction field effect transistor having the above structure and the method of manufacturing the same, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second and third semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between surfaces of the gate electrode layer and the impurity doped region being in contact with each other through a maximum area is smaller than double a distance of a depletion layer extended by a diffused potential in a junction between the third semiconductor layer and the gate electrode layer, and a distance between the impurity doped region and a surface of the third semiconductor layer spaced from the gate electrode layer is smaller than a distance of a depletion layer extended by a diffused potential in a junction between the third semiconductor layer and the gate electrode layer. This structure can achieve the normally-off type of the lateral junction field effect transistor.

Preferably, the third semiconductor layer is provided with a plurality of layers of the impurity doped region. By the provision of the plurality of impurity doped regions, it is possible to achieve the normally-off type of the lateral junction field effect transistor, in which a total channel width is increased and the on-resistance is lowered.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; a fifth semiconductor layer located on the first semiconductor layer, neighboring to the fourth semiconductor layer, and doped with impurities of the second conductivity type; source/drain region layers arranged in the second, third, fourth and fifth semiconductor layers, spaced from each other by a predetermined distance, and doped with impurities of the second conductivity type more heavily than the third and fifth semiconductor layers; a first gate electrode layer arranged in the second semiconductor layer between the source/drain region layers, having a side surface on its one side extending on the third semiconductor layer, and doped with impurities of the first conductivity type more heavily than the third semiconductor layer; a second gate electrode layer arranged in the fourth semiconductor layer between the source/drain region layers, having a side surface on its one side extending on the fifth semiconductor layer, having substantially the same impurity concentration as the first gate electrode layer, and having the same potential as the first gate electrode layer; a first impurity doped region of the first conductivity type arranged in the third semiconductor layer between the fourth semiconductor layer and the first gate electrode layer, having substantially the same impurity concentration as the first gate electrode layer, and having the same potential as the first gate electrode layer; and a second impurity doped region of the first conductivity type arranged in the fifth semiconductor layer between the second gate electrode layer and a surface of the fifth semiconductor layer spaced from the second gate electrode layer, having substantially the same impurity concentration as the first gate electrode layer, and having the same potential as the first gate electrode layer.

According to the lateral junction field effect transistor having the above structure, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second, third, fourth and fifth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between surfaces of the first gate electrode layer and the first impurity doped region nearest to each other is smaller than double a distance of a depletion layer extended by a diffused potential in a junction between the third semiconductor layer and the first gate electrode layer, a distance between the first impurity doped region and a surface of the third semiconductor layer spaced from the first gate electrode layer is smaller than a distance of a depletion layer extended by a diffused potential in a junction between the third semiconductor layer and the first gate electrode layer, a distance between surfaces of the second gate electrode layer and the second impurity doped region nearest to each other is smaller than double a distance of a depletion layer extended by a diffused potential in a junction between the fifth semiconductor layer and the second gate electrode layer, and a distance between the second impurity doped region and a surface of the fifth semiconductor layer spaced from the second gate electrode layer is smaller than a distance of a depletion layer extended by a diffused potential in a junction between the fifth semiconductor layer and the second gate electrode layer. This structure can achieve the normally-off type of the lateral junction field effect transistor.

Preferably, the third semiconductor layer is provided with a plurality of layers of the first impurity doped region, and the fifth semiconductor layer is provided with a plurality of layers of the second impurity doped region. By the provision of the plurality of impurity doped regions, it is possible to achieve the normally-off type of the lateral junction field effect transistor, in which a total channel width is increased and the on-resistance is lowered.

According to the invention, it is further preferable that one or more unit transistor structure(s) being substantially the same as the structure having the fourth semiconductor layer, the fifth semiconductor layer and the second gate electrode layer are arranged between the third and fourth semiconductor layers. According to this structure, three of more unit transistors can be arranged in the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; source/drain region layers arranged in the second, third and fourth semiconductor layers, spaced from each other by a predetermined distance, and doped with impurities of the second conductivity type more heavily than the third semiconductor layer; a gate electrode layer arranged in the second semiconductor layer between the source/drain region layers, having a side surface on its one side extending on the third semiconductor layer, and doped with impurities of the first conductivity type more heavily than the third semiconductor layer; and an impurity doped region of the first conductivity type arranged in the third semiconductor layer between the fourth semiconductor layer and the gate electrode layer, having substantially the same impurity concentration as the gate electrode layer, and having the same potential as the gate electrode layer.

According to the lateral junction field effect transistor having the above structure, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second, third and fourth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between the gate electrode layer and the impurity doped region is smaller than double a distance of a depletion layer extended by a diffused potential in a junction between the third semiconductor layer and the gate electrode layer, and a distance between the impurity doped region and the fourth semiconductor layer is smaller than a distance of a depletion layer extended by a diffused potential in a junction between the third semiconductor layer and the gate electrode layer. This structure can achieve the normally-off type of the lateral junction field effect transistor.

Preferably, the third semiconductor layer is provided with a plurality of layers of the impurity doped region. By the provision of the plurality of impurity doped regions, it is possible to achieve the normally-off type of the lateral junction field effect transistor, in which a total channel width is increased and the on-resistance is lowered.

According to the invention, it is further preferable that one or more unit transistor structure(s) being substantially the same as the structure having the second semiconductor layer, the third semiconductor layer and the gate electrode layer are arranged between the third and fourth semiconductor layers. According to this structure, three of more unit transistors can be arranged in the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; source/drain region layers arranged in the second, third and fourth semiconductor layers, spaced from each other by a predetermined distance, and doped with impurities of the second conductivity type more heavily than the third semiconductor layer; a first gate electrode layer arranged in the second semiconductor layer between the source/drain region layers, having a side surface on its one side extending on the third semiconductor layer, and doped with impurities of the first conductivity type more heavily than the third semiconductor layer; and a second gate electrode layer of the first conductivity type arranged in the fourth semiconductor layer between the source/drain region layers, having a side surface on its one side extending on the third semiconductor layer, having substantially the same impurity concentration as the first gate electrode layer, and having the same potential as the first gate electrode layer.

A method of manufacturing a lateral junction field effect transistor according to further another aspect of the invention includes the steps of forming a first semiconductor layer doped with impurities of a first conductivity type on a semiconductor substrate; forming a semiconductor layer doped with impurities of a second conductivity type on the first semiconductor layer; forming a second semiconductor layer doped with impurities of the first conductivity type, a second semiconductor layer doped with impurities of the second conductivity type and a fourth semiconductor layer doped with impurities of the first conductivity type by implanting impurities of the first conductivity type into predetermined regions of the semiconductor layer spaced by a predetermined distance from each other in a direction of a plane of the substrate; implanting impurities into predetermined regions of the second, third and fourth semiconductor layers to form a first gate electrode layer located in the second and third semiconductor layers, and doped with impurities of the first conductivity type more heavily than the third semiconductor layer, and to form a second gate electrode layer located in the third and fourth semiconductor layers, having substantially the same impurity concentration as the gate electrode layer, and having the same potential as the gate electrode layer; and implanting impurities into predetermined regions of the second, third and fourth semiconductor layers to form source/drain region layers arranged in a direction of arrangement of the second, third and fourth semiconductor layers, located on the opposite sides of the first and second gate electrode layers, and doped with impurities of the second conductivity type more heavily than the third semiconductor layer.

According to the lateral junction field effect transistor having the above structure and the method of manufacturing the same, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second, third and fourth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between surfaces of the first and second gate electrode layers nearest to each other is smaller than double a distance of a depletion layer extended by a diffused potential in a junction between the third semiconductor layer and the first gate electrode layer. This structure can achieve the normally-off type of the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; a fifth semiconductor layer located on the first semiconductor layer, neighboring to the fourth semiconductor layer, and doped with impurities of the second conductivity type; a sixth semiconductor layer located on the first semiconductor layer, neighboring to the fifth semiconductor layer, and doped with impurities of the first conductivity type; source/drain region layers arranged in the second, third, fourth, fifth and sixth semiconductor layers, spaced from each other by a predetermined distance, and doped with impurities of the second conductivity type more heavily than the third and fifth semiconductor layers; a first gate electrode layer arranged in the second semiconductor layer between the source/drain region layers, having a side surface on its one side extending on the third semiconductor layer, and doped with impurities of the first conductivity type more heavily than the third semiconductor layer; a second gate electrode layer of the first conductivity type arranged in the fourth semiconductor layer between the source/drain region layers, having a side surface on its one side extending on the third semiconductor layer, having substantially the same impurity concentration as the first gate electrode layer, and having the same potential as the first gate electrode layer; and a third gate electrode layer of the first conductivity type arranged in the sixth semiconductor layer between the source/drain region layers, having a side surface on its one side extending on the fifth semiconductor layer, having substantially the same impurity concentration as the first gate electrode layer, and having the same potential as the first gate electrode layer.

According to the lateral junction field effect transistor having the above structure, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second, third, fourth, fifth and sixth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between surfaces of the first and second gate electrode layers nearest to each other is smaller than double a distance of a depletion layer extended by a diffused potential in a junction between the third semiconductor layer and the first gate electrode layer, and a distance between surfaces of the second and third gate electrode layers nearest to each other is smaller than double a distance of a depletion layer extended by a diffused potential in a junction between the third semiconductor layer and the first gate electrode layer. This structure can achieve the normally-off type of the lateral junction field effect transistor.

According to the invention, it is further preferable that one or more unit transistor structure(s) being substantially the same as the structure having the fourth semiconductor layer, the fifth semiconductor layer and the second gate electrode layer are arranged between the fifth and sixth semiconductor layers. According to this structure, three of more unit transistors can be arranged in the lateral junction field effect transistor.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; source/drain region layers arranged in the second, third and fourth semiconductor layers, spaced from each other by a predetermined distance, and doped with impurities of the second conductivity type more heavily than the third semiconductor layer; a first gate electrode layer arranged in the second semiconductor layer between the source/drain region layers, having a side surface on its one side extending on the third semiconductor layer, and doped with impurities of the first conductivity type more heavily than the third semiconductor layer; a second gate electrode layer arranged in the fourth semiconductor layer between the source/drain region layers, having a side surface on its one side extending on the third semiconductor layer, having substantially the same impurity concentration as the first gate electrode layer, and having the same potential as the first gate electrode layer; and an impurity doped region of the first conductivity type arranged in the third semiconductor layer between the first and second gate electrode layers, having substantially the same impurity concentration as the first gate electrode layer, and having the same potential as the first gate electrode layer.

A method of manufacturing a lateral junction field effect transistor according to further another aspect of the invention includes the steps of forming a first semiconductor layer doped with impurities of a first conductivity type on a semiconductor substrate; forming a semiconductor layer doped with impurities of a second conductivity type on the first semiconductor layer; forming a second semiconductor layer doped with impurities of the first conductivity type, a second semiconductor layer doped with impurities of the second conductivity type and a fourth semiconductor layer doped with impurities of the first conductivity type by implanting impurities of the first conductivity type into predetermined regions of the semiconductor layer spaced by a predetermined distance from each other in a direction of a plane of the substrate; implanting impurities into predetermined regions of the second, third and fourth semiconductor layers to form a first gate electrode layer located in the second and third semiconductor layers, and doped with impurities of the first conductivity type more heavily than the third semiconductor layer, to form a second gate electrode layer located in the third and fourth semiconductor layers, having substantially the same impurity concentration as the first gate electrode layer, and having the same potential as the first gate electrode layer, and to form an impurity doped region of the first conductivity type in the third semiconductor layer between the first and second gate electrode layers, having substantially the same impurity concentration as the first gate electrode layer, and having the same potential as the first gate electrode layer; and implanting impurities into predetermined regions of the second, third and fourth semiconductor layers to form source/drain region layers arranged in a direction of arrangement of the second, third and fourth semiconductor layers, located on the opposite sides of the first gate electrode layer, the second gate electrode layer and the impurity doped region, and doped with impurities of the second conductivity type more heavily than the third semiconductor layer.

According to the lateral junction field effect transistor having the above structure and the method of manufacturing the same, the respective semiconductor layers arranged on the semiconductor substrate are located to neighbor in a lateral direction on the semiconductor substrate so that the transistor structure is formed in a direction of the plane of the substrate.

Therefore, the on-resistance of the element can be reduced, as compared with conventional structures.

According to the invention, it is preferable that the second, third and fourth semiconductor layers substantially have the same impurity concentration and the same layer thickness. This structure can minimize the on-resistance of the lateral junction field effect transistor, and can maximize the value of the breakdown voltage.

According to the invention, it is further preferable that a distance between surfaces of the first gate electrode layer and the impurity doped region nearest to each other is smaller than double a distance of a depletion layer extended by a diffused potential in a junction between the third semiconductor layer and the first gate electrode layer, and a distance between surfaces of the impurity doped region and the second gate electrode layer nearest to each other is smaller than double a distance of a depletion layer extended by a diffused potential in a junction between the third semiconductor layer and the first gate electrode layer. This structure can achieve the normally-off type of the lateral junction field effect transistor.

Preferably, the third semiconductor layer is provided with a plurality of layers of the impurity doped regions. By the provision of the plurality of layers of the impurity doped regions, it is possible to achieve the normally-off type of the lateral junction field effect transistor, in which a total channel width is increased and the on-resistance is lowered.

For achieving the foregoing object, a lateral junction field effect transistor according to further another aspect of the invention includes a first semiconductor layer located on a semiconductor substrate, and doped with impurities of a first conductivity type; a second semiconductor layer located on the first semiconductor layer, and doped with impurities of the first conductivity type; a third semiconductor layer located on the first semiconductor layer, neighboring to the second semiconductor layer, and doped with impurities of a second conductivity type; a fourth semiconductor layer located on the first semiconductor layer, neighboring to the third semiconductor layer, and doped with impurities of the first conductivity type; a fifth semiconductor layer located on the first semiconductor layer, neighboring to the fourth semiconductor layer, and doped with impurities of the second conductivity type; a sixth semiconductor layer located on the first semiconductor layer, neighboring to the fifth semiconductor layer, and doped with impurities of the first conductivity type; source/drain region layers arranged in the second, third, fourth, fifth and sixth semiconductor layers, spaced from each other by a predetermined distance, and doped with impurities of the second conductivity type more heavily than that the third and fifth semiconductor layers; a first gate electrode layer arranged in the second semiconductor layer between the source/drain region layers, having a side surface on its one side extending on the third semiconductor layer, and doped with impurities of the first conductivity type more heavily than the third semiconductor layer; a second gate electrode layer of the first conductivity type arranged in the fourth semiconductor layer between the source/drain region layers, having side surfaces on its opposite sides extending on the third and fifth semiconductor layers, respectively, having substantially the same impurity concentration as the first gate electrode layer, and having the same potential as the first gate electrode layer; a third gate electrode layer arranged in the sixth semiconductor layer between the source/drain region layers, having a side surface on its one side extending on the fifth semiconductor layer, having substantially the same impurity concentration as the first gate electrode layer, and having the same potential as the first gate electrode layer; a first impurity doped region of the first conductivity type arranged in the third semiconductor layer between the first and second gate electrode layers, having substantially the same impurity concentration as the first gate electrode layer, and having the same potential as the first gate electrode layer; and a second impurity doped region of the first conductivity type arranged in the fifth semiconductor layer between the second and third gate electrode layers, having substantially the same impurity concentration as the first gate electrode layer, and having the same potential as the first gate electrode layer.

According to the lateral junction field effect transistor having the above structure, the respective semiconductor layers arranged on the semiconductor substrate are located to neighbor in a lateral direction on the semiconductor substrate so that the transistor structure is formed in a direction of the plane of the substrate. Therefore, the on-resistance of the element can be reduced, as compared with conventional structures.

According to the invention, it is preferable that the second, third, fourth, fifth and sixth semiconductor layers substantially have the same impurity concentration and the same layer thickness. This structure can minimize the on-resistance of the lateral junction field effect transistor, and can maximize the value of the breakdown voltage.

According to the invention, it is also preferable that a distance between surfaces of the first gate electrode layer and the first impurity doped region nearest to each other is smaller than double a distance of a depletion layer extended by a diffused potential in a junction between the third semiconductor layer and the first gate electrode layer, and a distance between surfaces of the first impurity doped region and the second gate electrode layer nearest to each other is smaller than double a distance of a depletion layer extended by a diffused potential in a junction between the third semiconductor layer and the first gate electrode layer. Also, a distance between surfaces of the second gate electrode layer and the second impurity doped region nearest to each other is smaller than double a distance of a depletion layer extended by a diffused potential in a junction between the third semiconductor layer and the first gate electrode layer, and a distance between surfaces of the second impurity doped region and the third gate electrode layer nearest to each other is smaller than double a distance of a depletion layer extended by a diffused potential in a junction between the third semiconductor layer and the first gate electrode layer. This structure can achieve the normally-off type of the lateral junction field effect transistor.

Preferably, the third semiconductor layer is provided with a plurality of layers of the first impurity doped regions, and the fifth semiconductor layer is provided with a plurality of layers of the second impurity doped regions. By the provision of the plurality of layers of the impurity doped regions, it is possible to utilize the second and fourth semiconductor layers to the maximum extent, and thereby to achieve the normally-off type of the lateral junction field effect transistor, in which a total channel width is increased and the on-resistance is lowered.

According to the invention, it is further preferable that one or more unit transistor structure(s) being substantially the same as the structure having the fourth semiconductor layer, the fifth semiconductor layer and the second gate electrode layer are arranged between the fifth and sixth semiconductor layers. According to this structure, three of more unit transistors can be arranged in the lateral junction field effect transistor.

BEST MODE FOR CARRYING OUT THE INVENTION

Figure 1:
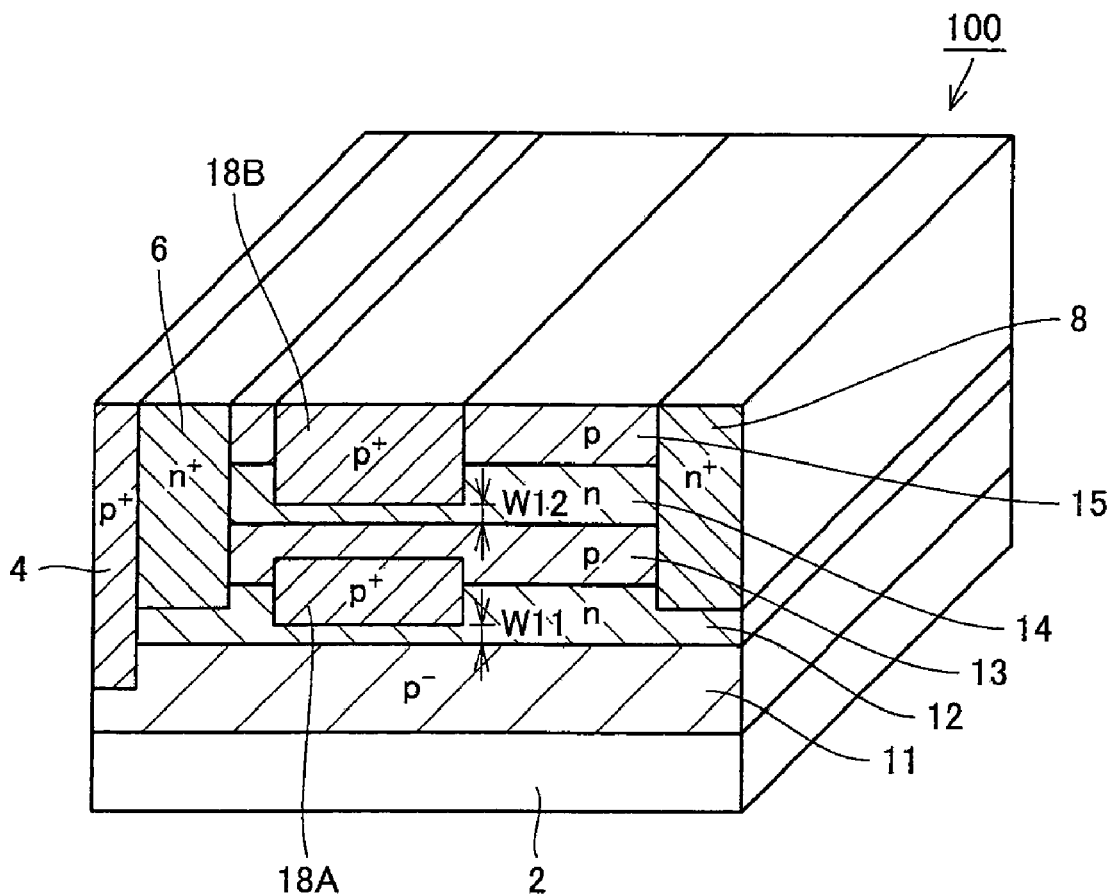
FIG. 1 is a cross section showing a structure of a lateral junction field effect transistor according to a first embodiment.

Structures of lateral junction field effect transistors and methods of manufacturing the same according to embodiments of the invention will now be described with reference to the drawings.

First Embodiment (Structure of Lateral Junction Field Effect Transistor 100)

A structure of a lateral junction field effect transistor 100 according to a first embodiment will now be described with reference to the drawings.

The lateral junction field effect transistor 100 of the first embodiment has a structural feature that pn-junctions and gate electrode layers are arranged in a vertical direction. In this specification, the vertical direction means a direction of a depth of a substrate, and the lateral direction means a direction parallel to a main surface of the substrate.

Lateral junction field effect transistor 100 includes a first semiconductor layer 11, which is located on a semiconductor substrate 2 made of silicon (Si) and others, and is doped with impurities of a p-type, a second semiconductor layer 12, which is located on first semiconductor layer 11, and is doped with impurities of an n-type more heavily (i.e., at a higher concentration) than first semiconductor layer 11, a third semiconductor layer 13 located on second semiconductor layer 12 and doped with p-type impurities, a fourth semiconductor layer 14 located on third semiconductor layer 13 and doped with n-type impurities, and a fifth semiconductor layer 15 located on fourth semiconductor layer 14 and doped with p-type impurities.

First semiconductor layer 11 is made of Sic, has a layer thickness from about 3 μm to about 4 μm and is doped with impurities at a concentration of about $1 \times 10^{16}$ cm$^{-3}$. Each of second, third, fourth and fifth semiconductor layers 12, 13, 14 and 15 is made of SiC, has a layer thickness from about 0.5 μm to about 1.0 μm and is doped with impurities at a concentration from about $1 \times 10^{17}$ cm$^{-3}$ to about $3 \times 10^{17}$ cm$^{-3}$.

In fifth semiconductor layer 15, source/drain region layers 6 and 8 are arranged with a predetermined space therebetween. Source/drain region layers 6 and 8 have lower surfaces extending on second semiconductor layer 12, and are doped with n-type impurities more heavily than second and fourth semiconductor layers 12 and 14. The impurity concentrations of source/drain region layers 6 and 8 are substantially in a range from about $1\times10^{19}$ cm$^{-3}$ to about $1\times10^{20}$ cm$^{-3}$.

Between source/drain region layers 6 and 8, a first gate electrode layer 18A is arranged in third semiconductor layer 13. First gate electrode layer 18A extends in second and third semiconductor layers 12 and 13, has a lower surface extending on second semiconductor layer 12, and is doped with p-type impurities more heavily than second semiconductor layer 12.

Between source/drain region layers 6 and 8, a second gate electrode layer 18B is arranged in fifth semiconductor layer 15. Second gate electrode layer 18B has a lower surface extending on fourth semiconductor layer 14, has substantially the same impurity concentration as first gate electrode layer 18A, and has the same potential as first gate electrode layer 18A. The impurity concentrations of first and second gate electrode layers 18A and 18B are in a range from about $3\times10^{18}$ cm$^{-3}$ to about $1\times10^{20}$ cm$^{-3}$.

Outside source region layer 6, there is arranged an impurity region layer 4, which extends to first semiconductor layer 11, and is doped with p-type impurities at a concentration from about $3\times10^{18}$ cm$^{-3}$ to about $1\times10^{20}$ cm$^{-3}$.

A normally-off type of the lateral junction field effect transistor can be achieved by such a structure that a distance w11 between a top of first semiconductor layer 11 and a bottom of first gate electrode layer 18A is smaller than a distance of a depletion layer extended by a diffused potential in a junction between second semiconductor layer 12 and first gate electrode layer 18A, and a distance w12 between a top of third semiconductor layer 13 and a bottom of second gate electrode layer 18B is smaller than a distance of a depletion layer extended by a diffused potential in a junction between fourth semiconductor layer 14 and second gate electrode layer 18B.

(Method of Manufacturing Lateral Junction Field Effect Transistor 100)

A method of manufacturing lateral junction field effect transistor 100 having the above structures will now be described with reference to FIGS. 2 to 7.

Figure 2:
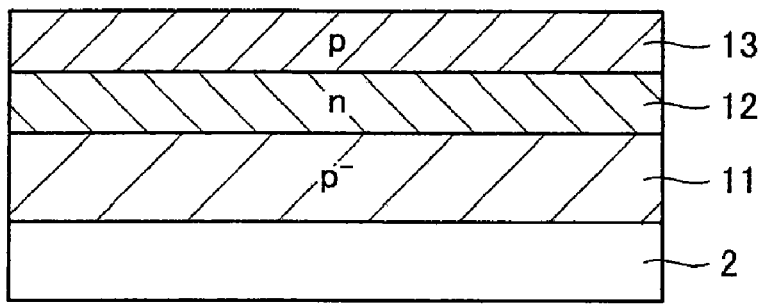
FIG. 2 is cross section showing a first step in a method of manufacturing the lateral junction field effect transistor according to the first embodiment.

Referring to FIG. 2, first semiconductor layer 11, which is made of SiC doped with p-type impurities, and has a layer thickness from about 3 μm to about 4 μm and an impurity concentration of about $1\times10^{16}$ cm$^{-3}$, is formed on semiconductor substrate 2 made of silicon and others by epitaxial growth. Thereafter, second semiconductor layer 12, which is made of SiC doped with n-type impurities, and has a layer thickness of about 0.5 μm and an impurity concentration of about $3\times10^{17}$ cm$^{-3}$ higher than that of first semiconductor layer 11, is formed on first semiconductor layer 11 by epitaxial growth. Then, third semiconductor layer 13, which is made of SiC doped with p-type impurities, and has a layer thickness of about 0.5 μm and an impurity concentration of about $3\times10^{17}$ cm$^{-3}$, is formed on second semiconductor layer 12 by epitaxial growth.

Figure 3:
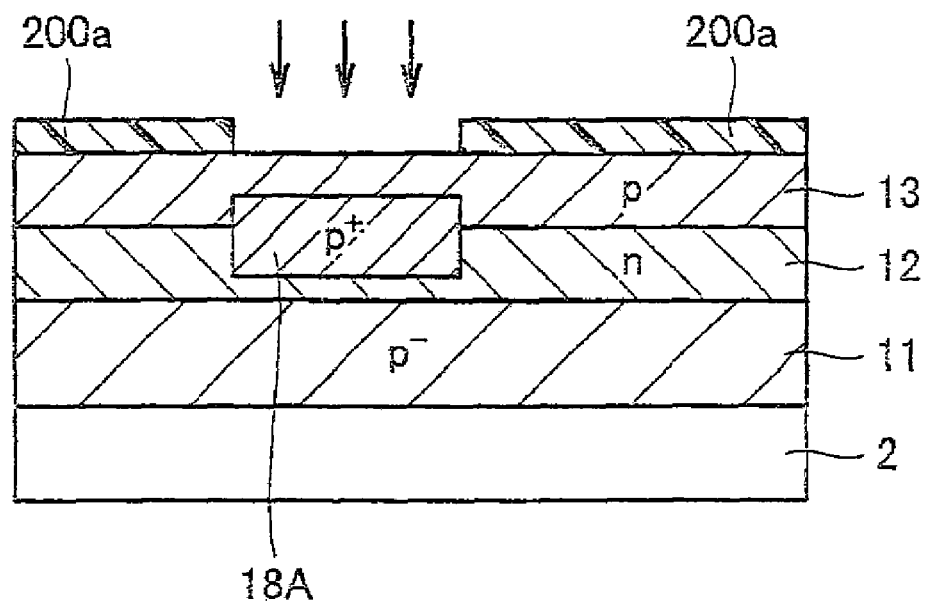
FIG. 3 is cross section showing a second step in a method of manufacturing the lateral junction field effect transistor according to the first embodiment.

Referring to FIG. 3, an oxide film 200a having a predetermined opening pattern is formed on third semiconductor layer 13. Using oxide film 200a as a mask, p-type impurities are implanted into third semiconductor layer 13 to form first gate electrode layer 18A, which extends in second and third semiconductor layers 12 and 13, and is doped with p-type impurities at a concentration from about $3\times10^{18}$ cm$^{-3}$ to about $1\times10^{20}$ cm$^{-3}$ higher than that of second semiconductor layer 12. In this operation, implantation of the p-type impurities is effected in two stages, i.e., a stage under conditions of an implantation energy of about 700 kev and an implantation dose of about $3\times10^{14}$ cm$^{-2}$, and a stage under conditions of an implantation energy of about 500 kev and an implantation dose of about $3\times10^{14}$ cm$^{-2}$.

Figure 4:
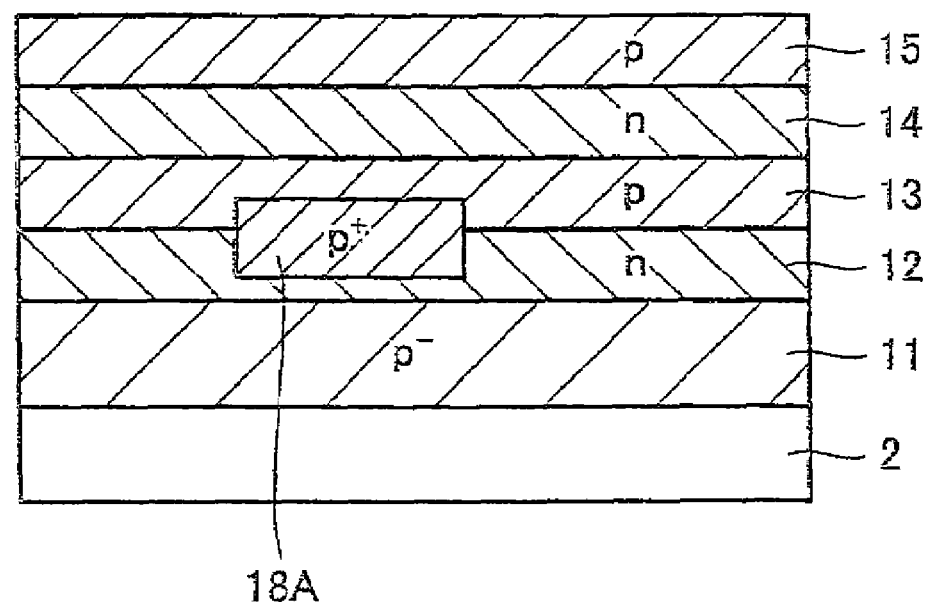
FIG. 4 is cross section showing a third step in a method of manufacturing the lateral junction field effect transistor according to the first embodiment.

Referring to FIG. 4, oxide film 200a is removed, and then fourth semiconductor layer 14, which is made of SiC doped with n-type impurities, and has a thickness of about 0.5 μm and an impurity concentration of about $3\times10^{17}$ cm$^{-3}$, is formed on third semiconductor layer 13 by epitaxial growth. Then, fifth semiconductor layer 15, which is made of SiC doped with p-type impurities, and has a thickness of about 0.5 μm and an impurity concentration of about $3\times10^{17}$ cm$^{-3}$, is formed on fourth semiconductor layer 14 by epitaxial growth.

Figure 5:
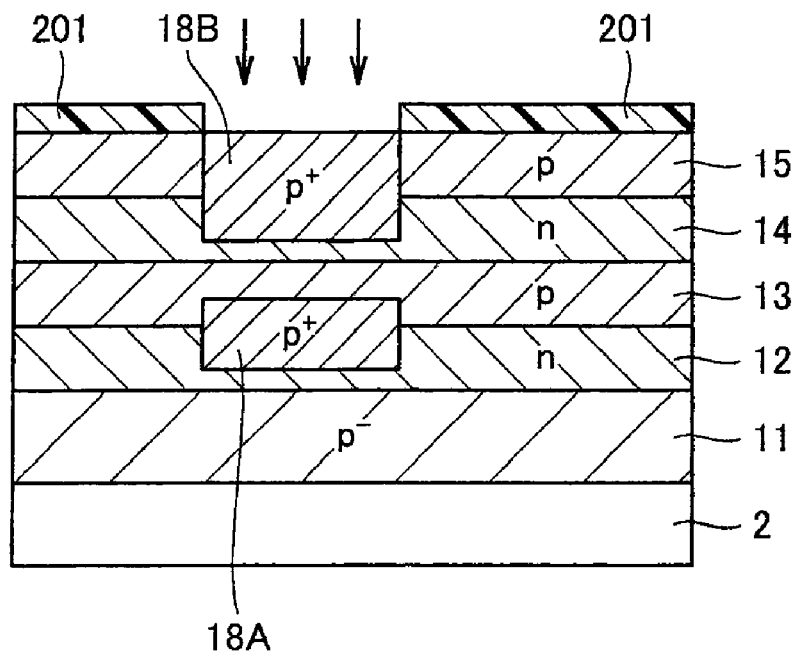
FIG. 5 is cross section showing a fourth step in a method of manufacturing the lateral junction field effect transistor according to the first embodiment.

Referring to FIG. 5, an oxide film 201 having a predetermined opening pattern is formed on fifth semiconductor layer 15, and p-type impurities are implanted into fifth semiconductor layer 15 masked with oxide film 201 to form second gate electrode layer 18B, which has a lower surface extending on fourth semiconductor layer 14, contains p-type impurities at a concentration from about $3\times10^{18}$ cm$^{-3}$ to about $1\times10^{20}$ cm$^{-3}$, i.e., at a concentration substantially equal to that of first gate electrode layer 18A, and has the same potential as first gate electrode layer 18A. This implantation of the p-type impurities is performed in six stages under different conditions, i.e., a first stage under conditions of an implantation energy of about 700 kev and an implantation dose of about $3\times10^{14}$ cm$^{-2}$, a second stage under conditions of an implantation energy of about 500 kev and an implantation dose of about $3\times10^{14}$ cm$^{-2}$, a third stage under conditions of an implantation energy of about 280 kev and an implantation dose of about $5\times10^{14}$ cm$^{-2}$, a fourth stage under conditions of an implantation energy of about 140 kev and an implantation dose of about $5\times10^{14}$ cm$^{-2}$, a fifth stage under conditions of an implantation energy of about 70 kev and an implantation dose of about $4\times10^{14}$ cm$^{-2}$, and a sixth stage under conditions of an implantation energy of about 30 kev and an implantation dose of about $3\times10^{14}$ cm$^{-2}$.

Figure 6:
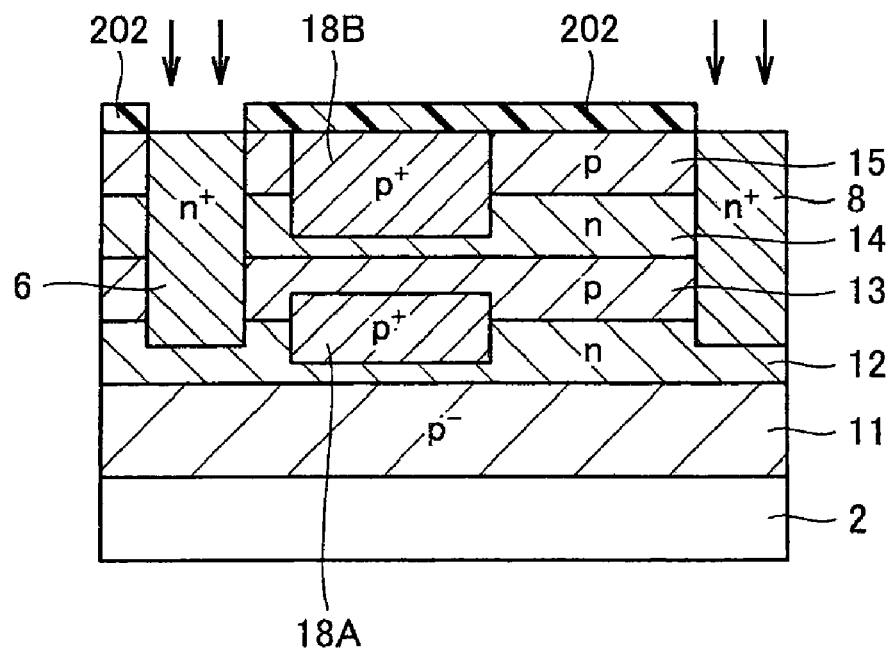
FIG. 6 is cross section showing a fifth step in a method of manufacturing the lateral junction field effect transistor according to the first embodiment.

Referring to FIG. 6, oxide film 201 is removed, and an oxide film 202 having a predetermined opening pattern is formed on fifth semiconductor layer 15. Then, impurities are implanted into fifth semiconductor layer 15 masked with oxide film 202, and more specifically into portions on the opposite sides of first and second gate electrode layers 18A and 18B to form source/drain region layers 6 and 8, which has the lower surfaces extending on the second semiconductor layer 12, and contain n-type impurities at a concentration from about $1\times10^{19}$ cm$^{-3}$ to about $1\times10^{20}$ cm$^{-3}$, i.e., at a concentration higher than that of second and fourth semiconductor layers 12 and 14.

Figure 7:
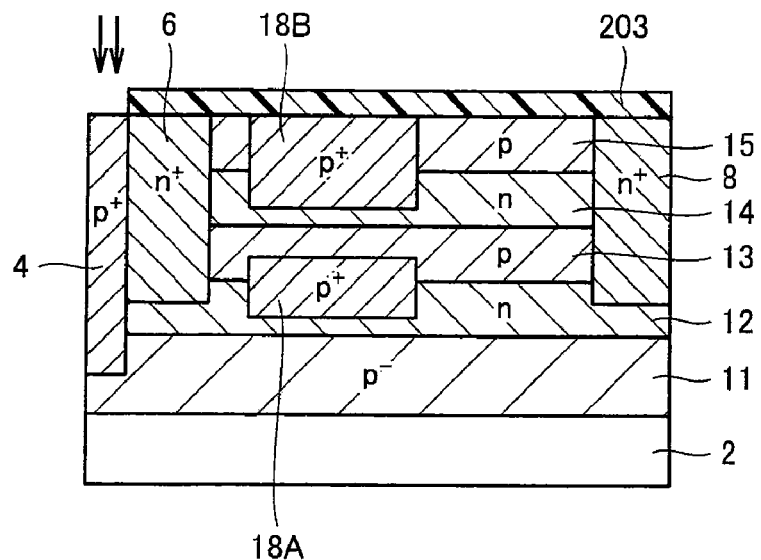
FIG. 7 is cross section showing a sixth step in a method of manufacturing the lateral junction field effect transistor according to the first embodiment.

Referring to FIG. 7, oxide film 202 is removed, and then an oxide film 203 having a predetermined opening pattern is formed on fifth semiconductor layer 15. Impurities are implanted into fifth semiconductor layer 15 masked with oxide film 202, and more specifically into a portion outside source/drain region layer 6 to form impurity region layer 4, which has a lower surface extending on first semiconductor layer 11, and contains p-type impurities at a concentration from about $3\times10^{18}$ cm$^{-3}$ to about $1\times10^{20}$ cm$^{-3}$. Although not shown, the structure is then processed in various steps of surface thermal oxidization, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 100 of the first embodiment shown in FIG. 1 is completed.

(Operation and Effect)

According to the lateral junction field effect transistor having the above structure as well as the method of manufacturing the same, since the plurality of the lateral junction field effect transistors are stacked in a vertical direction, the on-resistance of the element can be reduced, as compared with conventional structures. Further, the second, third, fourth and fifth semiconductor layers 12, 13, 14 and 15 may have substantially the same impurity concentration and the same layer thickness so that the lateral junction field effect transistors can have the minimum on-resistance and the maximum breakdown voltage.

One or more unit transistor structure(s) each being substantially the same as the structure having second semiconductor layer 12, third semiconductor layer 13 and first gate electrode layer 18A may be arranged between third and fourth semiconductor layers 13 and 14. Thereby, the junction field effect transistor can have further improved characteristics.

Second Embodiment (Structure of Lateral Junction Field Effect Transistor 200)

Figure 8:
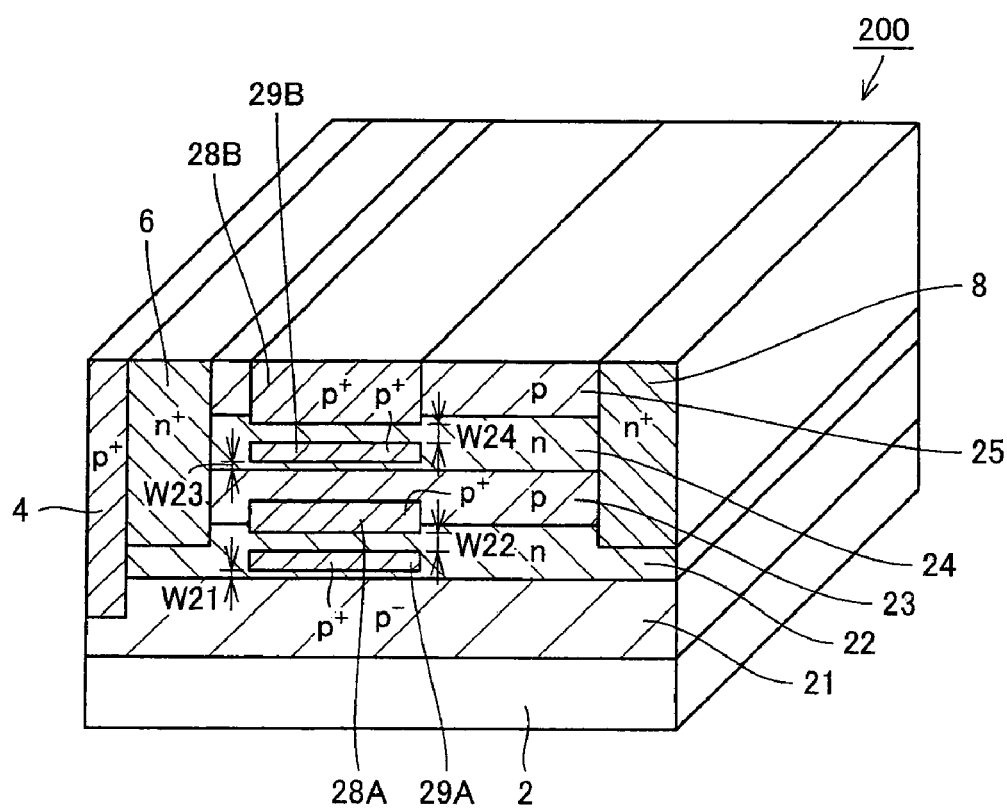
FIG. 8 is a cross section showing a structure of a lateral junction field effect transistor according to a second embodiment.

A lateral junction field effect transistor 200 according to a second embodiment will now be described with reference to FIG. 8.

Lateral junction field effect transistor 200 according to the second embodiment has a structural feature that pn-junctions and gate electrode layers are arranged in a vertical direction, similarly to the lateral junction field effect transistor 100 already described.

Lateral junction field effect transistor 200 includes a first semiconductor layer 21, which is located on semiconductor substrate 2 made of silicon and others, and is doped with p-type impurities, a second semiconductor layer 22, which is located on first semiconductor layer 21, and is doped with n-type impurities more heavily than first semiconductor layer 21, a third semiconductor layer 23 located on second semiconductor layer 22 and doped with p-type impurities, a fourth semiconductor layer 24 located on third semiconductor layer 23 and doped with n-type impurities, and a fifth semiconductor layer 25 located on fourth semiconductor layer 24 and doped with p-type impurities.

First semiconductor layer 21 is made of SiC, has a layer thickness from about 3 μm to about 4 μm and is doped with impurities at a concentration of about $1 \times 10^{16}$ cm$^{-3}$. Each of second, third, fourth and fifth semiconductor layers 22, 23, 24 and 25 is made of SiC, has a layer thickness from about 0.5 μm to about 1.0 μm and is doped with impurities at a concentration from about $1 \times 10^{17}$ cm$^{-3}$ to about $3 \times 10^{17}$ cm$^{-3}$.

In fifth semiconductor layer 25, source/drain region layers 6 and 8 are arranged with a predetermined space therebetween. Source/drain region layers 6 and 8 have lower surfaces extending on second semiconductor layer 22, and are doped with n-type impurities more heavily than second and fourth semiconductor layers 22 and 24. The impurity concentrations of source/drain region layers 6 and 8 are substantially in a range from about $1 \times 10^{19}$ cm$^{-3}$ to about $1 \times 10^{20}$ cm$^{-3}$.

Between source/drain region layers 6 and 8, a first gate electrode layer 28A is arranged in third semiconductor layer 23. First gate electrode layer 28A has a lower surface extending on second semiconductor layer 22, and is doped with p-type impurities more heavily than second semiconductor layer 22.

Between source/drain region layers 6 and 8, a second gate electrode layer 28B is arranged in fifth semiconductor layer 25. Second gate electrode layer 28B has a lower surface extending on fourth semiconductor layer 24, has substantially the same impurity concentration as first gate electrode layer 28A, and has the same potential as first gate electrode layer 28A. The impurity concentrations of first and second gate electrode layers 28A and 28B are in a range from about $3 \times 10^{18}$ cm$^{-3}$ to about $1 \times 10^{20}$ cm$^{-3}$.

A first impurity doped region 29A of the p-type is arranged in second semiconductor layer 22 between first semiconductor layer 21 and first gate electrode layer 28A. First impurity doped region 29A has substantially the same impurity concentration as first gate electrode layer 28A, and has the same potential as first gate electrode layer 28A. Also, a second impurity doped region 29B of the p-type is arranged in fourth semiconductor layer 24 between third semiconductor layer 23 and second gate electrode layer 28B. Second impurity doped region 29B has substantially the same impurity concentration as first gate electrode layer 28A, and has the same potential as first gate electrode layer 28A. Although the structure shown in FIG. 8 is provided with one layer of first impurity doped region 29A and one layer of second impurity doped region 29B, it may be provided with a plurality of layers of first impurity doped regions 29A and a plurality of layers of second impurity doped regions 29B for the purpose of achieving the normally-off type of the lateral junction field effect transistor, in which a total channel width is increased and an on-resistance is lowered.

Outside source region layer 6, there is arranged impurity region layer 4, which extends to first semiconductor layer 21, and is doped with p-type impurities at a concentration from about $3 \times 10^{18}$ cm$^{-3}$ to about $1 \times 10^{20}$ cm$^{-3}$.

The normally-off type of the lateral junction field effect transistor can be achieved by such a structure that a distance w21 between a top of first semiconductor layer 21 and a bottom of first impurity doped region 29A is smaller than a distance of a depletion layer extended by a diffused potential in a junction between second semiconductor layer 22 and first impurity doped region 29A, a distance w22 between a top of first impurity doped region 29A and a bottom of first gate electrode layer 28A is smaller than double a distance of a depletion layer extended by a diffused potential in a junction between second semiconductor layer 22 and first gate electrode layer 28A, a distance w23 between a top of third semiconductor layer 23 and a bottom of second impurity doped region 29B is smaller than a distance of a depletion layer extended by a diffused potential in a junction between fourth semiconductor layer 24 and second impurity doped region 29B, and a distance w24 between a top of second impurity doped region 29B and a bottom of second gate electrode layer 28B is smaller than a distance of a depletion layer extended by a diffused potential in a junction between fourth semiconductor layer 24 and second gate electrode layer 28B.

(Method of Manufacturing Lateral Junction Field Effect Transistor 200)

A method of manufacturing lateral junction field effect transistor 200 having the above structures will now be described with reference to FIGS. 9 to 16.

Figure 9:
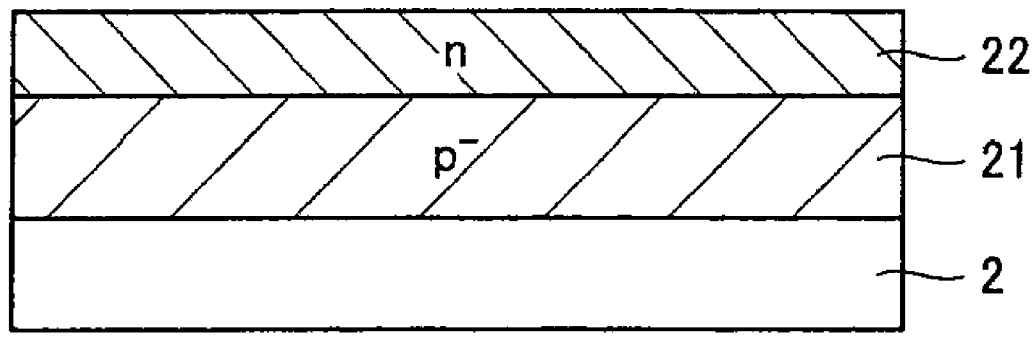
FIG. 9 is cross section showing a first step in a method of manufacturing the lateral junction field effect transistor according to the second embodiment.

Referring to FIG. 9, first semiconductor layer 21, which is made of SiC doped with p-type impurities, and has a layer thickness from about 3 μm to about 4 μm and an impurity concentration of about $1 \times 10^{16}$ cm$^{-3}$, is formed on semiconductor substrate 2 made of silicon and others by epitaxial growth. Thereafter, second semiconductor layer 22, which is made of SiC doped with n-type impurities, and has a layer thickness of about 0.5 μm and an impurity concentration of about $3 \times 10^{17}$ cm$^{-3}$ higher than that of first semiconductor layer 21, is formed on first semiconductor layer 21 by epitaxial growth.

Figure 10:
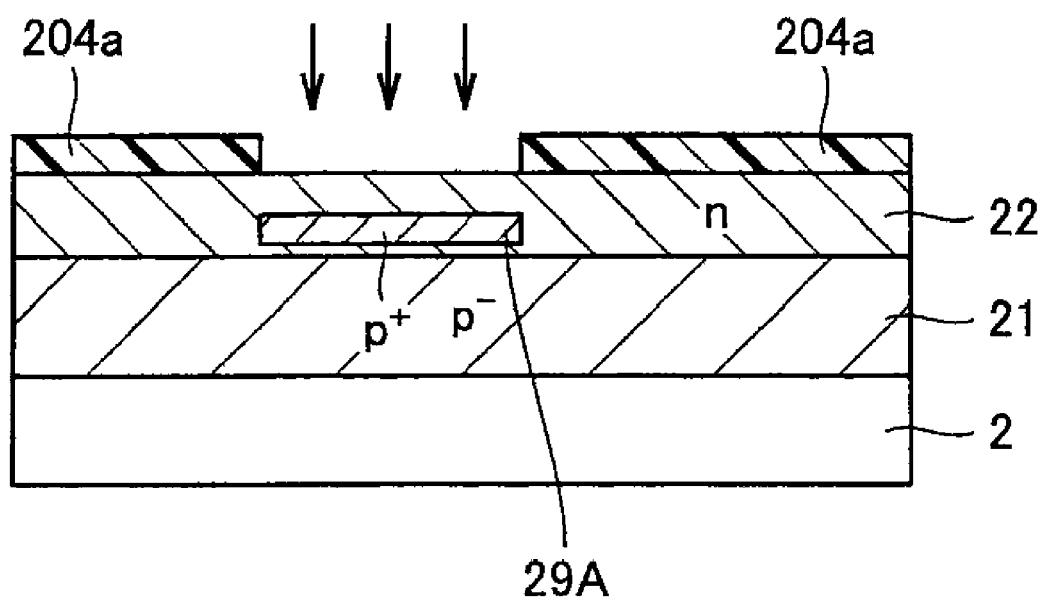
FIG. 10 is cross section showing a second step in a method of manufacturing the lateral junction field effect transistor according to the second embodiment.

Referring to FIG. 10, an oxide film 204a having a predetermined opening pattern is formed on second semiconductor layer 22. Using oxide film 204a as a mask, p-type impurities are implanted into second semiconductor layer 22 to form first impurity doped region 29A, which is located in second semiconductor layer 22, and is doped with p-type impurities at a concentration from about $3\times10^{18}$ cm$^{-3}$ to about $1\times10^{20}$ cm$^{-3}$. This implantation of the p-type impurities is effected under conditions of an implantation energy of about 270 kev and an implantation dose of about $7\times10^{13}$ cm$^{-2}$.

Figure 11:
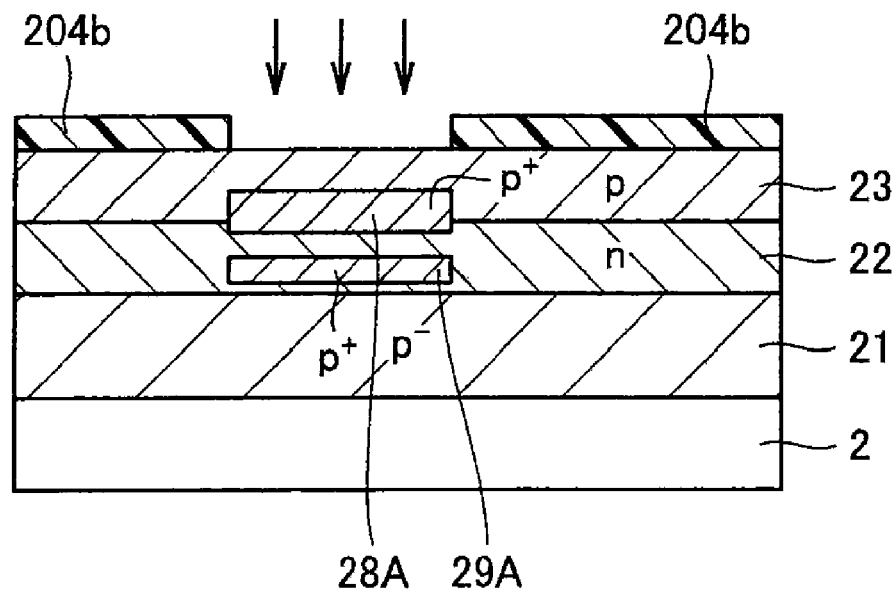
FIG. 11 is cross section showing a third step in a method of manufacturing the lateral junction field effect transistor according to the second embodiment.

Referring to FIG. 11, oxide film 204a is removed, and then third semiconductor layer 23, which is made of SiC doped with p-type impurities, and has a layer thickness from about 0.5 μm and an impurity concentration of about $3\times10^{17}$ cm$^{-3}$, is formed on second semiconductor layer 22 by epitaxial growth.

An oxide film 204b having a predetermined opening pattern is formed on third semiconductor layer 23. Using oxide film 204b as a mask, p-type impurities are implanted into third semiconductor layer 23 to form first gate electrode layer 28A, which extends in second and third semiconductor layers 22 and 23, and is doped with p-type impurities at a concentration from about $3\times10^{18}$ cm$^{-3}$ to about $1\times10^{20}$ cm$^{-3}$ higher than that of second semiconductor layer 22. This implantation of the p-type impurities is effected under conditions of an implantation energy of about 350 kev and an implantation dose of about $1\times10^{14}$ cm$^{-2}$.

Figure 12:
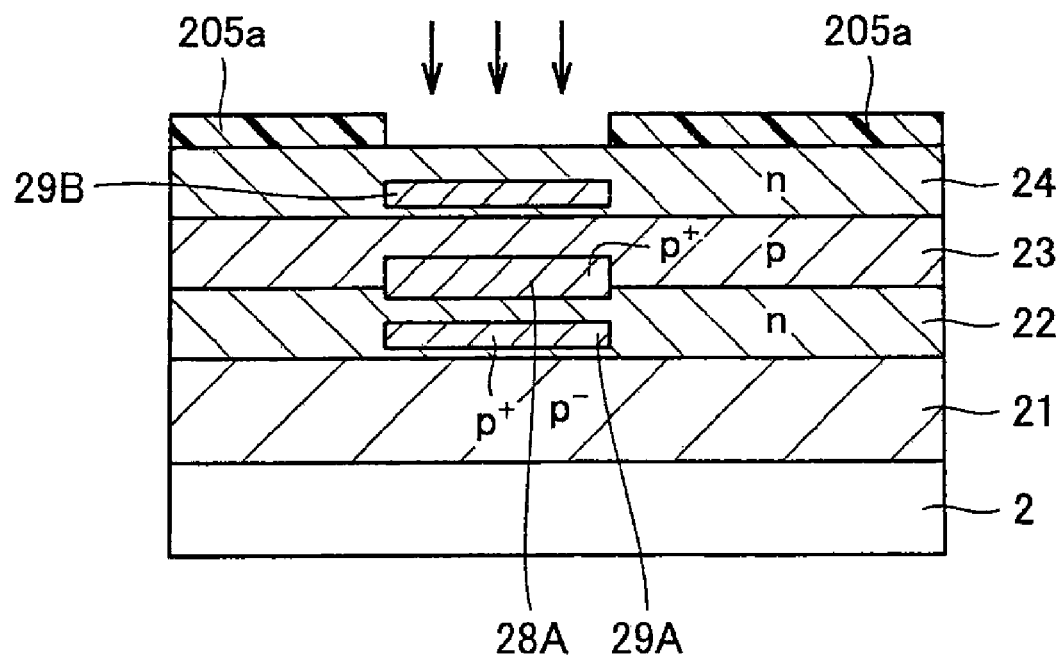
FIG. 12 is cross section showing a fourth step in a method of manufacturing the lateral junction field effect transistor according to the second embodiment.

Referring to FIG. 12, oxide film 204b is removed, and then fourth semiconductor layer 24, which is made of SiC doped with n-type impurities, and has a thickness of about 0.5 μm and an impurity concentration of about $3\times10^{17}$ cm$^{-3}$ higher than that of first semiconductor layer 11, is formed on third semiconductor layer 23.

Then, an oxide film 205a having a predetermined opening pattern is formed on fourth semiconductor layer 24, and p-type impurities are implanted into fourth semiconductor layer 24 masked with oxide film 205a to form second impurity doped region 29B, which is located in fourth semiconductor layer 24 and contains p-type impurities at a concentration from about $3\times10^{18}$ cm$^{-3}$ to about $1\times10^{20}$ cm$^{-3}$. This implantation of the p-type impurities is performed under conditions of an implantation energy of about 270 kev and an implantation dose of about $7\times10^{13}$ cm$^{-2}$.

Figure 13:
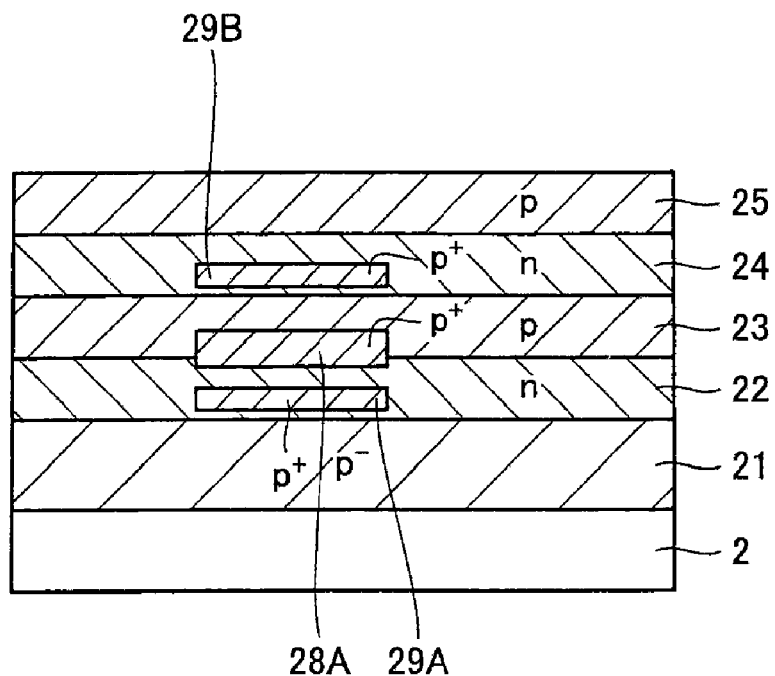
FIG. 13 is cross section showing a fifth step in a method of manufacturing the lateral junction field effect transistor according to the second embodiment.

Referring to FIG. 13, fifth semiconductor layer 25, which is made of SiC doped with p-type impurities, and has a thickness of about 0.5 μm and an impurity concentration of about $3\times10^{17}$ cm$^{-3}$, is formed on fourth semiconductor layer 24 by epitaxial growth.

Figure 14:
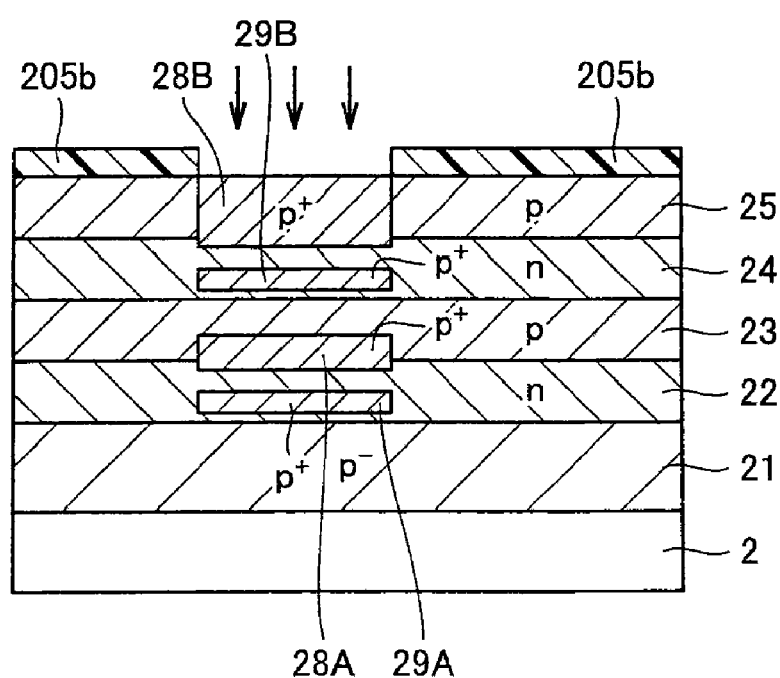
FIG. 14 is cross section showing a sixth step in a method of manufacturing the lateral junction field effect transistor according to the second embodiment.

Referring to FIG. 14, an oxide film 205b having a predetermined opening pattern is formed on fifth semiconductor layer 25, and p-type impurities are implanted into fifth semiconductor layer 25 masked with oxide film 205b to form second gate electrode layer 28B, which extends in fourth and fifth semiconductor layers, contains p-type impurities at a concentration from about $3\times10^{18}$ cm$^{-3}$ to about $1\times10^{20}$ cm$^{-3}$, i.e., at a concentration higher than that of second semiconductor layer 22. This implantation of the p-type impurities is performed in five stages under different conditions, i.e., a first stage under conditions of an implantation energy of about 350 kev and an implantation dose of about $1\times10^{14}$ cm$^{-2}$, a second stage under conditions of an implantation energy of about 250 kev and an implantation dose of about $2\times10^{14}$ cm$^{-2}$, a third stage under conditions of an implantation energy of about 140 kev and an implantation dose of about $5\times10^{14}$ cm$^{-2}$, a fourth stage under conditions of an implantation energy of about 70 kev and an implantation dose of about $4\times10^{14}$ cm$^{-2}$, and a fifth stage under conditions of an implantation energy of about 30 kev and an implantation dose of about $3\times10^{14}$ cm$^{-2}$.

Figure 15:
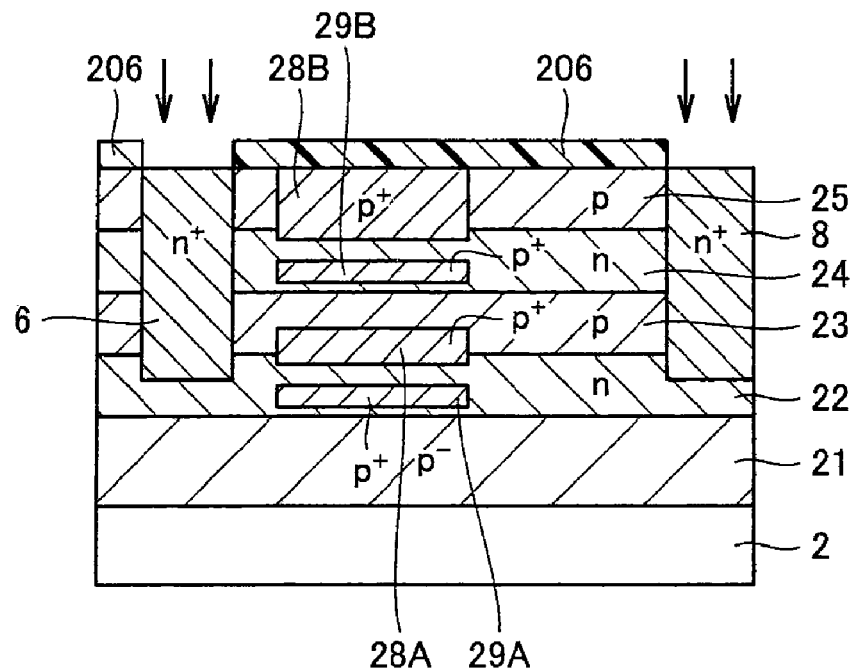
FIG. 15 is cross section showing a seventh step in a method of manufacturing the lateral junction field effect transistor according to the second embodiment.

Referring to FIG. 15, oxide films 205b is removed, and an oxide film 206 having a predetermined opening pattern is formed on fifth semiconductor layer 25. Then, impurities are implanted into fifth semiconductor layer 25 masked with oxide film 206, and more specifically into portions on the opposite sides of first and second impurity doped regions 29A and 29B as well as first and second gate electrode layers 28A and 28B to form source/drain region layers 6 and 8, which have lower surfaces extending on second semiconductor layer 22, and are doped with n-type impurities at a concentration from about $1\times10^{19}$ cm$^{-3}$ to about $1\times10^{20}$ cm$^{-3}$ higher than those of second and fourth semiconductor layers 22 and 24.

Figure 16:
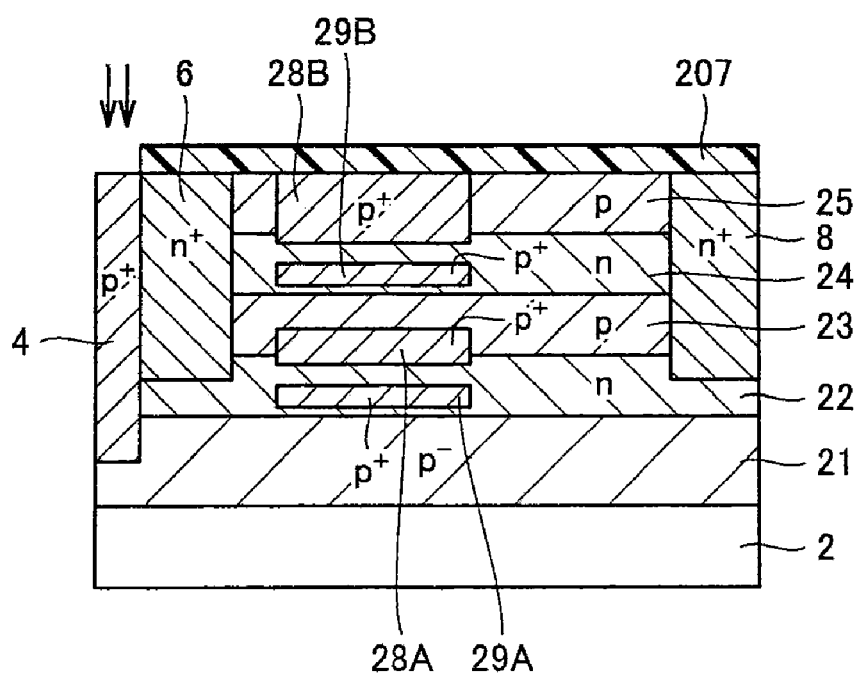
FIG. 16 is cross section showing an eighth step in a method of manufacturing the lateral junction field effect transistor according to the second embodiment.

Referring to FIG. 16, oxide film 206 is removed, and then an oxide film 207 having a predetermined opening pattern is formed on fifth semiconductor layer 25. Then, impurities are implanted into fifth semiconductor layer 25 masked with oxide film 207, and more specifically into a portion outside source/drain region layer 6 to form impurity region layer 4, which has a lower surface extending on first semiconductor layer 21, and contains p-type impurities at a concentration from about $3\times10^{18}$ cm$^{-3}$ to about $1\times10^{20}$ cm$^{-3}$. Although not shown, the structure is then processed in various steps of surface thermal oxidization, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 200 of the second embodiment shown in FIG. 8 is completed.

(Operation and Effect)

According to the lateral junction field effect transistor having the above structure as well as the method of manufacturing the same, since the plurality of the lateral junction field effect transistors are stacked in the vertical direction, the on-resistance of the element can be reduced, as compared with conventional structures. Further, the second, third, fourth and fifth semiconductor layers 22, 23, 24 and 25 may have substantially the same impurity concentration and the same layer thickness so that the lateral junction field effect transistors can have the minimum on-resistance and the maximum breakdown voltage.

One or more unit transistor structure(s) each being substantially the same as the structure having second semiconductor layer 22, third semiconductor layer 23 and first gate electrode layer 28A may be arranged between third and fourth semiconductor layers 23 and 24. Thereby, the junction field effect transistor can have further improved characteristics.

Figure 17:
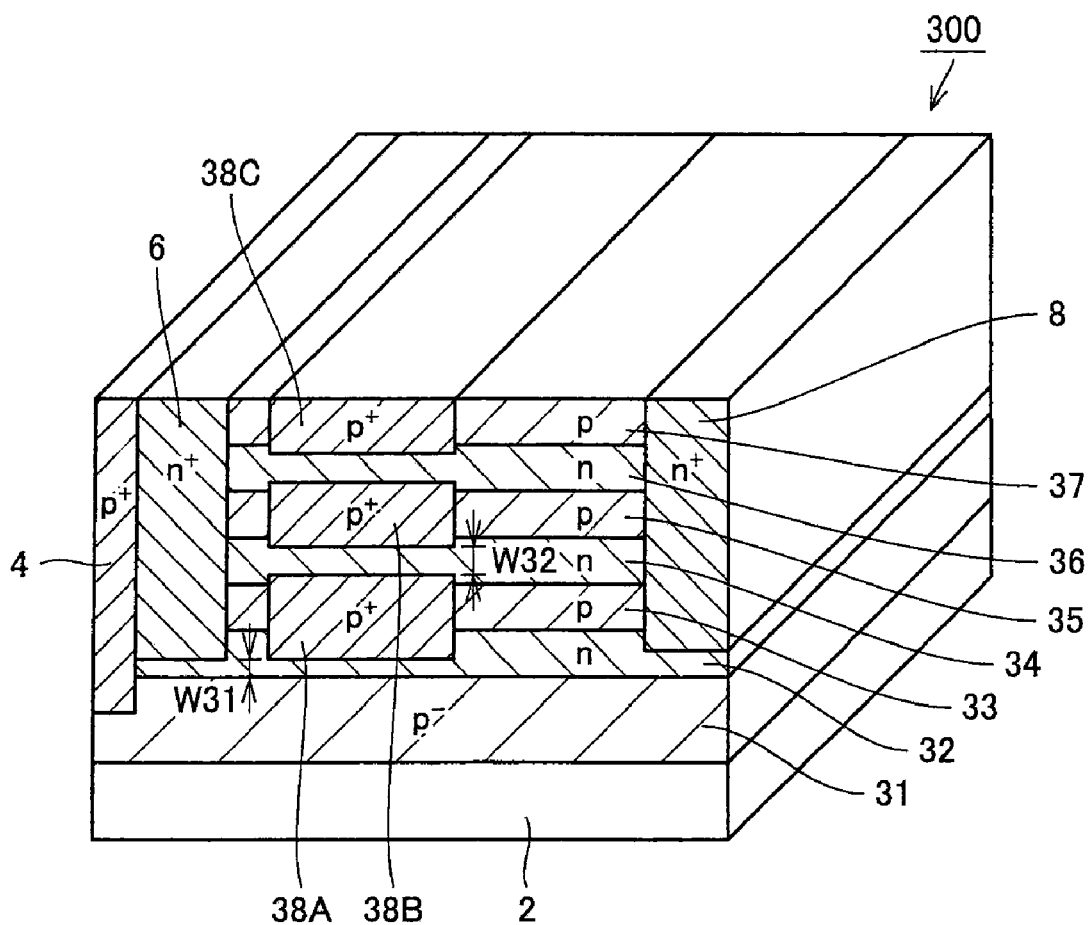
FIG. 17 is a cross section showing a structure of a lateral junction field effect transistor according to a third embodiment.

Third Embodiment (Structure of Lateral Junction Field Effect Transistor 300)
A lateral junction field effect transistor 300 according to a third embodiment will now be described with reference to FIG. 17.

Lateral junction field effect transistor 300 according to the third embodiment has a structural feature that pn-junctions and gate electrode layers are arranged in a vertical direction, similarly to the lateral junction field effect transistor 100 already described.

Lateral junction field effect transistor 300 includes a first semiconductor layer 31, which is located on semiconductor substrate 2 made of silicon and others, and is doped with p-type impurities, a second semiconductor layer 32, which is located on first semiconductor layer 31, and is doped with n-type impurities more heavily than first semiconductor layer 31, a third semiconductor layer 33 located on second semiconductor layer 32 and doped with p-type impurities, a fourth semiconductor layer 34 located on third semiconductor layer 33 and doped with n-type impurities, a fifth semiconductor layer 35 located on fourth semiconductor layer 34 and doped with p-type impurities, a sixth semiconductor layer 36 located on fifth semiconductor layer 35 and doped with n-type impurities, and a seventh semiconductor layer 37 located on sixth semiconductor layer 36 and doped with p-type impurities.

First semiconductor layer 31 is made of SiC, has a layer thickness from about 3 μm to about 4 μm and is doped with impurities at a concentration of about $1 \times 10^{16}$ cm$^{-3}$. Each of second, third, fourth, fifth, sixth and seventh semiconductor layers 32, 33, 34, 35, 36 and 37 is made of SiC, has a layer thickness from about 0.5 μm to about 1.0 μm and is doped with impurities at a concentration from about $1 \times 10^{17}$ cm$^{-3}$ to about $3 \times 10^{17}$ cm$^{-3}$.

In seventh semiconductor layer 37, source/drain region layers 6 and 8 are arranged with a predetermined space therebetween. Source/drain region layers 6 and 8 have lower surfaces extending on second semiconductor layer 32, and are doped with n-type impurities more heavily than second, fourth and sixth semiconductor layers 32, 34 and 36. The impurity concentrations of source/drain region layers 6 and 8 are substantially in a range from about $1 \times 10^{19}$ cm$^{-3}$ to about $1 \times 10^{20}$ cm$^{-3}$.

Between source/drain region layers 6 and 8, a first gate electrode layer 38A is arranged in third semiconductor layer 33. First gate electrode layer 38A has lower and upper surfaces extending on second and fourth semiconductor layers 32 and 34, respectively, and is doped with p-type impurities more heavily than second and fourth semiconductor layers 32 and 34.

Between source/drain region layers 6 and 8, a second gate electrode layer 38B is arranged in fifth semiconductor layer 35. Second gate electrode layer 38B has lower and upper surfaces extending on fourth and sixth semiconductor layers 34 and 36, respectively, and is doped with p-type impurities more heavily than fourth and sixth semiconductor layers 34 and 36.

Between source/drain region layers 6 and 8, a third gate electrode layer 38C is arranged in seventh semiconductor layer 37. Third gate electrode layer 38C has a lower surface extending on sixth semiconductor layer 36, has substantially the same impurity concentration as first and second gate electrode layers 38A and 38B, and has the same potential as first and second gate electrode layers 38A and 38B.

The impurity concentrations of first, second and third gate electrode layers 38A, 38B and 38C are in a range from about $3 \times 10^{18}$ cm$^{-3}$ to about $1 \times 10^{20}$ cm$^{-3}$.

Outside source region layer 6, there is arranged impurity region layer 4, which extends to first semiconductor layer 31, and is doped with p-type impurities at a concentration from about $3 \times 10^{18}$ cm$^{-3}$ to about $1 \times 10^{20}$ cm$^{-3}$.

The normally-off type of the lateral junction field effect transistor can be achieved by such a structure that a distance w31 between a top of first semiconductor layer 31 and a bottom of first gate electrode layer 38A is smaller than a distance of a depletion layer extended by a diffused potential in a junction between second semiconductor layer 32 and first gate electrode layer 38A, and a distance w32 between a top of first gate electrode layer 38A and a bottom of second gate electrode layer 38B is smaller than double a distance of a depletion layer extended by a diffused potential in a junction between fourth semiconductor layer 34 and first gate electrode layer 38A.

(Method of Manufacturing Lateral Junction Field Effect Transistor 300)

A method of manufacturing lateral junction field effect transistor 300 having the above structures will now be described with reference to FIGS. 18 to 25.

Figure 18:
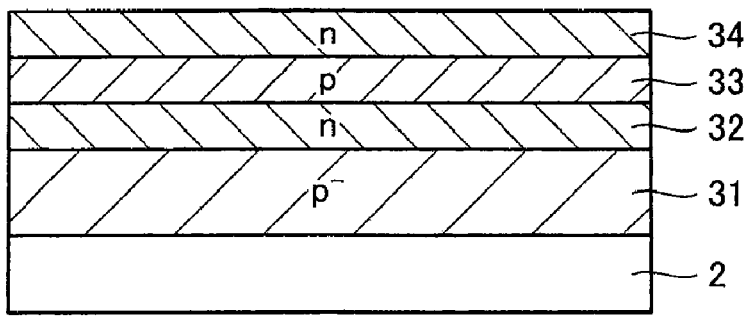
FIG. 18 is cross section showing a first step in a method of manufacturing the lateral junction field effect transistor according to the third embodiment.

Referring to FIG. 18, first semiconductor layer 31, which is made of SiC doped with p-type impurities, and has a layer thickness from about 3 μm to about 4 μm and an impurity concentration of about $1 \times 10^{16}$ cm$^{-3}$, is formed on semiconductor substrate 2 made of silicon and others by epitaxial growth. Thereafter, second semiconductor layer 32, which is made of SiC doped with n-type impurities, and has a layer thickness from about 0.5 μm to about 1.0 μm and an impurity concentration from about $1 \times 10^{17}$ cm$^{-3}$ to about $3 \times 10^{17}$ cm$^{-3}$ higher than that of first semiconductor layer 31, is formed on first semiconductor layer 31 by epitaxial growth. Then, third semiconductor layer 33, which is made of SiC doped with p-type impurities, and has a layer thickness from about 0.5 μm to about 1.0 μm and an impurity concentration from about $1 \times 10^{17}$ cm$^{-3}$ to about $3 \times 10^{17}$ cm$^{-3}$, is formed on second semiconductor layer 32 by epitaxial growth. Then, fourth semiconductor layer 34, which is made of SiC doped with n-type impurities, and has a layer thickness from about 0.5 μm to about 1.0 μm and an impurity concentration from about $1 \times 10^{17}$ cm$^{-3}$ to about $3 \times 10^{17}$ cm$^{-3}$, is formed on third semiconductor layer 33 by epitaxial growth.

Figure 19:
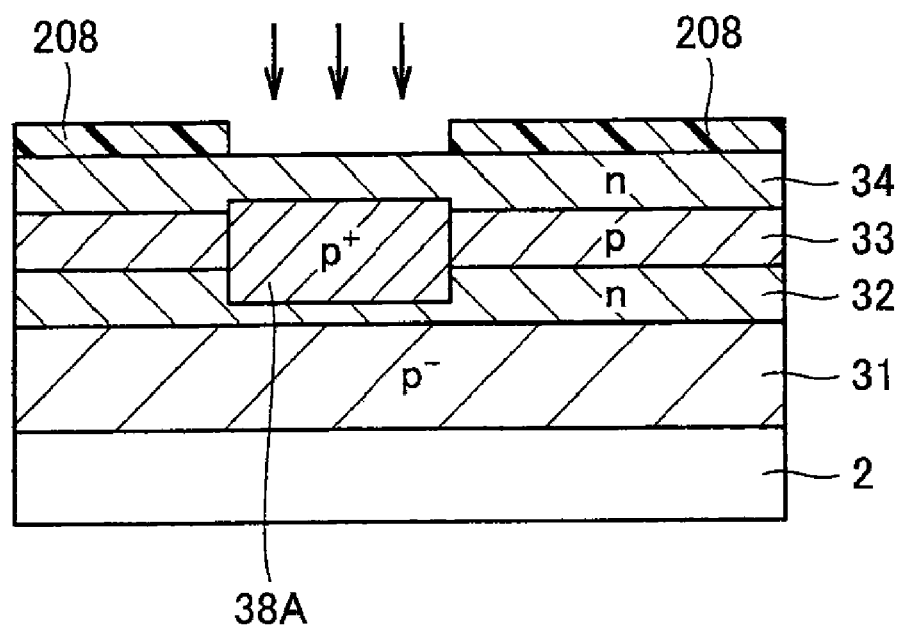
FIG. 19 is cross section showing a second step in a method of manufacturing the lateral junction field effect transistor according to the third embodiment.

Referring to FIG. 19, an oxide film 208 having a predetermined opening pattern is formed on fourth semiconductor layer 34. Using oxide film 208 as a mask, p-type impurities are implanted into a predetermined region of fourth semiconductor layer 34 to form first gate electrode layer 38A, which has lower and upper surfaces extending on second and fourth semiconductor layers 32 and 34, respectively, and is doped with p-type impurities at a concentration from about $3 \times 10^{18}$ cm$^{-3}$ to about $1 \times 10^{20}$ cm$^{-3}$ higher than that of second and fourth semiconductor layers 32 and 34.

Figure 20:
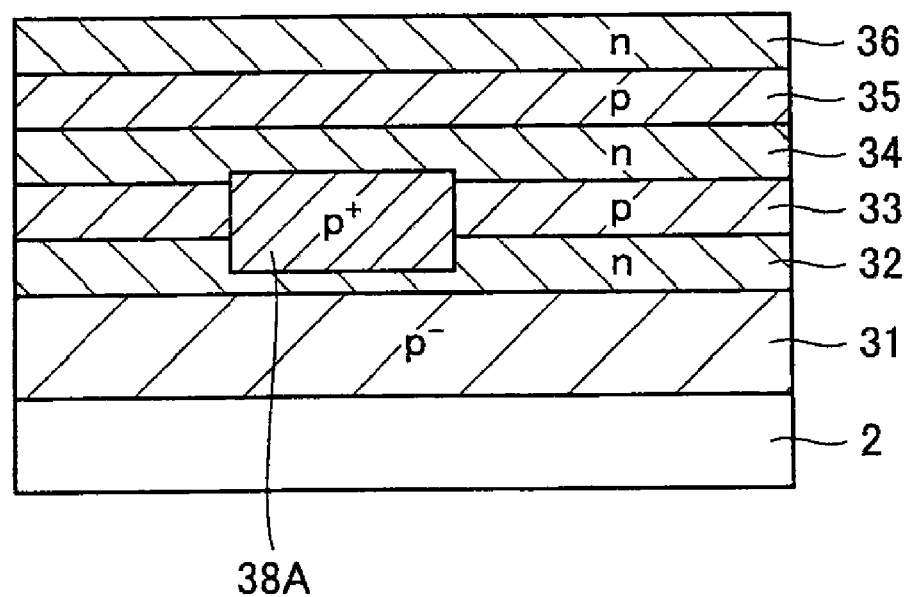
FIG. 20 is cross section showing a third step in a method of manufacturing the lateral junction field effect transistor according to the third embodiment.

Referring to FIG. 20, fifth semiconductor layer 35, which is made of SiC doped with p-type impurities, and has a thickness from about 0.5 μm to about 1.0 μm and an impurity concentration from about $1 \times 10^{17}$ cm$^{-3}$ to about $3 \times 10^{17}$ cm$^{-3}$, is formed on fourth semiconductor layer 34. Then, sixth semiconductor layer 36, which is made of SiC doped with n-type impurities, and has a thickness from about 0.5 μm to about 1.0 μm and an impurity concentration from about $1 \times 10^{17}$ cm$^{-3}$ to about $3 \times 10^{17}$ cm$^{-3}$, is formed on fifth semiconductor layer 35 by epitaxial growth.

Figure 21:
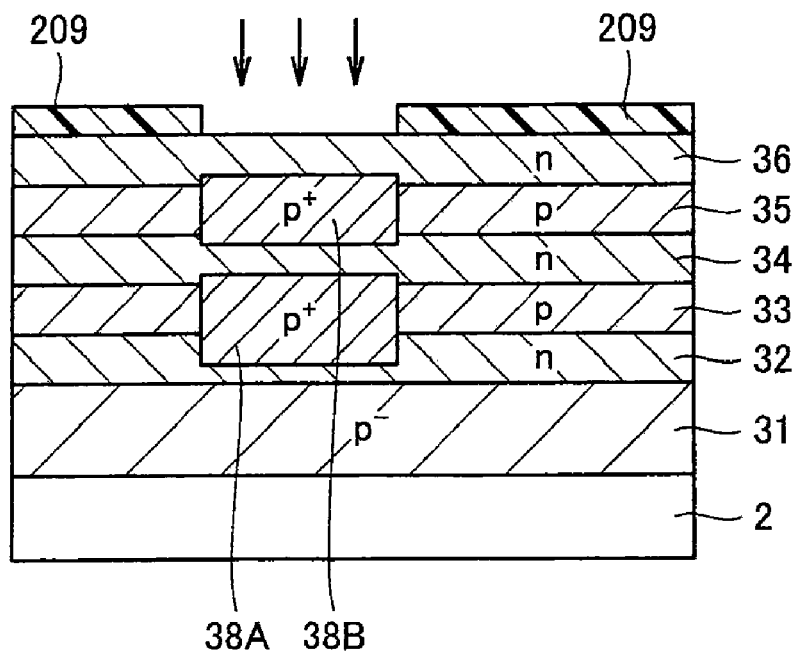
FIG. 21 is cross section showing a fourth step in a method of manufacturing the lateral junction field effect transistor according to the third embodiment.

Referring to FIG. 21, an oxide film 209 having a predetermined opening pattern is formed on sixth semiconductor layer 36, and p-type impurities are implanted into a predetermined region of sixth semiconductor layer 36 masked with oxide film 209 to form second gate electrode layer 38B, which has lower and upper surfaces extending on fourth and sixth semiconductor layers 34 and 36, respectively, and contains p-type impurities at a concentration from about $3 \times 10^{18}$ cm$^{-3}$ to about $1 \times 10^{20}$ cm$^{-3}$ higher than those of fourth and sixth semiconductor layers 34 and 36.

Figure 22:
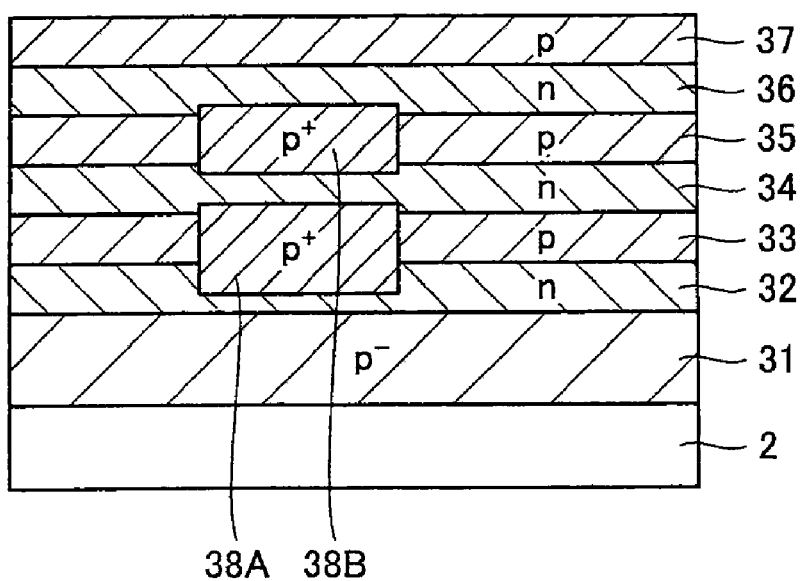
FIG. 22 is cross section showing a fifth step in a method of manufacturing the lateral junction field effect transistor according to the third embodiment.

Referring to FIG. 22, oxide film 209 is removed, and seventh semiconductor layer 37, which is made of SiC doped with p-type impurities, and has a thickness from about 0.5 μm to about 1.0 μm and an impurity concentration from about $1 \times 10^{17}$ cm$^{-3}$ to about $3 \times 10^{17}$ cm$^{-3}$, is formed on sixth semiconductor layer 36 by epitaxial growth.

Figure 23:
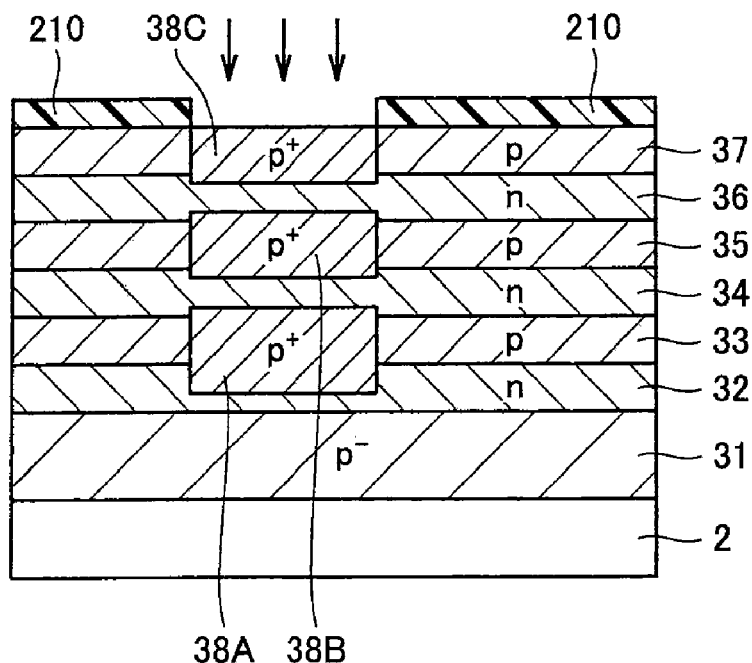
FIG. 23 is cross section showing a sixth step in a method of manufacturing the lateral junction field effect transistor according to the third embodiment.

Referring to FIG. 23, an oxide film 210 having a predetermined opening pattern is formed on seventh semiconductor layer 37, and p-type impurities are implanted into a predetermined region of seventh semiconductor layer 37 masked with oxide film 210 to form a third gate electrode layer 38C, which has a lower surface extending on sixth semiconductor layer 36, and contains p-type impurities at a concentration from about $3 \times 10^{18}$ cm$^{-3}$ to about $1 \times 10^{20}$ cm$^{-3}$ higher than that of sixth semiconductor layer 36.

Figure 24:
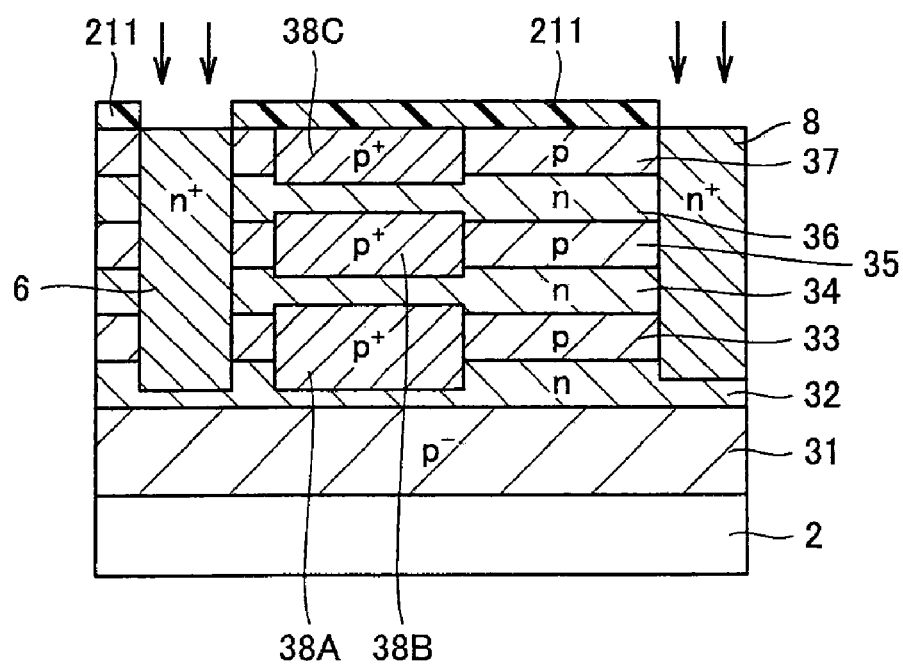
FIG. 24 is cross section showing a seventh step in a method of manufacturing the lateral junction field effect transistor according to the third embodiment.

Referring to FIG. 24, oxide film 210 is removed, and an oxide film 211 having a predetermined opening pattern is formed on seventh semiconductor layer 37. Then, impurities are implanted into seventh semiconductor layer 37 masked with oxide film 211, and more specifically into portions on the opposite sides of first, second and third gate electrode layers 38A, 38B and 38C to form source/drain region layers 6 and 8, which have lower surfaces extending on second semiconductor layer 32, and are doped with n-type impurities at a concentration from about $1\times10^{19}$ cm$^{-3}$ to about $1\times10^{20}$ cm$^{-3}$ higher than those of second and fourth semiconductor layers 32 and 34.

Figure 25:
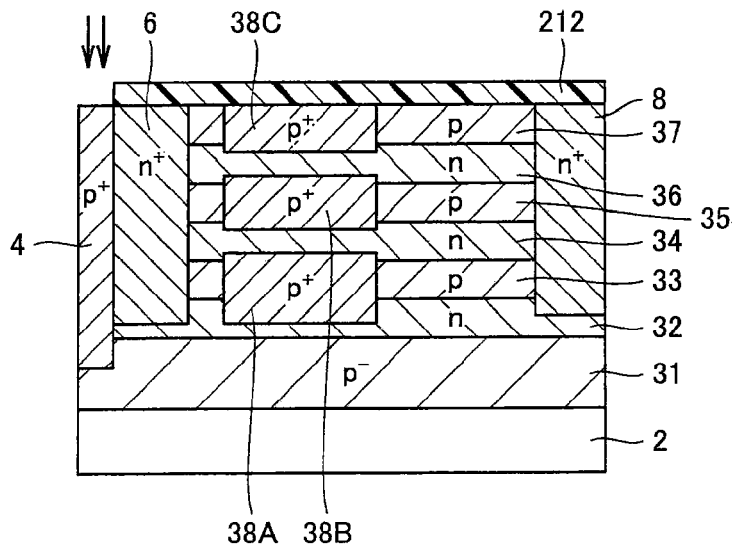
FIG. 25 is cross section showing an eighth step in a method of manufacturing the lateral junction field effect transistor according to the third embodiment.

Referring to FIG. 25, oxide film 211 is removed, and then an oxide film 212 having a predetermined opening pattern is formed on seventh semiconductor layer 37. Then, impurities are implanted into seventh semiconductor layer 37 masked with oxide film 212, and more specifically into a portion outside source/drain region layer 6 to form impurity region layer 4, which has the lower surface extending on first semiconductor layer 31, and contains p-type impurities at a concentration from about $3\times10^{18}$ cm$^{-3}$ to about $1\times10^{20}$ cm$^{-3}$. Although not shown, the structure is then processed in various steps of surface thermal oxidation, opening, formation of Ni-electrode, formation of insulating layers (QCD and others), opening of contact holes, provision of aluminum interconnections, formation of pads, thermal processing, formation of ohmic contacts and others. Thereby, lateral junction field effect transistor 300 of the third embodiment shown in FIG. 17 is completed.

(Operation and Effect)

According to the lateral junction field effect transistor having the above structure as well as the method of manufacturing the same, since the plurality of the lateral junction field effect transistors are stacked in the vertical direction, the on-resistance of the element can be reduced, as compared with conventional structures. Further, the second, third, fourth, fifth, sixth and seventh semiconductor layers 32, 33, 34, 35, 36 and 37 may have substantially the same impurity concentration and the same layer thickness so that the lateral junction field effect transistors can have the minimum on-resistance and the maximum breakdown voltage.

One or more unit transistor structure(s) each being substantially the same as the structure having third semiconductor layer 33, fourth semiconductor layer 34 and first gate electrode layer 38A may be arranged between fourth and fifth semiconductor layers 34 and 35. Thereby, the junction field effect transistor can have further improved characteristics.

Fourth Embodiment (Structure of Lateral Junction Field Effect Transistor 400)

Figure 26:
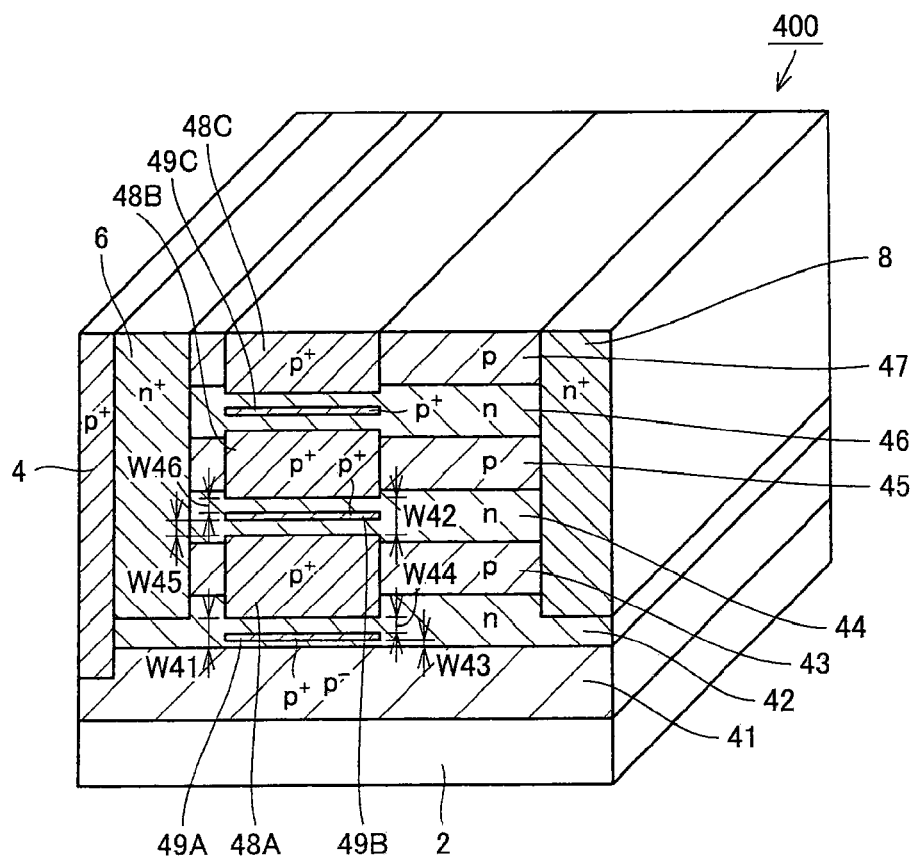
FIG. 26 is a cross section showing a structure of a lateral junction field effect transistor according to a fourth embodiment.

A lateral junction field effect transistor 400 according to a fourth embodiment will now be described with reference to FIG. 26.

Lateral junction field effect transistor 400 according to the fourth embodiment has a structural feature that pn-junctions and gate electrode layers are arranged in a vertical direction, similarly to the lateral junction field effect transistor 100 already described.

Lateral junction field effect transistor 400 includes a first semiconductor layer 41, which is located on semiconductor substrate 2 made of silicon and others, and is doped with p-type impurities, a second semiconductor layer 42, which is located on first semiconductor layer 41, and is doped with n-type impurities more heavily than first semiconductor layer 41, a third semiconductor layer 43 located on second semiconductor layer 42 and doped with p-type impurities, a fourth semiconductor layer 44 located on third semiconductor layer 43 and doped with n-type impurities, a fifth semiconductor layer 45 located on fourth semiconductor layer 44 and doped with p-type impurities, a sixth semiconductor layer 46 located on fifth semiconductor layer 45 and doped with n-type impurities, and a seventh semiconductor layer 47 located on sixth semiconductor layer 46 and doped with p-type impurities.

First semiconductor layer 41 is made of SiC, has a layer thickness from about 3 μm to about 4 μm and is doped with impurities at a concentration of about $1\times10^{16}$ cm$^{-3}$. Each of second, third, fourth, fifth, sixth and seventh semiconductor layers 42, 43, 44, 45, 46 and 47 is made of SiC, has a layer thickness from about 0.5 μm to about 1.0 μm and is doped with impurities at a concentration from about $1\times10^{17}$ cm$^{-3}$ to about $3\times10^{17}$ cm$^{-3}$.

In seventh semiconductor layer 47, source/drain region layers 6 and 8 are arranged with a predetermined space therebetween. Source/drain region layers 6 and 8 have lower surfaces extending on second semiconductor layer 42, and are doped with n-type impurities more heavily than second, fourth and sixth semiconductor layers 42, 44 and 46. The impurity concentrations of source/drain region layers 6 and 8 are substantially in a range from about $1\times10^{19}$ cm$^{-3}$ to about $1\times10^{20}$ cm$^{-3}$.

Between source/drain region layers 6 and 8, a first gate electrode layer 48A is arranged in third semiconductor layer 43. First gate electrode layer 48A has lower and upper surfaces extending on second and fourth semiconductor layers 42 and 44, respectively, and is doped with impurities more heavily than second, fourth and sixth semiconductor layers 42, 44 and 46.

Between source/drain region layers 6 and 8, a second gate electrode layer 48B doped with p-type impurities is arranged in fifth semiconductor layer 45. Second gate electrode layer 48B has lower and upper surfaces extending on fourth and sixth semiconductor layers 44 and 46, respectively has substantially the same impurity concentration as first gate electrode layer 48A, and has the same potential as first gate electrode layer 48A.

Between source/drain region layers 6 and 8, a third gate electrode layer 48C doped with p-type impurities is arranged in seventh semiconductor layer 47. Third gate electrode layer 48C has a lower surface extending on sixth semiconductor layer 46, has substantially the same impurity concentration as first and second gate electrode layers 48A and 48B, and has the same potential as first and second gate electrode layers 48A and 48B. The impurity concentrations of first, second and third gate electrode layers 48A, 48B and 48C are in a range from about $3\times10^{18}$ cm$^{-3}$ to about $1\times10^{20}$ cm$^{-3}$.

A first impurity doped region 49A of the p-type is arranged in second semiconductor layer 42 between first semiconductor layer 41 and first gate electrode layer 48A. First impurity doped region 49A has substantially the same impurity concentration as first gate electrode layer 48A, and has the same potential as first gate electrode layer 48A. Also, a second impurity doped region 49B of the p-type is arranged in fourth semiconductor layer 44 between first and second gate electrode layers 48A and 48B. Second impurity doped region 49B has substantially the same impurity concentration as first gate electrode layer 48A, and has the same potential as first gate electrode layer 48A. A third impurity doped region 49C of the p-type is arranged in sixth semiconductor layer 46 between second and third gate electrode layers 48B and 48C. Third impurity doped region 49C has substantially the same impurity concentration as first and second gate electrode layers 48A and 48B, and has the same potential as first and second gate electrode layers 48A and 48B. Although the structure shown in FIG. 26 is provided with first, second and third impurity doped regions 49A, 49B and 49C each formed of one layer, each of first, second and third impurity doped regions 49A, 49B and 49C may be formed of a plurality of layers for the purpose of achieving the normally-off type of the lateral junction field effect transistor, in which the total channel width is increased and the on-resistance is lowered.

Outside source region layer 6, there is arranged impurity region layer 4, which extends to first semiconductor layer 41, and is doped with p-type impurities at a concentration from about $3\times10^{18}$ cm$^{-3}$ to about $1\times10^{20}$ cm$^{-3}$.

The normally-off type of the lateral junction field effect transistor can be achieved by such a structure that a distance w41 between a top of first semiconductor layer 41 and a bottom of first gate electrode layer 48A is smaller than a distance of a depletion layer extended by a diffused potential in a junction between second semiconductor layer 42 and first gate electrode layer 48A, and a distance w42 between a top of first gate electrode layer 48A and a bottom of second gate electrode layer 48B is smaller than a sum of a distance of a depletion layer extended by a diffused potential in a junction between fourth semiconductor layer 44 and first gate electrode layer 48A and a distance of a depletion layer extended by a diffused potential in a junction between fourth semiconductor layer 44 and second gate electrode layer 48B.

It is further preferable that a distance w43 between a top of first semiconductor layer 41 and a bottom of first impurity doped region 49A is smaller than a distance of a depletion layer extended by a diffused potential in a junction between second semiconductor layer 42 and first impurity doped region 49A, a distance w44 between a top of first impurity doped region 49A and a bottom of first gate electrode layer 48A is smaller than double a distance of a depletion layer extended by a diffused potential in a junction between second semiconductor layer 42 and first gate electrode layer 48A, a distance w45 between a top of first gate electrode layer 48A and a bottom of second impurity doped region 49B is smaller than double a distance of a depletion layer extended by a diffused potential in a junction between fourth semiconductor layer 44 and second impurity doped region 49B, and a distance w46 between a top of second impurity doped region 49B and a bottom of second gate electrode layer 48B is smaller than a distance of a depletion layer extended by a diffused potential in a junction between fourth semiconductor layer 44 and second gate electrode layer 48B.

(Method of Manufacturing Lateral Junction Field Effect Transistor 400)

A method of manufacturing lateral junction field effect transistor 400 having the above structures will now be described with reference to FIGS. 27 to 37.

Figure 27:
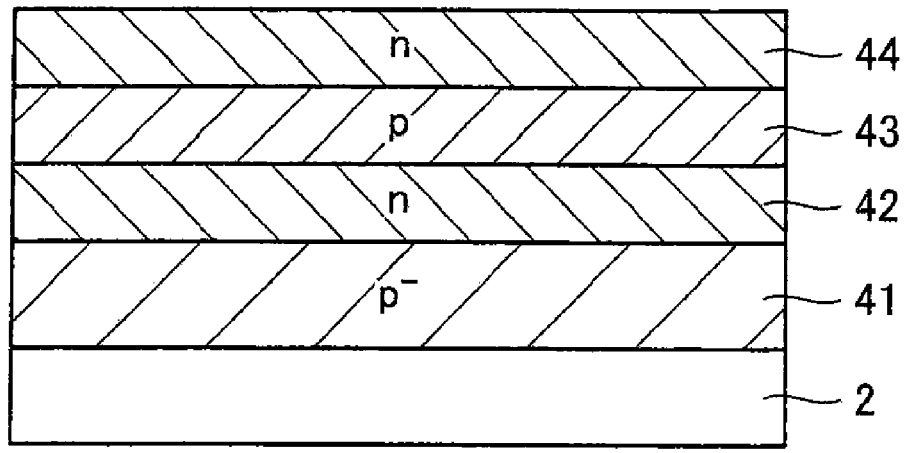
FIG. 27 is cross section showing a first step in a method of manufacturing the lateral junction field effect transistor according to the fourth embodiment.

Referring to FIG. 27, first semiconductor layer 41, which is made of SiC doped with p-type impurities, and has a layer thickness from about 3 μm to about 4 μm and an impurity concentration of about $1\times10^{16}$ cm$^{-3}$, is formed on semiconductor substrate 2 made of silicon and others by epitaxial growth. Thereafter, second semiconductor layer 42, which is made of SiC doped with n-type impurities, and has a layer thickness from about 0.5 μm to about 1.0 μm and an impurity concentration from about $1\times10^{17}$ cm$^{-3}$ to about $3\times10^{17}$ cm$^{-3}$ higher than that of first semiconductor layer 41, is formed on first semiconductor layer 41 by epitaxial growth. Then, third semiconductor layer 43, which is made of SiC doped with p-type impurities, and has a layer thickness from about 0.5 μm to about 1.0 μm and an impurity concentration from about $1\times10^{17}$ cm$^{-3}$ to about $3\times10^{17}$ cm$^{-3}$, is formed on second semiconductor layer 42 by epitaxial growth. Then, fourth semiconductor layer 44, which is made of SiC doped with n-type impurities, and has a layer thickness from about 0.5 μm to about 1.0 μm and an impurity concentration from about $1\times10^{17}$ cm$^{-3}$ to about $3\times10^{17}$ cm$^{-3}$, is formed on third semiconductor layer 43 by epitaxial growth.

Figure 28:
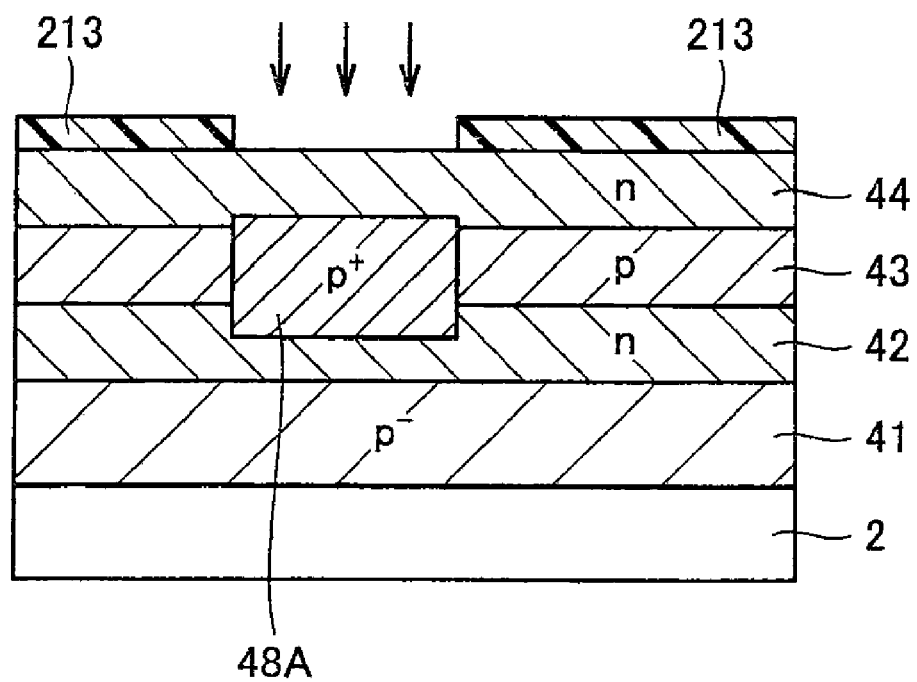
FIG. 28 is cross section showing a second step in a method of manufacturing the lateral junction field effect transistor according to the fourth embodiment.

Referring to FIG. 28, an oxide film 213 having a predetermined opening pattern is formed on fourth semiconductor layer 44. Using oxide film 213 as a mask, p-type impurities are implanted into a predetermined region of fourth semiconductor layer 44 to form first gate electrode layer 48A, which has lower and upper surfaces extending on second and fourth semiconductor layers 42 and 44, respectively, and is doped with p-type impurities at a concentration from about $3\times10^{18}$ cm$^{-3}$ to about $1\times10^{20}$ cm$^{-3}$ higher than that of second and fourth semiconductor layers 42 and 44.

Figure 29:
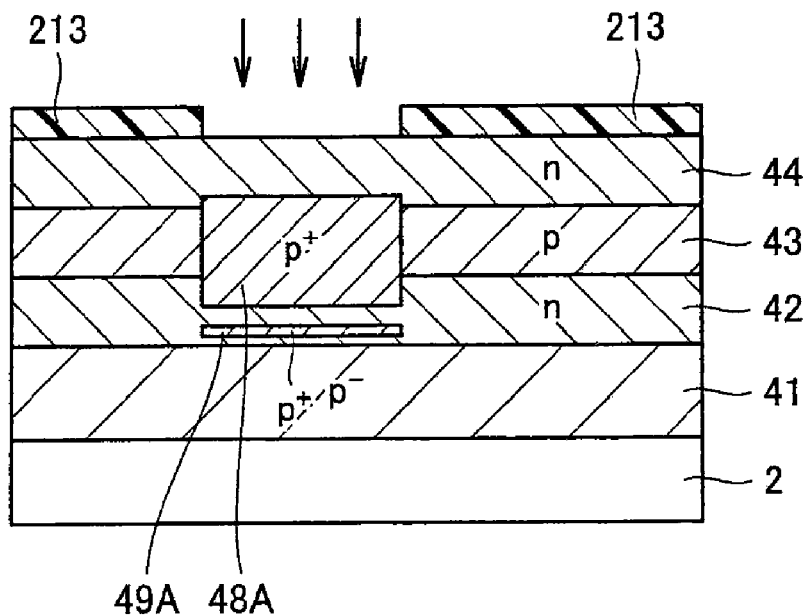
FIG. 29 is cross section showing a third step in a method of manufacturing the lateral junction field effect transistor according to the fourth embodiment.

Referring to FIG. 29, oxide film 213 is still used as a mask, and p-type impurities are implanted into second semiconductor layer 42 to form first impurity doped region 49A, which has substantially the same impurity concentration as first gate electrode layer 48A, i.e., an impurity concentration from about $3\times10^{18}$ cm$^{-3}$ to about $1\times10^{20}$ cm$^{-3}$, and has the same potential as first gate electrode layer 48A.

Figure 30:
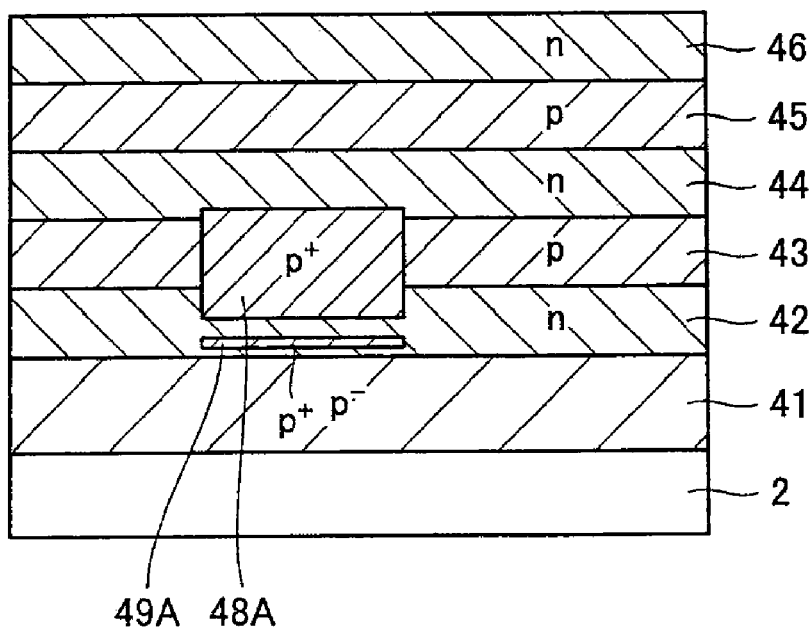
FIG. 30 is cross section showing a fourth step in a method of manufacturing the lateral junction field effect transistor according to the fourth embodiment.

Referring to FIG. 30, oxide film 213 is removed, and then fifth semiconductor layer 45, which is made of SiC doped with p-type impurities, and has a thickness from about 0.5 μm to about 1.0 μm and an impurity concentration from about $1\times10^{17}$ cm$^{-3}$ to about $3\times10^{17}$ cm$^{-3}$, is formed on fourth semiconductor layer 44. Then, sixth semiconductor layer 46, which is made of SiC doped with n-type impurities, and has a thickness from about 0.5 μm to about 1.0 μm and an impurity concentration from about $1\times10^{17}$ cm$^{-3}$ to about $3\times10^{17}$ cm$^{-3}$, is formed on fifth semiconductor layer 45.

Figure 31:
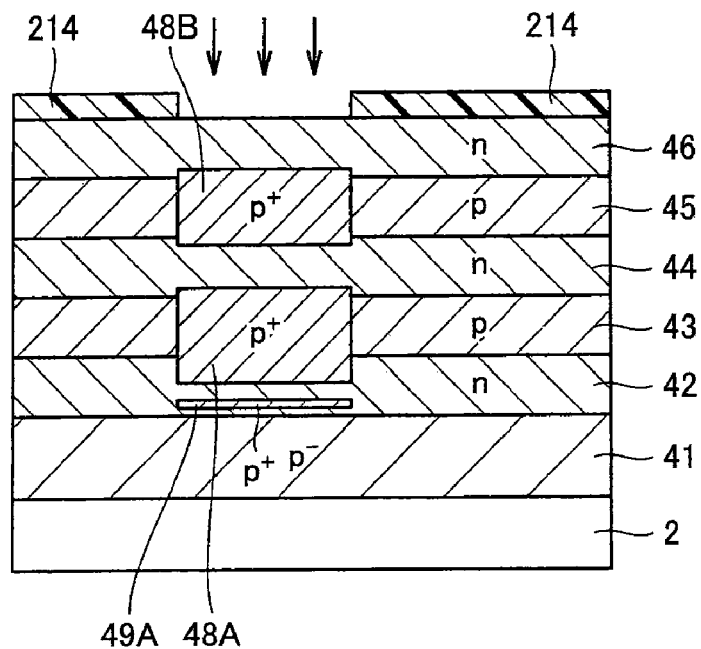
FIG. 31 is cross section showing a fifth step in a method of manufacturing the lateral junction field effect transistor according to the fourth embodiment.

Referring to FIG. 31, an oxide film 214 having a predetermined opening pattern is formed on sixth semiconductor layer 46, and p-type impurities are implanted into a predetermined region of sixth semiconductor layer 46 masked with oxide film 214 to form second gate electrode layer 48B, which has lower and upper surfaces extending on fourth and sixth semiconductor layers 44 and 46, respectively, and contains p-type impurities at a concentration from about $3\times10^{18}$ cm$^{-3}$ to about $1\times10^{20}$ cm$^{-3}$ higher than those of fourth and sixth semiconductor layers 44 and 46.

Figure 32:
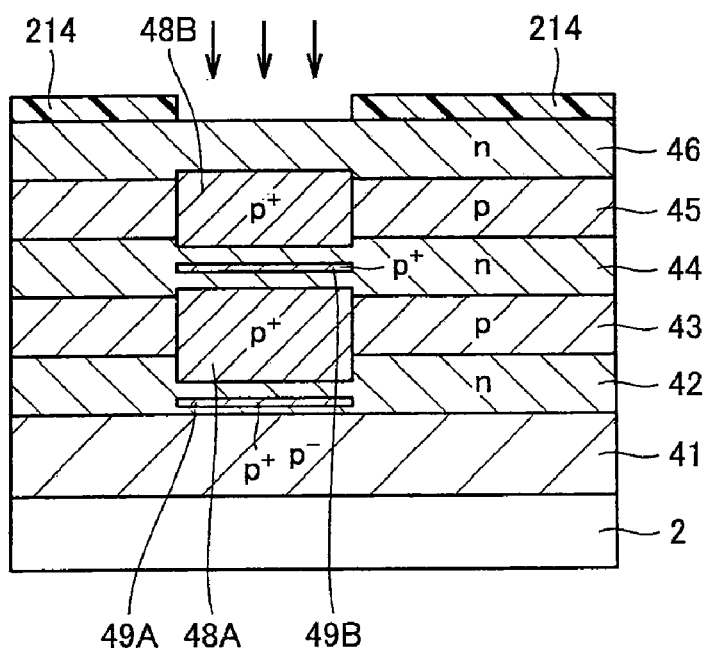
FIG. 32 is cross section showing a sixth step in a method of manufacturing the lateral junction field effect transistor according to the fourth embodiment.

Referring to FIG. 32, oxide film 214 is still used as a mask, and p-type impurities are implanted into fourth semiconductor layer 44 to form second impurity doped region 49B, which has substantially the same impurity concentration as first gate electrode layer 48A, i.e., the impurity concentration from about $3\times10^{18}$ cm$^{-3}$ to about $1\times10^{20}$ cm$^{-3}$, and has the same potential as first gate electrode layer 48A.

Figure 33:
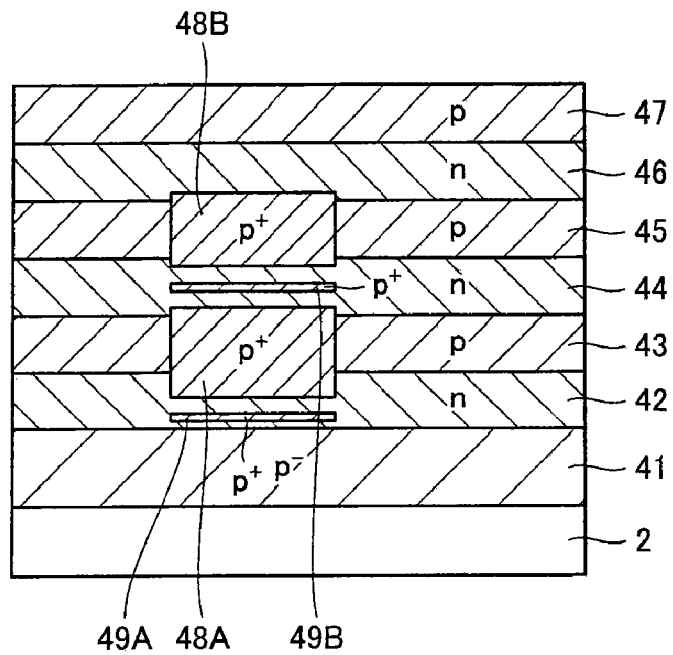
FIG. 33 is cross section showing a seventh step in a method of manufacturing the lateral junction field effect transistor according to the fourth embodiment.

Referring to FIG. 33, oxide film 214 is removed, and seventh semiconductor layer 47, which is made of SiC doped with p-type impurities, and has a thickness from about 0.5 μm to about 1.0 μm and an impurity concentration from about $1\times10^{17}$ cm$^{-3}$ to about $3\times10^{17}$ cm$^{-3}$, is formed on sixth semiconductor layer 46 by epitaxial growth.

Figure 34:
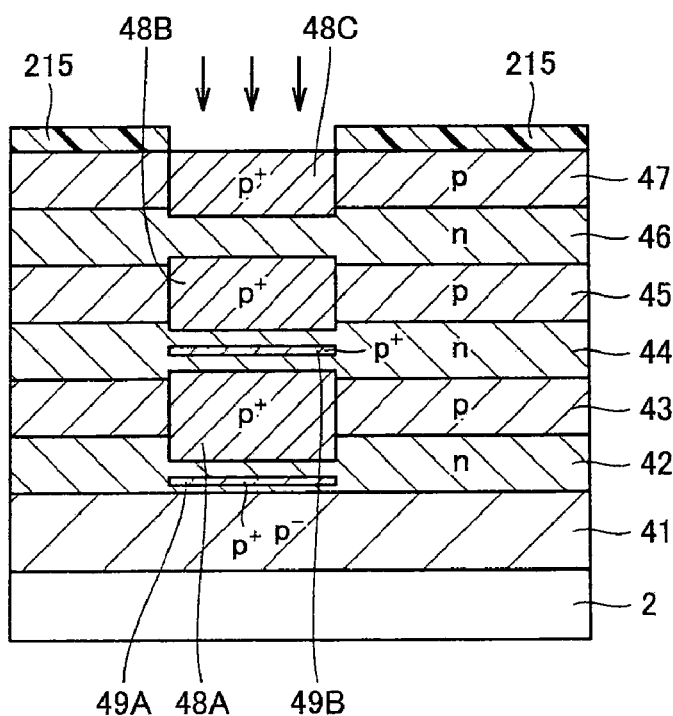
FIG. 34 is cross section showing an eighth step in a method of manufacturing the lateral junction field effect transistor according to the fourth embodiment.

Referring to FIG. 34, an oxide film 215 having a predetermined opening pattern is formed on seventh semiconductor layer 47, and p-type impurities are implanted into a predetermined region of seventh semiconductor layer 47 masked with oxide film 215 to form third gate electrode layer 48C, which has a lower surface extending on sixth semiconductor layer 46, and contains p-type impurities at a concentration from about $3\times10^{18}$ cm$^{-3}$ to about $1\times10^{20}$ cm$^{-3}$ higher than that of sixth semiconductor layer 46.

Figure 35:
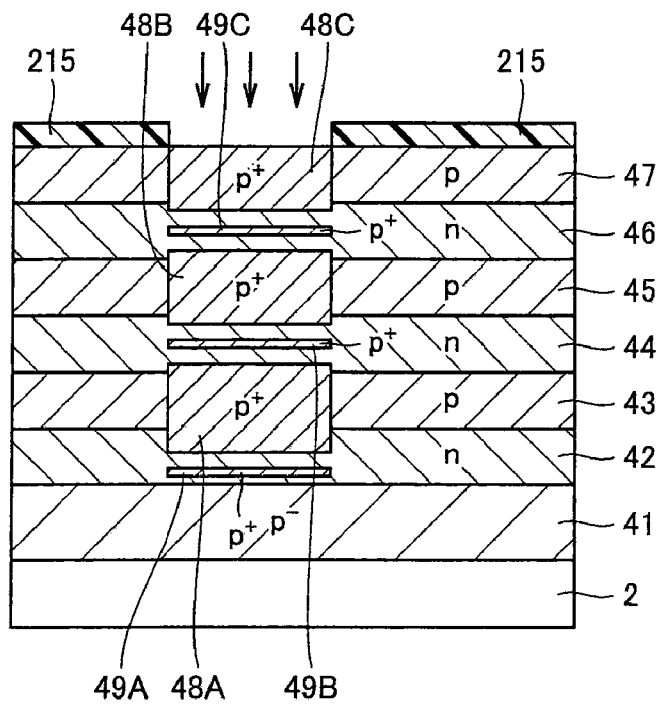
FIG. 35 is cross section showing a ninth step in a method of manufacturing the lateral junction field effect transistor according to the fourth embodiment.

Referring to FIG. 35, oxide film 215 is still used as a mask, and p-type impurities are implanted into sixth semiconductor layer 46 to form third impurity doped region 49C, which has substantially the same impurity concentration as first gate electrode layer 48A, i.e. the impurity concentration from about $3\times10^{18}$ cm$^{-3}$ to about $1\times10^{20}$ cm$^{-3}$, and has the same potential as first gate electrode layer 48A.

Figure 36:
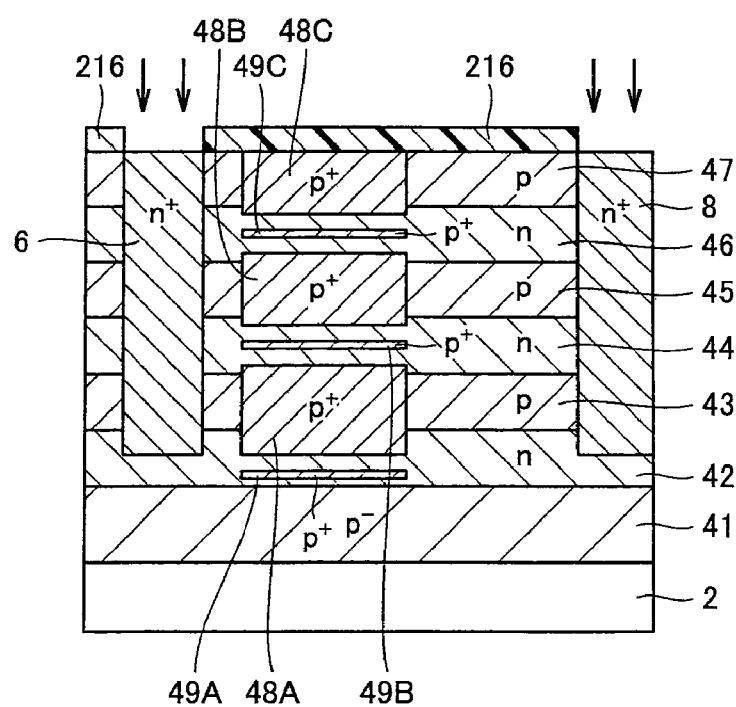
FIG. 36 is cross section showing a tenth step in a method of manufacturing the lateral junction field effect transistor according to the fourth embodiment.

Referring to FIG. 36, oxide film 215 is removed, and an oxide film 216 having a predetermined opening pattern is formed on seventh semiconductor layer 47. Then, impurities are implanted into seventh semiconductor layer 47 masked with oxide film 216, and more specifically into portions on the opposite sides of first, second and third gate electrode layers 48A, 48B and 48C as well as first, second and third impurity doped regions 49A, 49B and 49C to form source/drain region layers 6 and 8, which have lower surfaces extending on second semiconductor layer 42, and are doped with n-type impurities at a concentration from about $1\times10^{19}$ cm$^{-3}$ to about $1\times10^{20}$ cm$^{-3}$ higher than those of second and fourth semiconductor layers 42 and 44.

Figure 37:
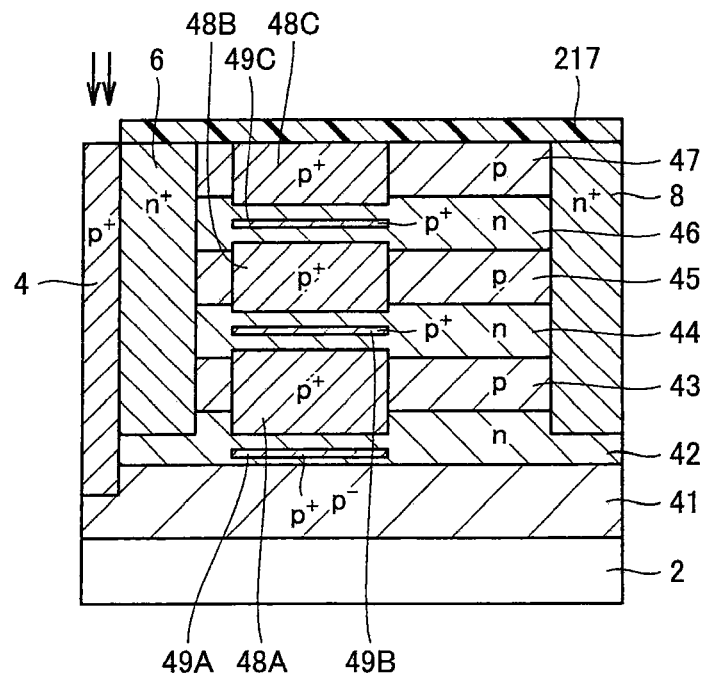
FIG. 37 is cross section showing an eleventh step in a method of manufacturing the lateral junction field effect transistor according to the fourth embodiment.

Referring to FIG. 37, oxide film 216 is removed, and then an oxide film 217 having a predetermined opening pattern is formed on seventh semiconductor layer 47. Then, impurities are implanted into seventh semiconductor layer 47 masked with oxide film 217, and more specifically into a portion outside source/drain region layer 6 to form impurity region layer 4, which has the lower surface extending on first semiconductor layer 41, and contains p-type impurities at a concentration from about $3\times10^{18}$ cm$^{-3}$ to about $1\times10^{20}$ cm$^{-3}$. Although not shown, the structure is then processed in various steps of surface thermal oxidation, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 400 of the fourth embodiment shown in FIG. 26 is completed.

In the first to fourth embodiments described above, ion implantation must be performed several times for forming an inter-gate connection region layer (not shown), if it has a large depth. In this case, the impurity implantation for forming the inter-gate connection region layer is performed even in the ion implantation stages for forming the gate electrode layers and the impurity doped regions.

The inter-gate connection region layer is provided for electrically connecting the plurality of gate electrode layers and impurity doped regions to equalize the potential thereof, and is formed of a connection layer, which is located, e.g., at an end of a device, and extends vertically through the gate electrode layers and the impurity doped regions. In general, the connection layer does not reach the first semiconductor layer.

(Operation and Effect)

According to the lateral junction field effect transistor having the above structure as well as the method of manufacturing the same, since the plurality of lateral junction field effect transistors are stacked in the vertical direction, the on-resistance of the element can be reduced, as compared with conventional structures. Further, the second, third, fourth, fifth, sixth and seventh semiconductor layers 42, 43, 44, 45, 46 and 47 may have substantially the same impurity concentration and the same layer thickness so that the lateral junction field effect transistors can have the minimum on-resistance and the maximum breakdown voltage.

One or more unit transistor structure(s) each being substantially the same as the structure having third semiconductor layer 43, fourth semiconductor layer 44, first gate electrode layer 48A and second impurity doped region 49B may be arranged between fourth and fifth semiconductor layers 44 and 45. Thereby, the junction field effect transistor can have further improved characteristics.

Fifth Embodiment (Structure of Lateral Junction Field Effect Transistor 500)

Figure 38:
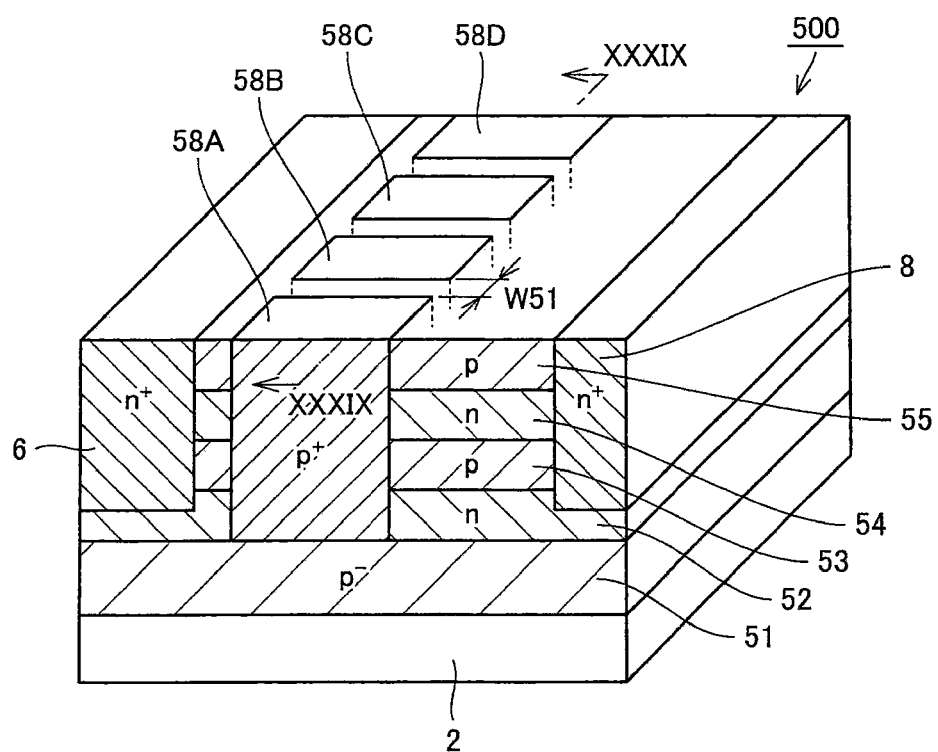
FIG. 38 is a cross section showing a structure of a lateral junction field effect transistor according to a fifth embodiment.
Figure 39:
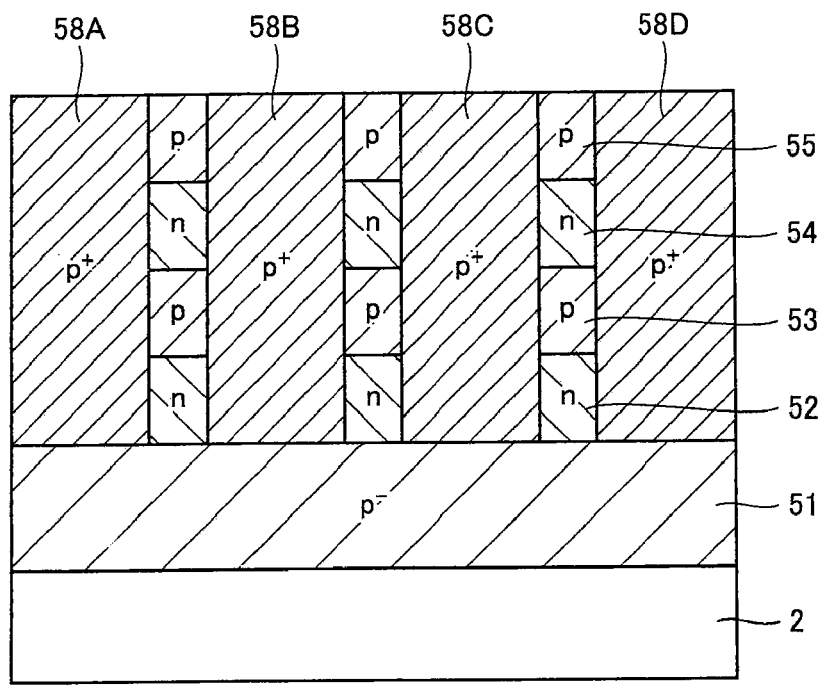
FIG. 39 is a cross section taken along line XXXXIX-XXXXIX in FIG. 38.
Figure 40:
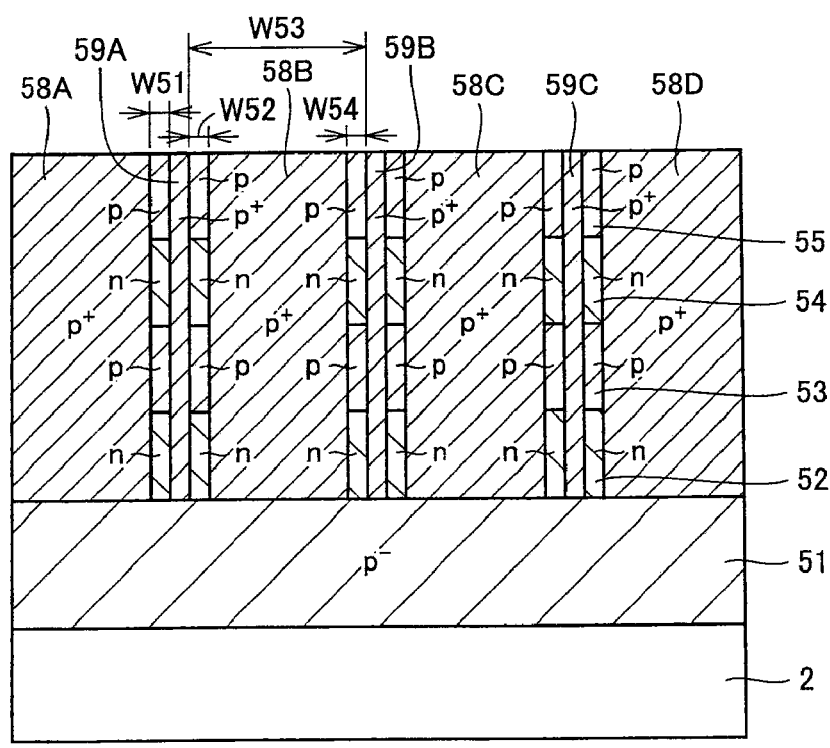
FIG. 40 is a cross section showing another structure and taken along line corresponding to line XXXXIX-XXXXIX in FIG. 38.

A lateral junction field effect transistor 500 according to a fifth embodiment will now be described with reference to FIGS. 38 to 40.

Lateral junction field effect transistor 500 according to the fifth embodiment has a structural feature that pn-junctions are arranged in a vertical direction, and gate electrode layers are arranged in a lateral direction.

Lateral junction field effect transistor 500 includes a first semiconductor layer 51, which is located on semiconductor substrate 2 made of silicon and others, and is doped with p-type impurities, a second semiconductor layer 52, which is located on first semiconductor layer 51, and is doped with n-type impurities more heavily than first semiconductor layer 51, a third semiconductor layer 53 located on second semiconductor layer 52 and doped with p-type impurities, a fourth semiconductor layer 54 located on third semiconductor layer 53 and doped with n-type impurities, and a fifth semiconductor layer 55 located on fourth semiconductor layer 54 and doped with p-type impurities.

First semiconductor layer 51 is made of SiC, has a layer thickness from about 3 µm to about 4 µm and is doped with impurities at a concentration of about $1\times10^{16}$ cm$^{-3}$. Each of second, third, fourth and fifth semiconductor layers 52, 53, 54 and 55 is made of SiC, has a layer thickness from about 0.5 µm to about 1.0 µm and is doped with impurities at a concentration from about $1\times10^{17}$ cm$^{-3}$ to about $3\times10^{17}$ cm$^{-3}$.

In fifth semiconductor layer 55, source/drain region layers 6 and 8 are arranged with a predetermined space therebetween. Source/drain region layers 6 and 8 have lower surfaces extending on second semiconductor layer 52, and are doped with n-type impurities more heavily than second and fourth semiconductor layers 52 and 54. The impurity concentrations of source/drain region layers 6 and 8 are substantially in a range from about $1\times10^{19}$ cm$^{-3}$ to about $1\times10^{20}$ cm$^{-3}$.

Between source/drain region layers 6 and 8, a first gate electrode layer 58A is arranged in fifth semiconductor layer 55. First gate electrode layer 58A has a lower surface extending on second semiconductor layer 52, and is doped with p-type impurities more heavily than second semiconductor layer 52.

Between source/drain region layers 6 and 8, a second gate electrode layer 58B doped with p-type impurities is arranged in fifth semiconductor layer 55. Second gate electrode layer 58B has a lower surface extending on second semiconductor layer 52, extends in the lateral direction, neighbors to first gate electrode layer 58A with a predetermined space therebetween, has substantially the same impurity concentration as first gate electrode layer 58A, and has the same potential as first gate electrode layer 58A.

Between source/drain region layers 6 and 8, a third gate electrode layer 58C doped with p-type impurities is arranged in fifth semiconductor layer 55. Third gate electrode layer 58C has a lower surface extending on second semiconductor layer 52, extends in the lateral direction, neighbors to second gate electrode layer 58B with a predetermined space therebetween, has substantially the same impurity concentration as first and second gate electrode layers 58A and 58B, and has the same potential as first and second gate electrode layers 58A and 58B.

Between source/drain region layers 6 and 8, a fourth gate electrode layer 58D doped with p-type impurities is arranged in fifth semiconductor layer 55. Fourth gate electrode layer 58D has a lower surface extending on second semiconductor layer 52, extends in the lateral direction, neighbors to third gate electrode layer 58C with a predetermined space therebetween, has substantially the same impurity concentration as first, second and third gate electrode layers 58A, 58B and 58C, and has the same potential as first, second and third gate electrode layers 58A, 58B and 58C.

The impurity concentrations of first, second, third and fourth gate electrode layers 58A, 58B, 58C and 58D are in a range from about $3 \times 10^{18}$ cm$^{-3}$ to about $1 \times 10^{20}$ cm$^{-3}$.

The normally-off type of the lateral junction field effect transistor can be achieved by such a structure that a distance w51 between first and second gate electrode layers 58A and 58B is smaller than a distance of a depletion layer extended by a diffused potential in a junction between second semiconductor layer 52 and first gate electrode layer 58A, and is smaller than double a distance of a depletion layer extended by a diffused potential in a junction between fourth semiconductor layer 54 and first gate electrode layer 58A. The same is true with respect to a distance between second and third gate electrode layers 58B and 58C as well as a distance between third and fourth gate electrode layers 58C and 58D.

(Method of Manufacturing Lateral Junction Field Effect Transistor 500)

A method of manufacturing lateral junction field effect transistor 500 having the above structures will now be described with reference to FIGS. 41 to 43.

Figure 41:
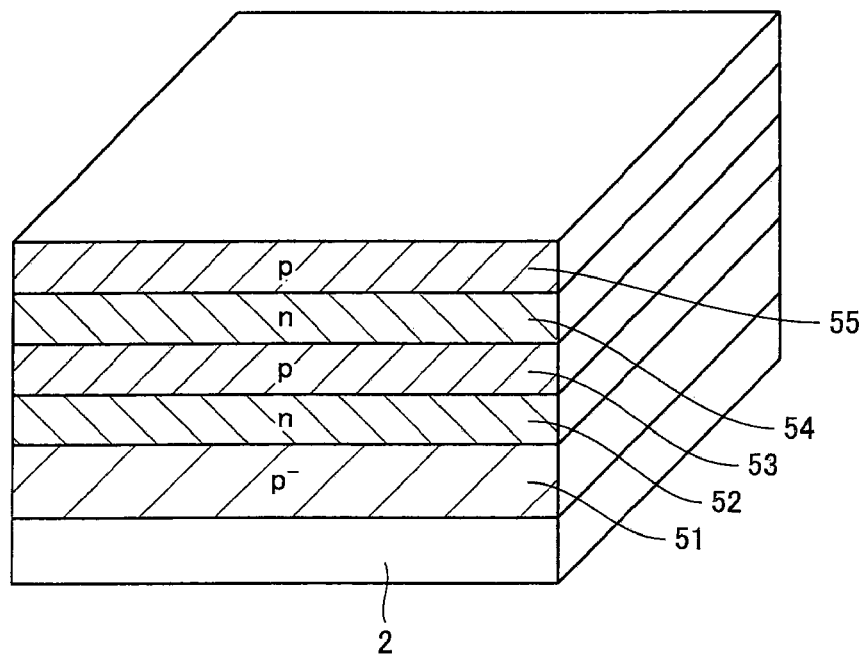
FIG. 41 is cross section showing a first step in a method of manufacturing the lateral junction field effect transistor according to the fifth embodiment.

Referring to FIG. 41, first semiconductor layer 51, which is made of SiC doped with p-type impurities, and has a layer thickness from about 3 μm to about 4 μm and an impurity concentration of about $1 \times 10^{16}$ cm$^{-3}$, is formed on semiconductor substrate 2 made of silicon and others by epitaxial growth. Thereafter, second semiconductor layer 52, which is made of SiC doped with n-type impurities, and has a layer thickness from about 0.5 μm to about 1.0 μm and an impurity concentration from about $1 \times 10^{17}$ cm$^{-3}$ to about $3 \times 10^{17}$ cm$^{-3}$ higher than that of first semiconductor layer 51, is formed on first semiconductor layer 51 by epitaxial growth. Then, third semiconductor layer 53, which is made of SiC doped with p-type impurities, and has a layer thickness from about 0.5 μm to about 1.0 μm and an impurity concentration from about $1 \times 10^{17}$ cm$^{-3}$ to about $3 \times 10^{17}$ cm$^{-3}$, is formed on second semiconductor layer 52 by epitaxial growth. Then, fourth semiconductor layer 54, which is made of SiC doped with n-type impurities, and has a layer thickness from about 0.5 μm to about 1.0 μm and an impurity concentration from about $1 \times 10^{17}$ cm$^{-3}$ to about $3 \times 10^{17}$ cm$^{-3}$, is formed on third semiconductor layer 53 by epitaxial growth. Then, fifth semiconductor layer 55, which is made of SiC doped with n-type impurities, and has a layer thickness from about 0.5 μm to about 1.0 μm and an impurity concentration from about $1 \times 10^{17}$ cm$^{-3}$ to about $3 \times 10^{17}$ cm$^{-3}$, is formed on fourth semiconductor layer 54 by epitaxial growth.

Figure 42:
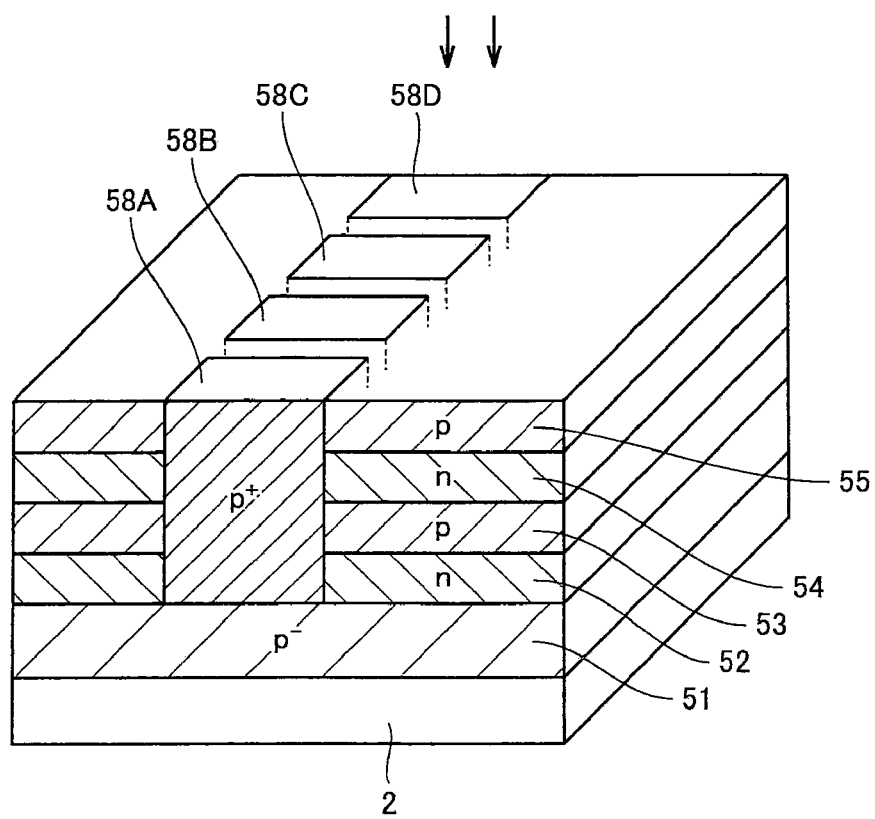
FIG. 42 is cross section showing a second step in a method of manufacturing the lateral junction field effect transistor according to the fifth embodiment.

Referring to FIG. 42, an oxide film (not shown) having a predetermined opening pattern is formed on fifth semiconductor layer 55. Using this oxide film as a mask, impurities are implanted into predetermined regions of fifth semiconductor layer 55 to form first, second, third and fourth gate electrode layers 58A, 58B, 58C and 58D, which have lower surfaces extending on second semiconductor layer 52, are doped with p-type impurities at a concentration from about $3 \times 10^{18}$ cm$^{-3}$ to about $1 \times 10^{20}$ cm$^{-3}$ higher than that of second semiconductor layer 52, and extend in a direction of the plane of substrate 2 with a predetermined space therebetween.

Figure 43:
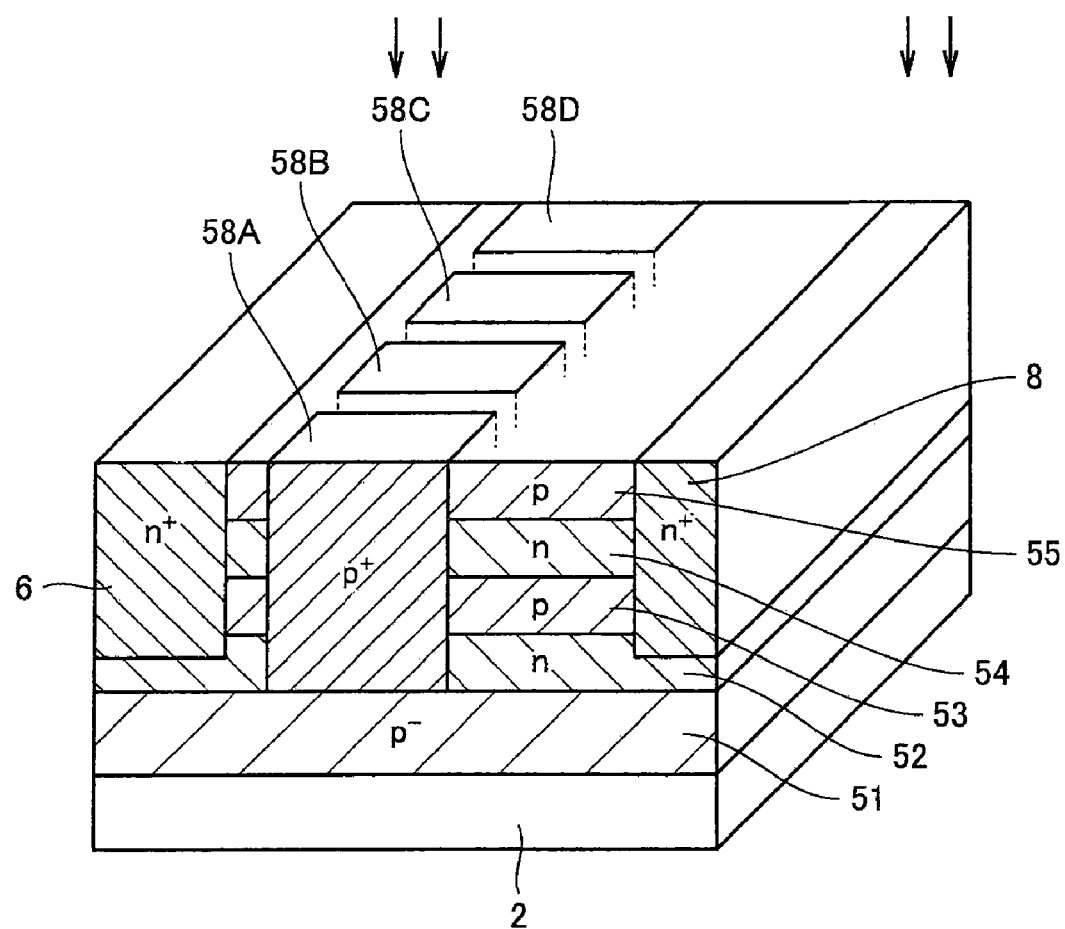
FIG. 43 is cross section showing a third step in a method of manufacturing the lateral junction field effect transistor according to the fifth embodiment.

Referring to FIG. 43, an oxide film (not shown) having a predetermined opening pattern is formed on fifth semiconductor layer 55, and impurities are implanted into predetermined regions of fifth semiconductor layer 55 masked with the oxide film to form source/drain region layers 6 and 8, which extend in a direction of arrangement of first to fourth gate electrode layers 58A, 58B, 58C and 58D, and are located on the opposite sides of first to fourth gate electrode layers 58A, 58B, 58C and 58D. Source/drain region layers 6 and 8 have lower surfaces extending on second semiconductor layer 52, and are doped with n-type impurities at a concentration from about $1 \times 10^{19}$ cm$^{-3}$ to about $1 \times 10^{20}$ cm$^{-3}$ higher than those of second and fourth semiconductor layers 52 and 54. Although not shown, the structure is then processed in various steps of surface thermal oxidization, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 500 of the fifth embodiment shown in FIG. 38 is completed.

In the first to fifth embodiments described above, if the gate electrode layers and/or the impurity doped regions are thick, it may be required to perform the impurity implantation several times for forming each layer or region. In this case, such a manner may be employed that the impurities are implanted after interrupting the preceding step, i.e., epitaxial growth of the n- or p-layer, and then the epitaxial growth is resumed.

It may be required to perform the implantation several times for forming the source/drain region layers, if these layers are thick. In this case, the impurity implantation for forming the source/drain region layers and the impurity doped regions may be performed even in the ion implantation stages for forming the gate electrode layers and the impurity doped regions.

(Operation and Effect)

According to the lateral junction field effect transistor having the above structure as well as the method of manufacturing the same, since the plurality of the lateral junction field effect transistors are arranged in the vertical direction, and the gate electrode layers are arranged in the lateral direction, the on-resistance of the element can be reduced, as compared with conventional structures. Further, the second, third, fourth and fifth semiconductor layers 52, 53, 54 and 55 may have substantially the same impurity concentration and the same layer thickness so that the lateral junction field effect transistors can have the minimum on-resistance and the maximum breakdown voltage.

For further lowering the on-resistance and increasing the number of channels, the following structure may be employed. Referring to FIG. 40, an impurity doped region 59A of the p-type is arranged between first and second gate electrode layers 58A and 58B. Impurity doped region 59A has a lower surface extending on second semiconductor layer 52, has substantially the same impurity concentration as first gate electrode layer 58A, and has the same potential as first gate electrode layer 58A. Likewise, an impurity doped region 59B of the p-type is arranged between second and third gate electrode layers 58B and 58C. Impurity doped region 59B has a lower surface extending on second semiconductor layer 52, has substantially the same impurity concentration as first gate electrode layer 58A, and has the same potential as first gate electrode layer 58A. An impurity doped region 59C of the p-type is arranged between third and fourth gate electrode layers 58C and 58D. Impurity doped region 59C has a lower surface extending on second semiconductor layer 52, has substantially the same impurity concentration as first gate electrode layer 58A, and has the same potential as first gate electrode layer 58A.

The normally-off type of the lateral junction field effect transistor can be achieved by the following structure. Referring to FIG. 40, a distance w51 between first gate electrode layer 58A and impurity doped region 59A as well as a distance w52 between impurity doped region 59A and second gate electrode layer 58B are smaller than a distance of a depletion layer extended by a diffused potential in a junction between second semiconductor layer 52 and first gate electrode layer 58A, and double a distance of a depletion layer extended by a diffused potential in a junction between fourth semiconductor layer 54 and first gate electrode layer 58A.

It is further preferable that each of distances w51, w53 and w54, i.e., distance w51 between first gate electrode layer 58A and impurity doped region 59A nearest to first gate electrode layer 58A, distance w53 between impurity doped regions, and a distance w54 between second gate electrode layer 58B and impurity doped region 59B nearest to second gate electrode layer 58B are smaller than a distance of a depletion layer extended by a diffused potential in a junction between second semiconductor layer 52 and first gate electrode layer 58A as well as double a distance of a depletion layer extended by a diffused potential in a junction between fourth semiconductor layer 54 and first gate electrode layer 58A.

The numbers of the gate electrode layers and the impurity doped regions can be appropriately changed depending on the required performance of the lateral JFET.

One or more structure(s) each being substantially the same as the structure having third semiconductor layer 53 and fourth semiconductor layer 54 may be arranged between fourth and fifth semiconductor layers 54 and 55. Thereby, the junction field effect transistor can have further improved characteristics.

Sixth Embodiment (Structure of Lateral Junction Field Effect Transistor 600)

Figure 44:
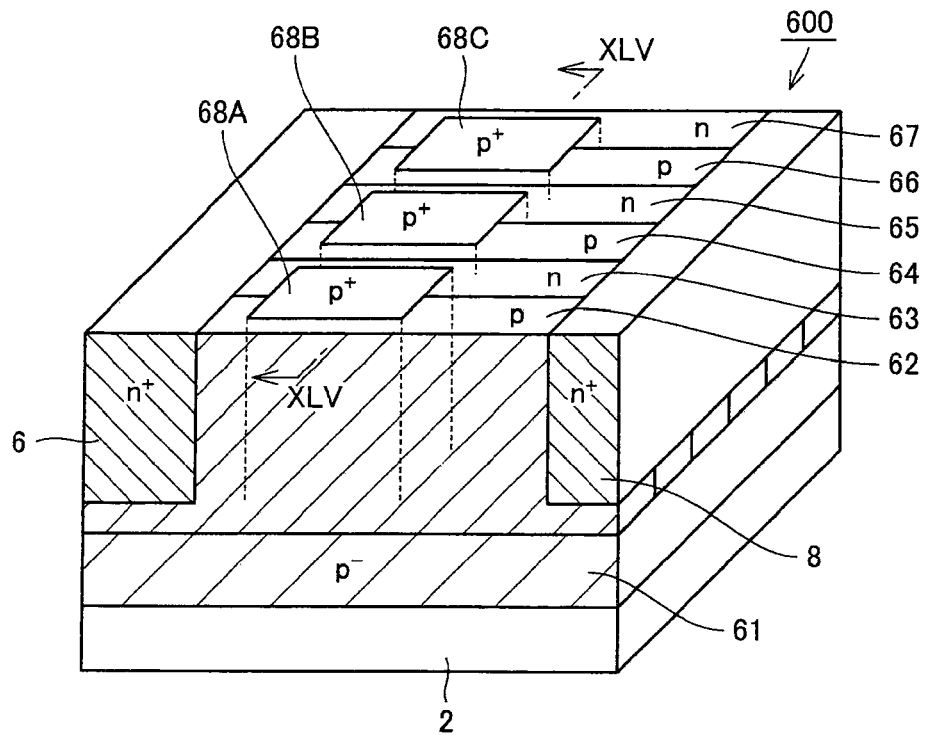
FIG. 44 is a cross section showing a structure of a lateral junction field effect transistor according to a sixth embodiment.
Figure 45:
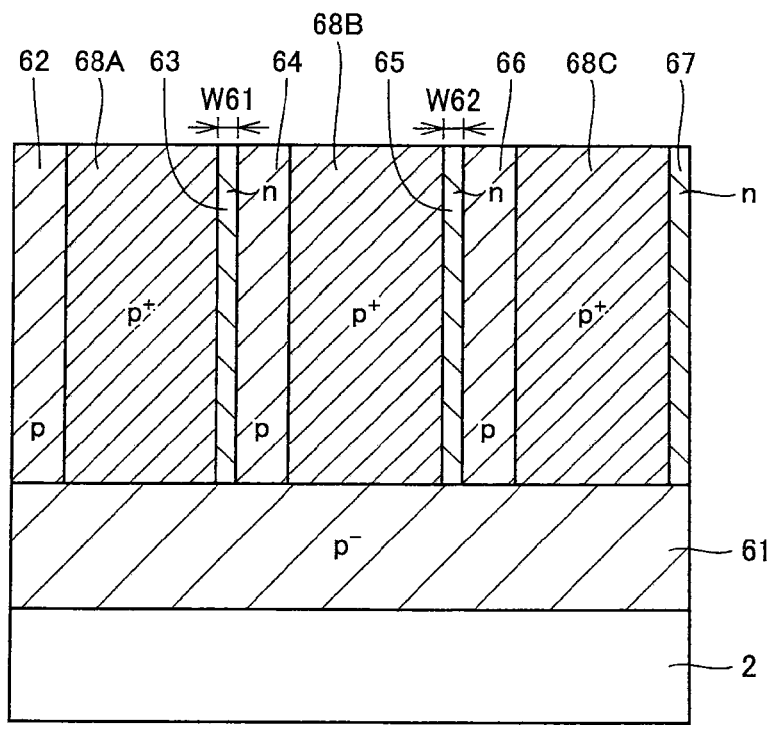
FIG. 45 is a cross section taken along line XLV-XLV in FIG. 44.

A lateral junction field effect transistor 600 according to a sixth embodiment will now be described with reference to FIGS. 44 and 45.

Lateral junction field effect transistor 600 according to the sixth embodiment has a structural feature that pn-junctions and gate electrode layers are arranged in a lateral direction.

Lateral junction field effect transistor 600 includes a first semiconductor layer 61, which is located on semiconductor substrate 2 made of silicon and others, and is doped with p-type impurities, a second semiconductor layer 62, which is located on first semiconductor layer 61, and is doped with p-type impurities, a third semiconductor layer 63, which is located on first semiconductor layer 61, laterally neighbors to second semiconductor layer 62 and is doped with n-type impurities, a fourth semiconductor layer 64, which is located on first semiconductor layer 61, laterally neighbors to third semiconductor layer 63 and is doped with p-type impurities, a fifth semiconductor layer 65, which is located on first semiconductor layer 61, laterally neighbors to fourth semiconductor layer 64 and is doped with n-type impurities, a sixth semiconductor layer 66, which is located on first semiconductor layer 61, laterally neighbors to fifth semiconductor layer 65 and is doped with p-type impurities, and a seventh semiconductor layer 67, which is located on first semiconductor layer 61, laterally neighbors to sixth semiconductor layer 66 and is doped with n-type impurities.

First semiconductor layer 61 is made of SiC, has a layer thickness from about 3 μm to about 4 μm and is doped with impurities at a concentration of about $1 \times 10^{16}$ cm$^{-3}$. Each of second, third, fourth, fifth, sixth and seventh semiconductor layers 62, 63, 64, 65, 66 and 67 is made of SiC, has a layer thickness from about 0.5 μm to about 1.0 μm and is doped with impurities at a concentration from about $1 \times 10^{17}$ cm$^{-3}$ to about $3 \times 10^{17}$ cm$^{-3}$. The layer thicknesses of second to seventh semiconductor layers 62, 63, 64, 65, 66 and 67 are sizes determined in a direction perpendicular to a hatched section shown in FIG. 44.

In second to seventh semiconductor layers 62, 63, 64, 65, 66 and 67, source/drain region layers 6 and 8 are arranged with a predetermined space therebetween. Source/drain region layers 6 and 8 are doped with n-type impurities more heavily than third, fifth and seventh semiconductor layers 63, 65 and 67. The impurity concentrations of source/drain region layers 6 and 8 are substantially in a range from about $1 \times 10^{19}$ cm$^{-3}$ to about $1 \times 10^{20}$ cm$^{-3}$.

Between source/drain region layers 6 and 8, a first gate electrode layer 68A is arranged in second semiconductor layer 62. First gate electrode layer 68A has one side surface extending in third semiconductor layer 63, and is doped with p-type impurities more heavily than third semiconductor layer 63.

Between source/drain region layers 6 and 8, a second gate electrode layer 68B doped with p-type impurities is arranged in fourth semiconductor layer 64. Second gate electrode layer 68B has one side surface extending in fifth semiconductor layer 65, has substantially the same impurity concentration as first gate electrode layer 68A, and has the same potential as first gate electrode layer 68A.

Between source/drain region layers 6 and 8, a third gate electrode layer 68C doped with p-type impurities is arranged in sixth semiconductor layer 66. Third gate electrode layer 68C has one side surface extending in seventh semiconductor layer 67, has substantially the same impurity concentration as first gate electrode layer 68A, and has the same potential as first gate electrode layer 68A.

The impurity concentrations of first, second and third gate electrode layers 68A, 68B and 68C are in a range from about $3 \times 10^{18}$ cm$^{-3}$ to about $1 \times 10^{20}$ cm$^{-3}$.

The normally-off type of the lateral junction field effect transistor can be achieved by such a structure that a distance w61 between first gate electrode layer 68A and a surface of third semiconductor layer 63 spaced from first gate electrode layer 68A is smaller than a distance of a depletion layer extended by a diffused potential in a junction between third semiconductor layer 63 and first gate electrode layer 68A, and a distance w62 between second gate electrode layer 68B and a surface of fifth semiconductor layer 65 spaced from second gate electrode layer 68B is smaller than a distance of a depletion layer extended by a diffused potential in a junction between fifth semiconductor layer 65 and second gate electrode layer 68B.

(Method of Manufacturing Lateral Junction Field Effect Transistor 600)

A method of manufacturing lateral junction field effect transistor 600 having the above structures will now be described with reference to FIGS. 46 to 50.

Figure 46:
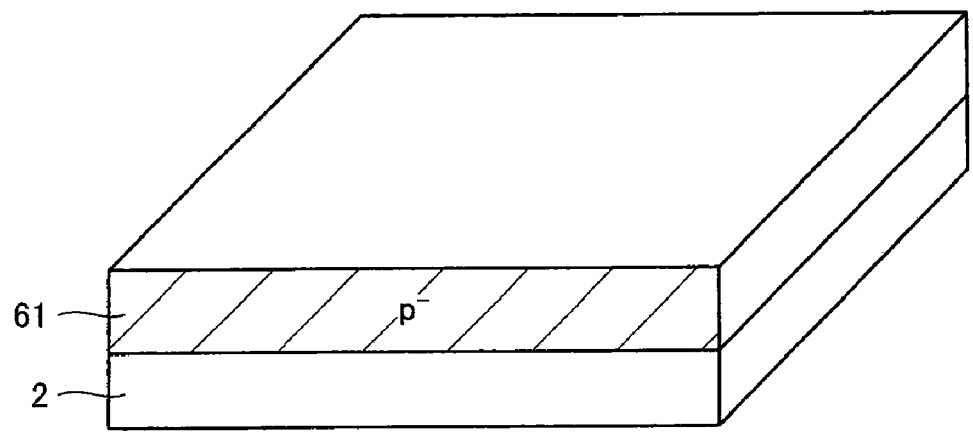
FIG. 46 is cross section showing a first step in a method of manufacturing the lateral junction field effect transistor according to the sixth embodiment.
Figure 47:
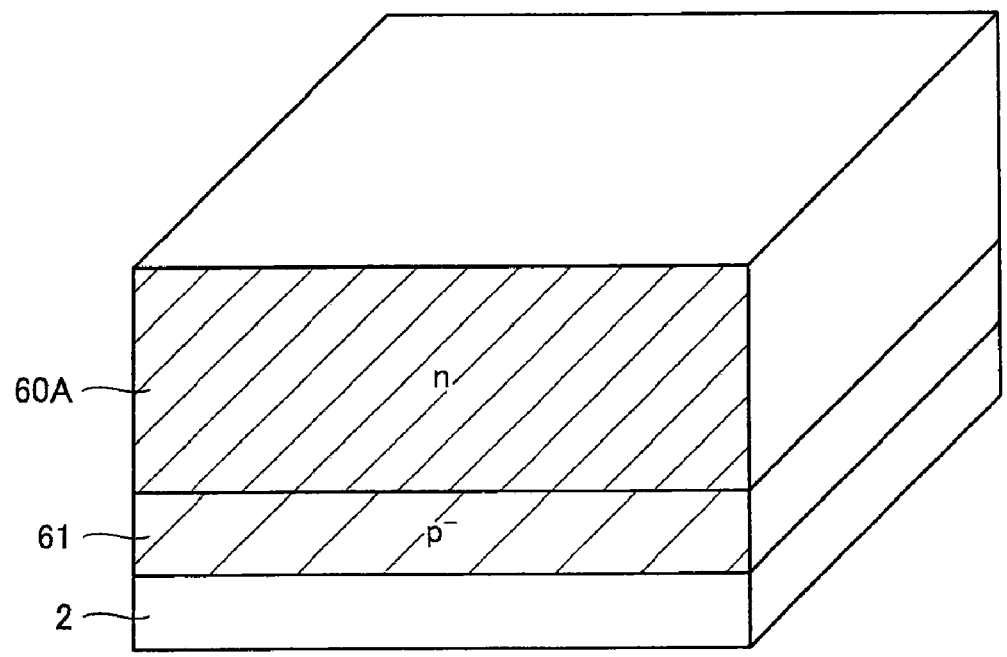
FIG. 47 is cross section showing a second step in a method of manufacturing the lateral junction field effect transistor according to the sixth embodiment.

Referring to FIG. 46, first semiconductor layer 61, which is made of SiC doped with p-type impurities, and has a layer thickness from about 3 μm to about 4 μm and an impurity concentration of about $1 \times 10^{16}$ cm$^{-3}$, is formed on semiconductor substrate 2 made of silicon and others by epitaxial growth.

Thereafter, a semiconductor layer 60A, which is made of SiC doped with n-type impurities, and has a layer thickness from about 1 μm to about 2 μm and an impurity concentration from about $1 \times 10^{17}$ cm$^{-3}$ to about $3 \times 10^{17}$ cm$^{-3}$ higher than that of first semiconductor layer 61, is formed on first semiconductor layer 61 by epitaxial growth.

Figure 48:
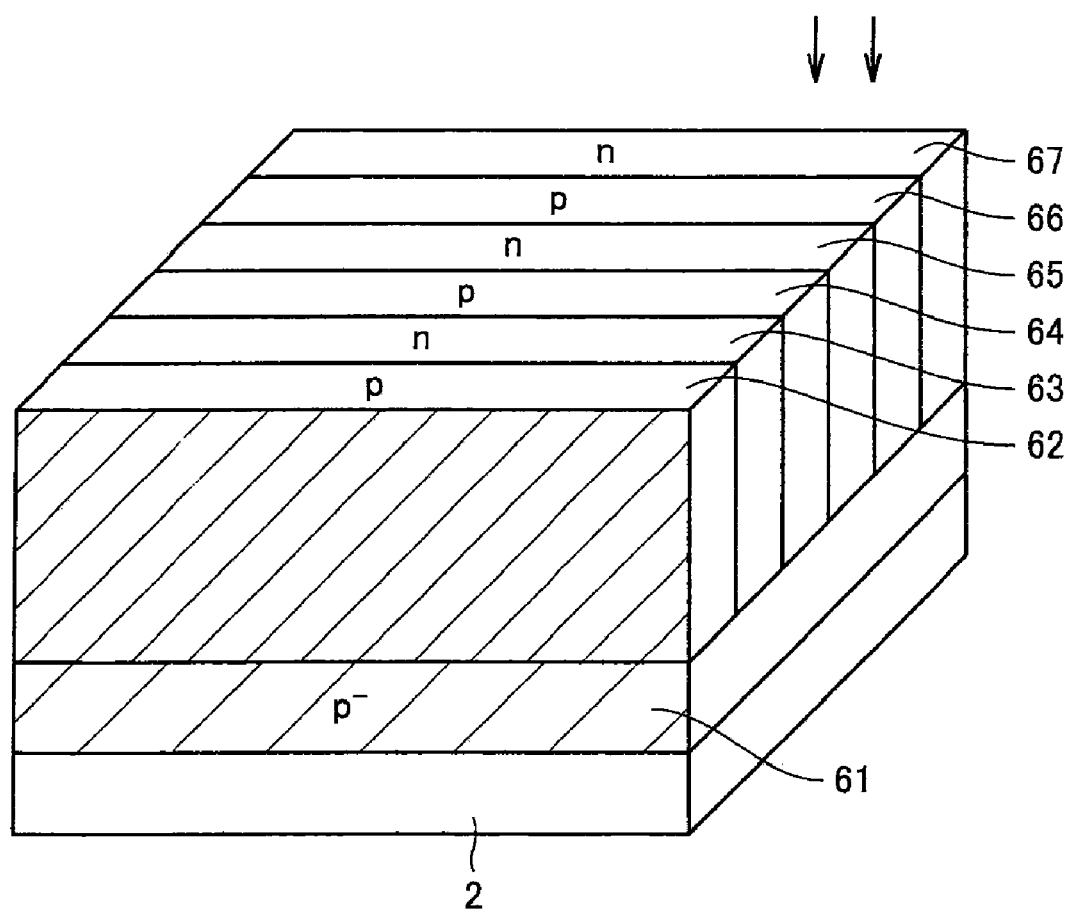
FIG. 48 is cross section showing a third step in a method of manufacturing the lateral junction field effect transistor according to the sixth embodiment.

Referring to FIG. 48, p-type impurities are implanted into predetermined regions of semiconductor layer 60A, which are spaced in a direction of a plane of substrate 2 (i.e., a direction perpendicular to a hatched section shown in FIG. 48) from each other so that second, fourth and sixth semiconductor layers 62, 64 and 66 of the p-type as well as third, fifth and seventh semiconductor layers 63, 65 and 67 of the n-type are formed, has a layer thickness from about 0.5 μm to about 1.0 μm and is doped with impurities at concentration from about $1 \times 10^{17}$ cm$^{-3}$ to about $3 \times 10^{17}$ cm$^{-3}$.

Figure 49:
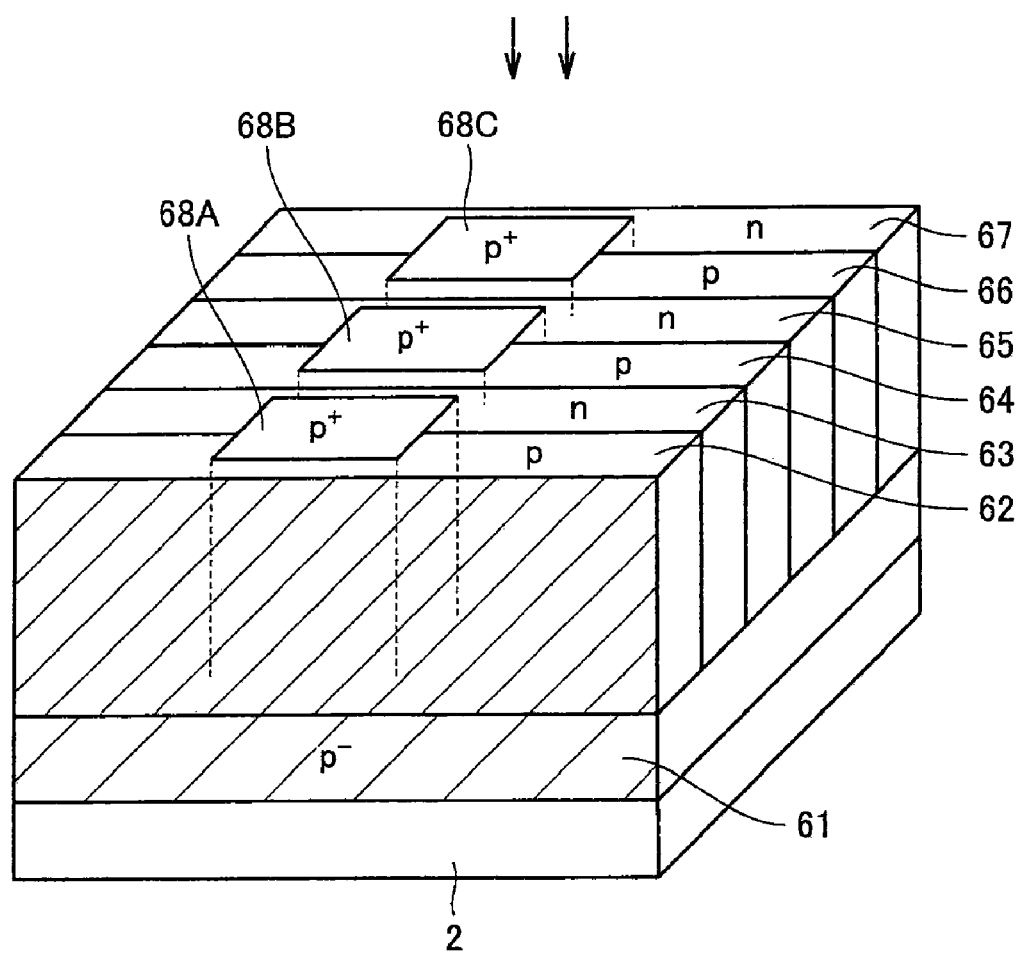
FIG. 49 is cross section showing a fourth step in a method of manufacturing the lateral junction field effect transistor according to the sixth embodiment.

Referring to FIG. 49, p-type impurities are then implanted into predetermined regions of second to seventh semiconductor layers 62, 63, 64, 65, 66 and 67 to form first, second and third gate electrode layers 68A, 68B and 68C each having an impurity concentration from about $3 \times 10^{18}$ cm$^{-3}$ to about $1 \times 10^{20}$ cm$^{-3}$. First gate electrode layer 68A is located between second and third semiconductor layers 62 and 63, and extends thereinto. Second gate electrode layer 68B is located between fourth and fifth semiconductor layers 64 and 65, and extends thereinto. Third gate electrode layer 68C is located between sixth and seventh semiconductor layers 66 and 67, and extends thereinto.

Figure 50:
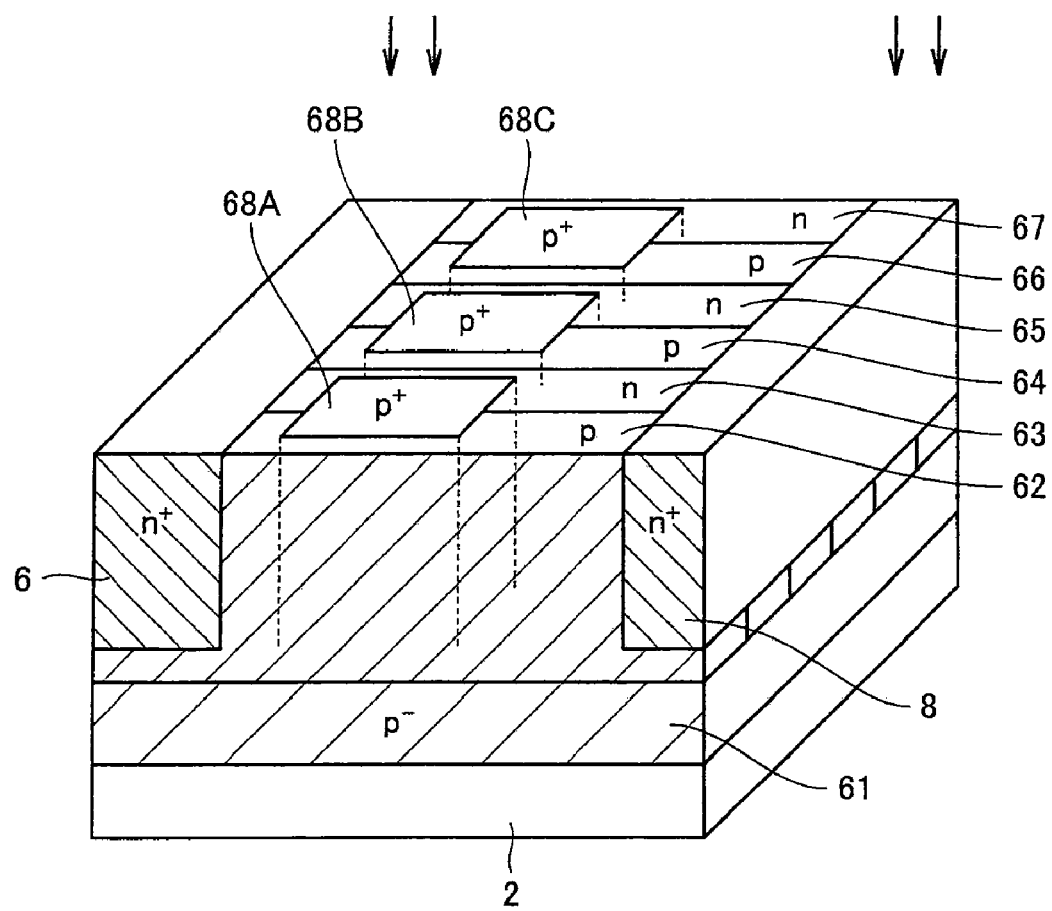
FIG. 50 is cross section showing a fifth step in a method of manufacturing the lateral junction field effect transistor according to the sixth embodiment.

Referring to FIG. 50, n-type impurities are implanted into predetermined regions of second to seventh semiconductor layers 62, 63, 64, 65, 66 and 67 to form source/drain region layers 6 and 8, each extending in the direction of arrangement of second to seventh semiconductor layers 62-67. Source/drain region layers 6 and 8 are located on the opposite sides of first to third gate electrode layers 68A, 68B and 68C, and are doped with n-type impurities at a concentration from about $1 \times 10^{19}$ cm$^{-3}$ to about $1 \times 10^{20}$ cm$^{-3}$ higher than that of third semiconductor layer 63. Although not shown, the structure is then processed in various steps of surface thermal oxidization, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 600 of the sixth embodiment shown in FIG. 44 is completed.

(Operation and Effect)

According to the lateral junction field effect transistor having the above structure as well as the method of manufacturing the same, since the respective semiconductor layers arranged on semiconductor substrate 2 neighbor to each other in the lateral direction, the transistor structure is formed in the direction of the plane of substrate. Therefore, the on-resistance of the element can be reduced, as compared with conventional structures. Further, the second, third, fourth, fifth, sixth and seventh semiconductor layers 62, 63, 64, 65, 66 and 67 may have substantially the same impurity concentration and the same layer thickness so that the lateral junction field effect transistors can have the minimum on-resistance and the maximum breakdown voltage.

The numbers of the semiconductor layers and the gate electrode layers are appropriately changed depending on the required performance of the lateral JFET. For example, the structure may employ three semiconductor layers and two gate electrode layers, or may employ four semiconductor layers and three gate electrode layers.

Seventh Embodiment (Structure of Lateral Junction Field Effect Transistor 700)

A lateral junction field effect transistor 700 according to a seventh embodiment will now be described with reference to FIGS. 51 and 52.

Lateral junction field effect transistor 700 according to the seventh embodiment has a structural feature that pn-junctions and gate electrode layers are arranged in the lateral direction, similarly to the lateral junction field effect transistor 600 already described.

Lateral junction field effect transistor 700 includes a first semiconductor layer 71, which is located on semiconductor substrate 2 made of silicon and others, and is doped with p-type impurities, a second semiconductor layer 72, which is located on first semiconductor layer 71, and is doped with p-type impurities, a third semiconductor layer 73, which is located on first semiconductor layer 71, laterally neighbors to second semiconductor layer 72 and is doped with n-type impurities, a fourth semiconductor layer 74, which is located on first semiconductor layer 71, laterally neighbors to third semiconductor layer 73 and is doped with p-type impurities, a fifth semiconductor layer 75, which is located on first semiconductor layer 71, laterally neighbors to fourth semiconductor layer 74 and is doped with n-type impurities, a sixth semiconductor layer 76, which is located on first semiconductor layer 71, laterally neighbors to fifth semiconductor layer 75 and is doped with p-type impurities, and a seventh semiconductor layer 77, which is located on first semiconductor layer 71, laterally neighbors to sixth semiconductor layer 76 and is doped with n-type impurities.

First semiconductor layer 71 is made of SiC, has a layer thickness from about 3 μm to about 4 μm and is doped with impurities at a concentration of about $1 \times 10^{16}$ cm$^{-3}$. Each of second, third, fourth, fifth, sixth and seventh semiconductor layers 72, 73, 74, 75, 76 and 77 is made of SiC, has a layer thickness from about 0.5 μm to about 1.0 μm and is doped with impurities at a concentration from about $1 \times 10^{17}$ cm$^{-3}$ to about $3 \times 10^{17}$ cm$^{-3}$. The layer thicknesses of second to seventh semiconductor layers 72, 73, 74, 75, 76 and 77 are sizes determined in a direction perpendicular to a hatched section shown in FIG. 51.

In second to seventh semiconductor layers 72, 73, 74, 75, 76 and 77, source/drain region layers 6 and 8 are arranged with a predetermined space therebetween. Source/drain region layers 6 and 8 are doped with n-type impurities more heavily than second to seventh semiconductor layers 72, 73, 74, 75, 76 and 77. The impurity concentrations of source/drain region layers 6 and 8 are substantially in a range from about $1 \times 10^{19}$ cm$^{-3}$ to about $1 \times 10^{20}$ cm$^{-3}$.

Between source/drain region layers 6 and 8, a first gate electrode layer 78A is arranged in second semiconductor layer 72. First gate electrode layer 78A has one side surface extending in third semiconductor layer 73, and is doped with p-type impurities more heavily than third semiconductor layer 73.

Between source/drain region layers 6 and 8, a second gate electrode layer 78B doped with p-type impurities is arranged in fourth semiconductor layer 74. Second gate electrode layer 78B has one side surface extending in fifth semiconductor layer 75, has substantially the same impurity concentration as first gate electrode layer 78A, and has the same potential as first gate electrode layer 78A.

Between source/drain region layers 6 and 8, a third gate electrode layer 78C doped with p-type impurities is arranged in sixth semiconductor layer 76. Third gate electrode layer 78C has one side surface extending in seventh semiconductor layer 77, has substantially the same impurity concentration as first gate electrode layer 78A, and has the same potential as first gate electrode layer 78A.

Between fourth semiconductor layer 74 and first gate electrode layer 78A, a first impurity doped region 79A doped with p-type impurities is arranged in third semiconductor layer 73.

First impurity doped region 79A has substantially the same impurity concentration as first gate electrode layer 78A, and has the same potential as first gate electrode layer 78A.

Between second gate electrode layer 78B and a surface of fifth semiconductor layer 75 spaced from second gate electrode layer 78B, a second impurity doped region 79B doped with p-type impurities is arranged in fifth semiconductor layer 75. Second impurity doped region 79B has substantially the same impurity concentration as first gate electrode layer 78A, and has the same potential as first gate electrode layer 78A.

Between third gate electrode layer 78C and a surface of seventh semiconductor layer 77 spaced from third gate electrode layer 78C, a third impurity doped region 79C doped with p-type impurities is arranged in seventh semiconductor layer 77. Third impurity doped region 79C has substantially the same impurity concentration as first gate electrode layer 78A, and has the same potential as first gate electrode layer 78A.

Figure 51:
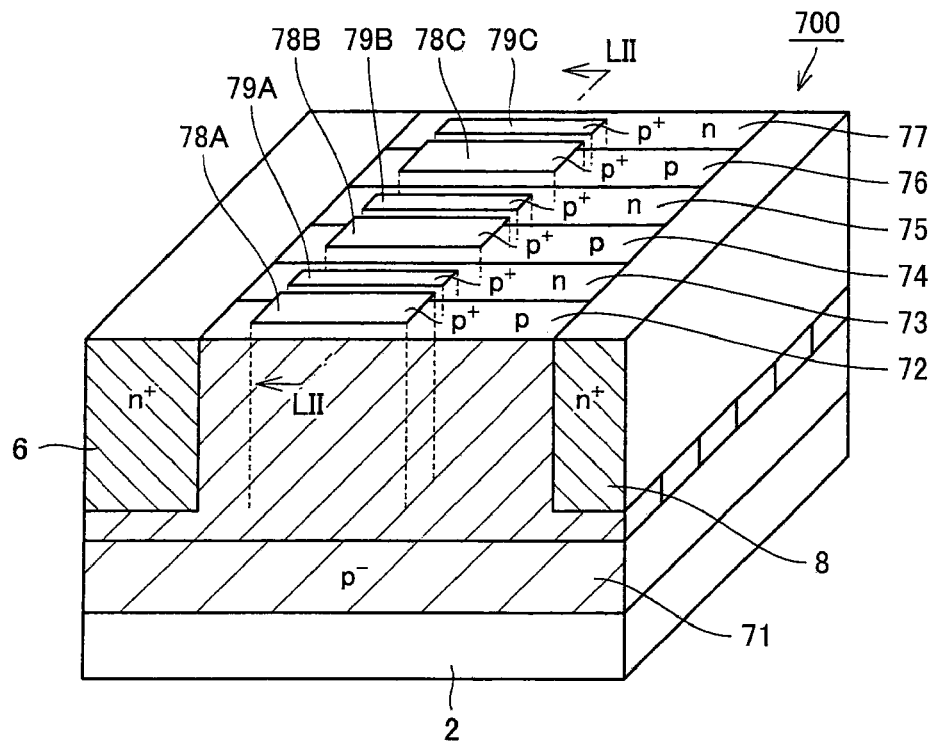
FIG. 51 is a cross section showing a structure of a lateral junction field effect transistor according to a seventh embodiment.
Figure 52:
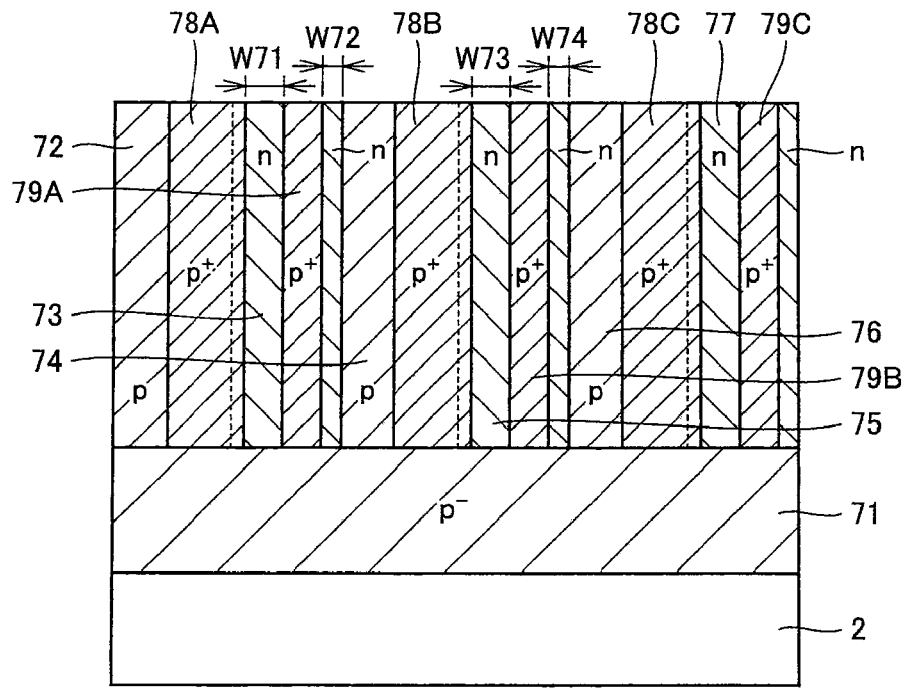
FIG. 52 is a cross section taken along line LII-LII in FIG. 51.

Although the structure shown in FIG. 51 is provided with first, second and third impurity doped regions 79A, 79B and 79C each formed of one layer, each of first, second and third impurity doped regions 79A, 79B and 79C may be formed of a plurality of layers for the purpose of achieving the normally-off type of the lateral junction field effect transistor, in which the total channel width is increased and the on-resistance is lowered.

The impurity concentrations of first, second and third gate electrode layers 78A, 78B and 78C as well as first, second and third impurity doped regions 79A, 79B and 79C are in a range from about $3 \times 10^{18}$ cm$^{-3}$ to about $1 \times 10^{20}$ cm$^{-3}$.

The normally-off type of the lateral junction field effect transistor can be achieved by the following structure. A distance w71 between surfaces of first gate electrode layer 78A and first impurity doped region 79A, which are nearest to each other, is smaller than double a distance of a depletion layer extended by a diffused potential in a junction between third semiconductor layer 73 and first gate electrode layer 78A, and a distance w72 between first impurity doped region 79A and a surface of third semiconductor layer 73 spaced from first gate electrode layer 78A is smaller than a distance of a depletion layer extended by a diffused potential in a junction between third semiconductor layer 73 and first gate electrode layer 78A. Further, a distance w73 between surfaces of second gate electrode layer 78B and second impurity doped region 79B, which are nearest to each other, is smaller than double a distance of a depletion layer extended by a diffused potential in a junction between fifth semiconductor layer 75 and second gate electrode layer 78B, and a distance w74 between second impurity doped region 79B and a surface of fifth semiconductor layer 75 spaced from second gate electrode layer 78B is smaller than a distance of a depletion layer extended by a diffused potential in a junction between fifth semiconductor layer 75 and second gate electrode layer 78B.

(Method of Manufacturing Lateral Junction Field Effect Transistor 700)

A method of manufacturing lateral junction field effect transistor 700 having the above structures will now be described with reference to FIGS. 53 to 57, which are cross sections showing sectional structures corresponding to that in FIG. 51, and particularly showing a progression of manufacturing steps.

Figure 53:
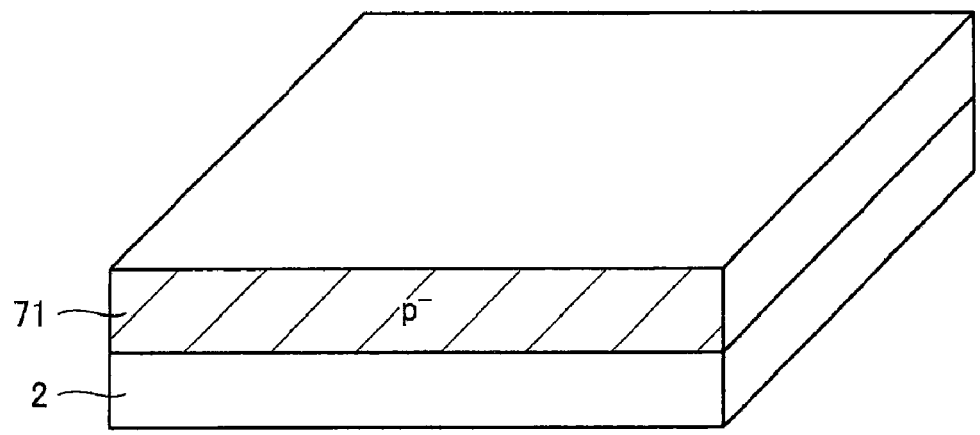
FIG. 53 is cross section showing a first step in a method of manufacturing the lateral junction field effect transistor according to the seventh embodiment.

Referring to FIG. 53, first semiconductor layer 71, which is made of SiC doped with p-type impurities, and has a layer thickness from about 3 μm to about 4 μm and an impurity concentration of about $1 \times 10^{16}$ cm$^{-3}$, is formed on semiconductor substrate 2 made of silicon and others by epitaxial growth.

Figure 54:
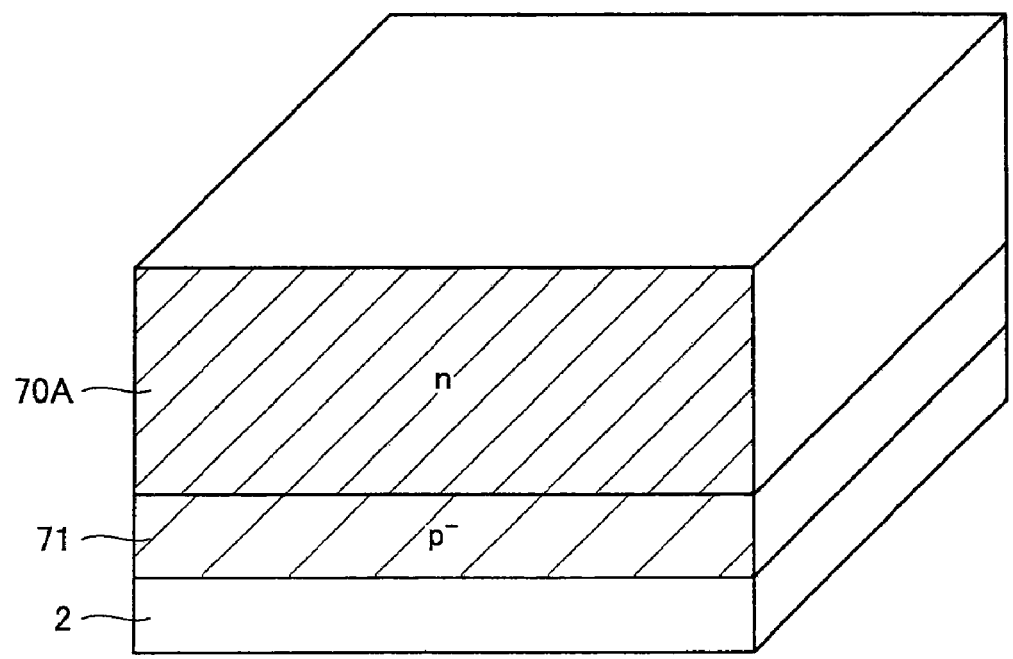
FIG. 54 is cross section showing a second step in a method of manufacturing the lateral junction field effect transistor according to the seventh embodiment.

Referring to FIG. 54, a semiconductor layer 70A, which is made of SiC doped with n-type impurities, and has a layer thickness from about 1 μm to about 2 μm and an impurity concentration from about $1 \times 10^{17}$ cm$^{-3}$ to about $3 \times 10^{17}$ cm$^{-3}$ higher than that of first semiconductor layer 71, is formed on first semiconductor layer 71 by epitaxial growth.

Figure 55:
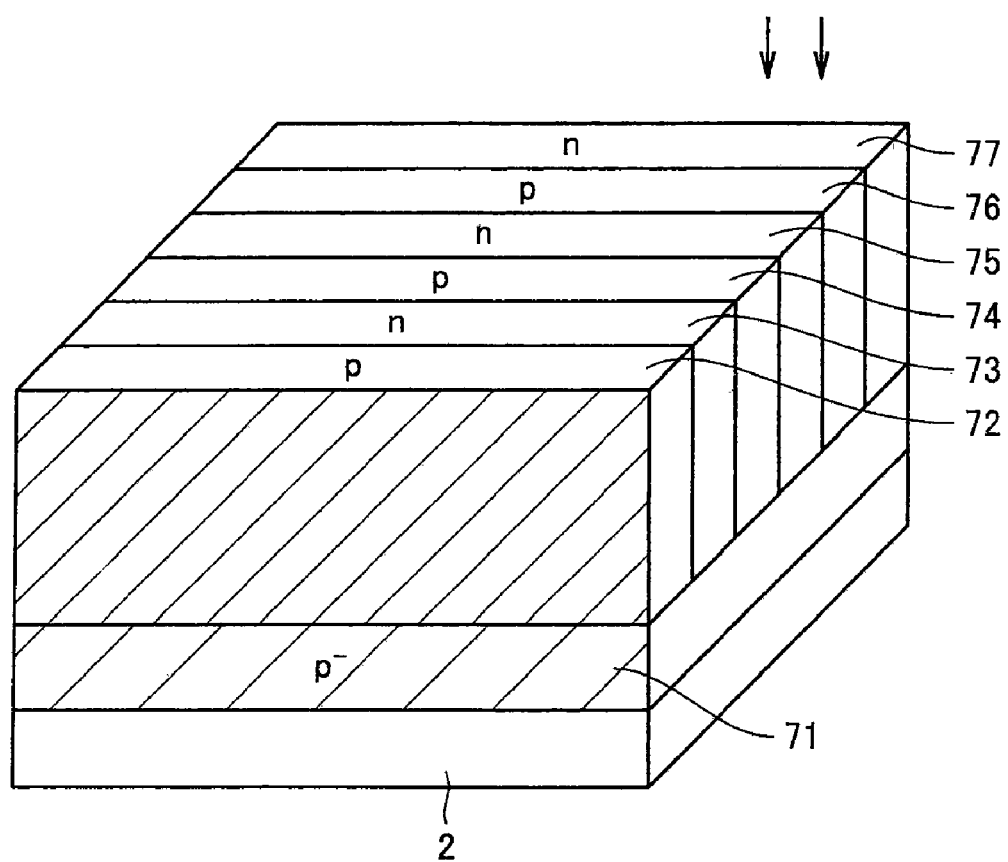
FIG. 55 is cross section showing a third step in a method of manufacturing the lateral junction field effect transistor according to the seventh embodiment.

Referring to FIG. 55, p-type impurities are implanted into predetermined regions of semiconductor layer 70A, which are spaced in a direction of a plane of substrate 2 (i.e., a direction perpendicular to a hatched section shown in FIG. 55) from each other so that second, fourth and sixth semiconductor layers 72, 74 and 76 of the p-type as well as third, fifth and seventh semiconductor layers 73, 75 and 77 of the n-type are formed, has a layer thickness from about 0.5 μm to about 1.0 μm and is doped with impurities at concentration from about $1 \times 10^{17}$ cm$^{-3}$ to about $3 \times 10^{17}$ cm$^{-3}$.

Figure 56:
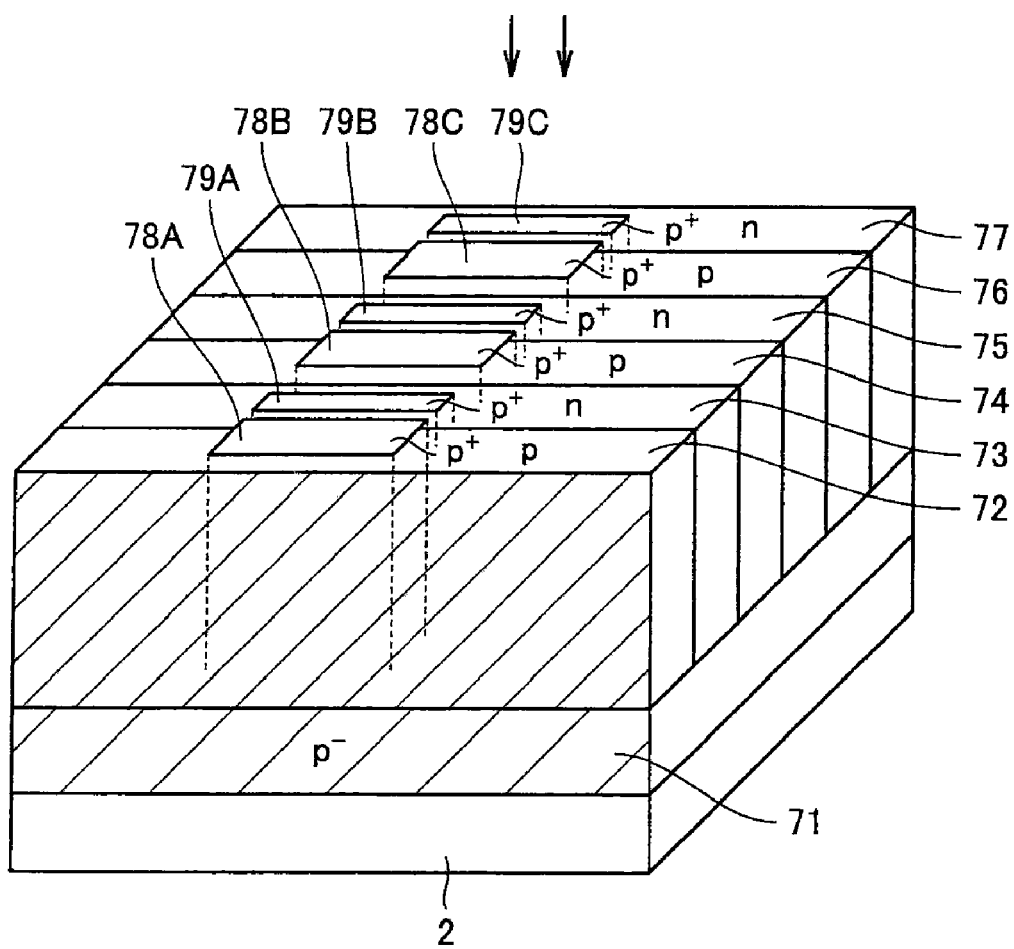
FIG. 56 is cross section showing a fourth step in a method of manufacturing the lateral junction field effect transistor according to the seventh embodiment.

Referring to FIG. 56, p-type impurities are then implanted into predetermined regions of second to seventh semiconductor layers 72, 73, 74, 75, 76 and 77 to form first, second and third gate electrode layers 78A, 78B and 78C each having an impurity concentration from about $3 \times 10^{18}$ cm$^{-3}$ to about $1 \times 10^{20}$ cm$^{-3}$. First gate electrode layer 78A is located between second and third semiconductor layers 72 and 73, and extends thereinto. Second gate electrode layer 78B is located between fourth and fifth semiconductor layers 74 and 75, and extends thereinto. Third gate electrode layer 78C is located between sixth and seventh semiconductor layers 76 and 77, and extends thereinto. At the same time, first, second and third impurity doped regions 79A, 79B and 79C are formed in third, fifth and seventh gate electrode layers 78A, 78B and 78C, respectively. Each of first, second and third impurity doped regions 79A, 79B and 79C has an impurity concentration from about $3 \times 10^{18}$ cm$^{-3}$ to about $1 \times 10^{20}$ cm$^{-3}$, which is substantially equal to those of first, second and third gate electrode layers 78A, 78B and 78C, and also has the same potential as first, second and third gate electrode layers 78A, 78B and 78C.

Figure 57:
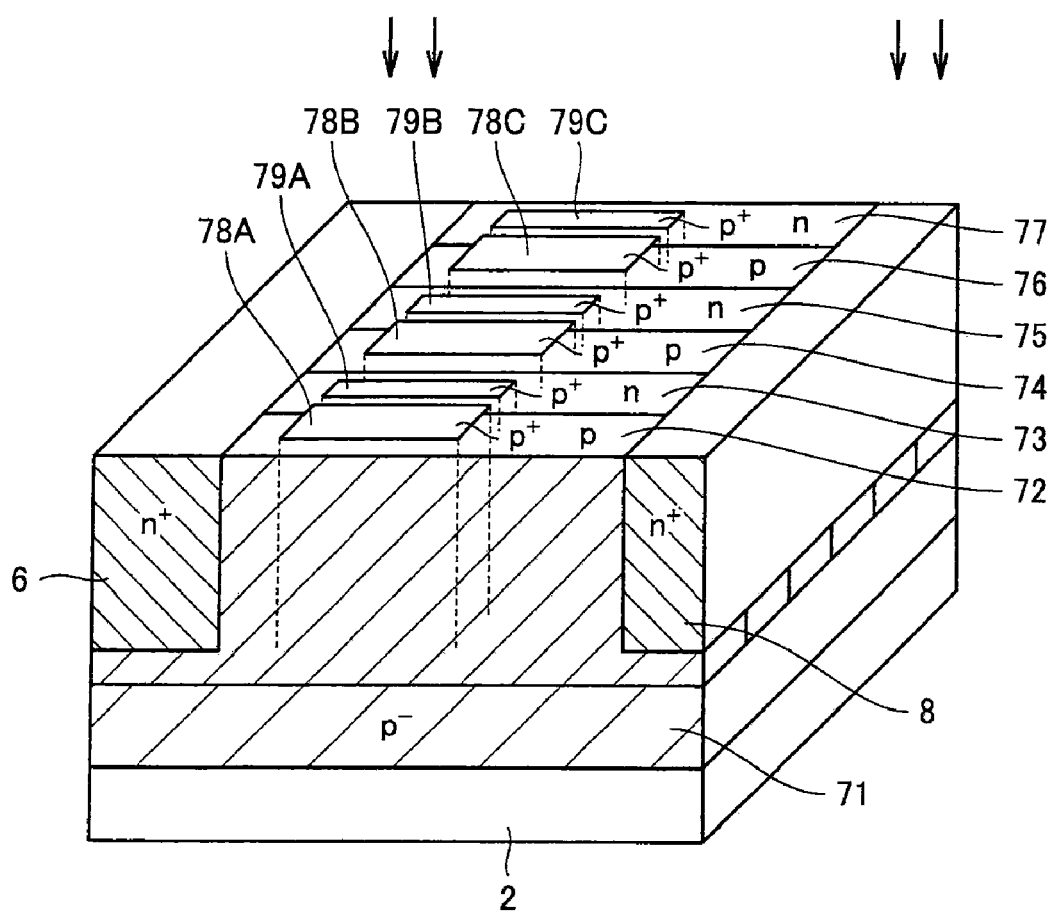
FIG. 57 is cross section showing a fifth step in a method of manufacturing the lateral junction field effect transistor according to the seventh embodiment.

Referring to FIG. 57, n-type impurities are implanted into predetermined regions of second to seventh semiconductor layers 72, 73, 74, 75, 76 and 77 to form source/drain region layers 6 and 8, each extending in the direction of arrangement of second to seventh semiconductor layers 72-77. Source/drain region layers 6 and 8 are located on the opposite sides of first to third gate electrode layers 78A, 78B and 78C as well as first to third impurity doped regions 79A, 79B and 79C, and are doped with n-type impurities at a concentration from about $1 \times 10^{19}$ cm$^{-3}$ to about $1 \times 10^{20}$ cm$^{-3}$ higher than that of third semiconductor layer 73. Although not shown, the structure is then processed in various steps of surface thermal oxidization, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 700 of the seventh embodiment shown in FIG. 51 is completed.

(Operation and Effect)

According to the lateral junction field effect transistor having the above structure as well as the method of manufacturing the same, since the respective semiconductor layers arranged on semiconductor substrate 2 neighbor to each other in the lateral direction, the transistor structure is formed in the direction of the plane of substrate. Therefore, the on-resistance of the element can be reduced, as compared with conventional structures. Further, the second, third, fourth, fifth, sixth and seventh semiconductor layers 72, 73, 74, 75, 76 and 77 may have substantially the same impurity concentration and the same layer thickness so that the lateral junction field effect transistors can have the minimum on-resistance and the maximum breakdown voltage.

The numbers of the semiconductor layers, the gate electrode layers and the impurity doped regions are appropriately changed depending on the required performance of the lateral JFET. For example, the structure may employ three semiconductor layers, two gate electrode layers and one impurity doped region, or may employ four semiconductor layers, two gate electrode layers and two impurity doped regions.

Eighth Embodiment (Structure of Lateral Junction Field Effect Transistor 800)

Figure 58:
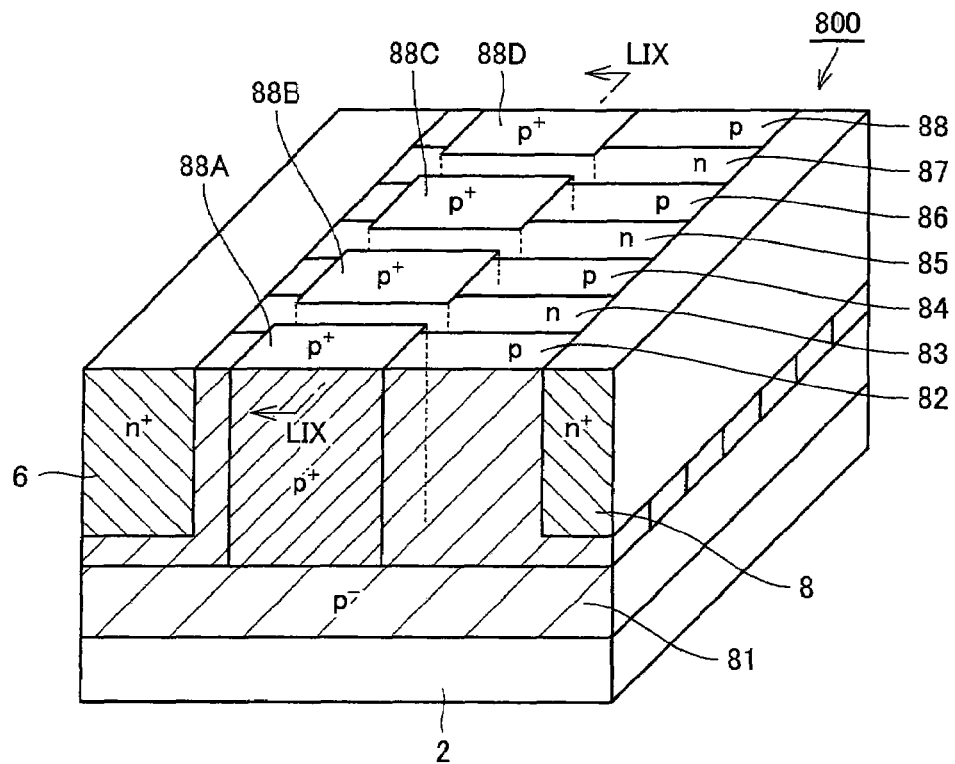
FIG. 58 is a cross section showing a structure of a lateral junction field effect transistor according to an eighth embodiment.
Figure 59:
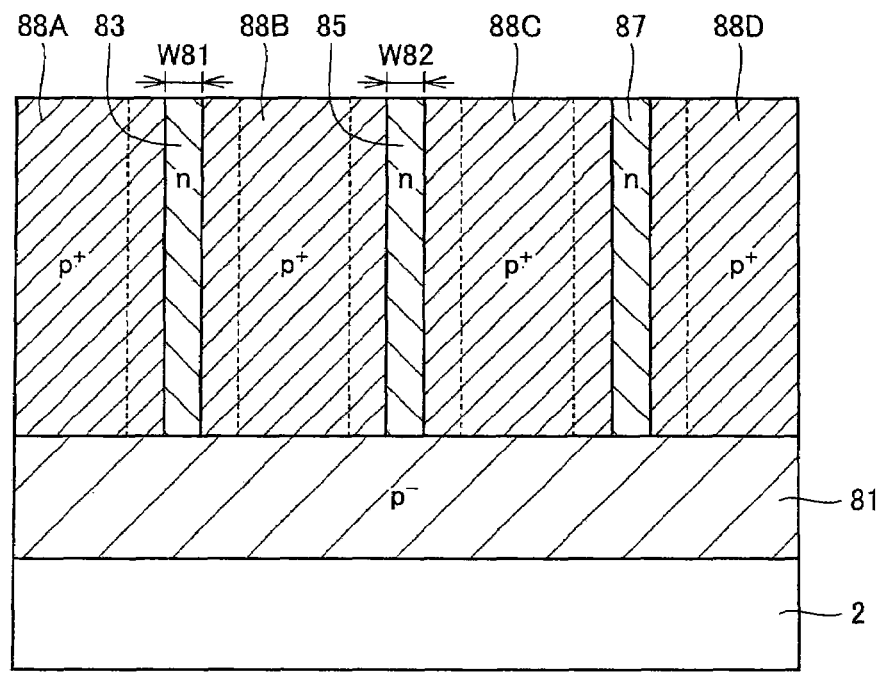
FIG. 59 is a cross section taken along line LIX-LIX in FIG. 58.

A lateral junction field effect transistor 800 according to an eighth embodiment will now be described with reference to FIGS. 58 and 59.

Lateral junction field effect transistor 800 according to the eighth embodiment has a structural feature that pn-junctions and gate electrode layers are arranged in the lateral direction, similarly to the lateral junction field effect transistor 600 already described.

Lateral junction field effect transistor 800 includes a first semiconductor layer 81, which is located on semiconductor substrate 2 made of silicon and others, and is doped with p-type impurities, a second semiconductor layer 82, which is located on first semiconductor layer 81, and is doped with p-type impurities, a third semiconductor layer 83, which is located on first semiconductor layer 81, laterally neighbors to second semiconductor layer 82 and is doped with n-type impurities, a fourth semiconductor layer 84, which is located on first semiconductor layer 81, laterally neighbors to third semiconductor layer 83 and is doped with p-type impurities, a fifth semiconductor layer 85, which is located on first semiconductor layer 81, laterally neighbors to fourth semiconductor layer 84 and is doped with n-type impurities, a sixth semiconductor layer 86, which is located on first semiconductor layer 81, laterally neighbors to fifth semiconductor layer 85 and is doped with p-type impurities, a seventh semiconductor layer 87, which is located on first semiconductor layer 81, laterally neighbors to sixth semiconductor layer 86 and is doped with n-type impurities, and an eighth semiconductor layer 88, which is located on first semiconductor layer 81, laterally neighbors to seventh semiconductor layer 87 and is doped with p-type impurities.

First semiconductor layer 81 is made of SiC, has a layer thickness from about 3 μm to about 4 μm and is doped with impurities at a concentration of about $1 \times 10^{16}$ cm$^{-3}$. Each of second, third, fourth, fifth, sixth, seventh and eighth semiconductor layers 82, 83, 84, 85, 86, 87 and 88 is made of SiC, has a layer thickness from about 0.5 μm to about 1.0 μm and is doped with impurities at a concentration from about $1 \times 10^{17}$ cm$^{-3}$ to about $3 \times 10^{17}$ cm$^{-3}$. The layer thicknesses of second to eighth semiconductor layers 82, 83, 84, 85, 86, 87 and 88 are sizes determined in a direction perpendicular to a hatched section shown in FIG. 58.

In second to eighth semiconductor layers 82, 83, 84, 85, 86, 87 and 88, source/drain region layers 6 and 8 are arranged with a predetermined space therebetween. Source/drain region layers 6 and 8 are doped with n-type impurities more heavily than third, fifth and seventh semiconductor layers 83, 85 and 87. The impurity concentrations of source/drain region layers 6 and 8 are substantially in a range from about $1 \times 10^{19}$ cm$^{-3}$ to about $1 \times 10^{20}$ cm$^{-3}$.

Between source/drain region layers 6 and 8, a first gate electrode layer 88A is arranged in second semiconductor layer 82. First gate electrode layer 88A has one side surface extending in third semiconductor layer 83, and is doped with p-type impurities more heavily than third semiconductor layer 83.

Between source/drain region layers 6 and 8, a second gate electrode layer 88B doped with p-type impurities is arranged in fourth semiconductor layer 84. Second gate electrode layer 88B has one and the other side surfaces extending in third and fifth semiconductor layers 83 and 85, respectively, has substantially the same impurity concentration as first gate electrode layer 88A, and has the same potential as first gate electrode layer 88A.

Between source/drain region layers 6 and 8, a third gate electrode layer 88C doped with p-type impurities is arranged in sixth semiconductor layer 86. Third gate electrode layer 88C has one and the other side surfaces extending in fifth and seventh semiconductor layers 85 and 87, respectively, has substantially the same impurity concentration as first gate electrode layer 88A, and has the same potential as first gate electrode layer 88A.

Between source/drain region layers 6 and 8, a fourth gate electrode layer 88D doped with p-type impurities is arranged in eighth semiconductor layer 88. Fourth gate electrode layer 88D has substantially the same impurity concentration as first gate electrode layer 88A, and has the same potential as first gate electrode layer 88A.

The impurity concentrations of first, second, third and fourth gate electrode layers 88A, 88B, 88C and 88D are in a range from about $3 \times 10^{18}$ cm$^{-3}$ to about $1 \times 10^{20}$ cm$^{-3}$.

The normally-off type of the lateral junction field effect transistor can be achieved by the following structure. A distance w81 between surfaces of first and second gate electrode layers 88A and 88B, which are nearest to each other, is smaller than double a distance of a depletion layer extended by a diffused potential in a junction between third semiconductor layer 83 and first gate electrode layer 88A, and a distance w82 between surfaces of second and third gate electrode layers 88B and 88C, which are nearest to each other, is smaller than double a distance of a depletion layer extended by a diffused potential in a junction between third semiconductor layer 83 and first gate electrode layer 88A.

(Method of Manufacturing Lateral Junction Field Effect Transistor 800)

A method of manufacturing lateral junction field effect transistor 800 having the above structures will now be described with reference to FIGS. 60 to 64.

Figure 60:
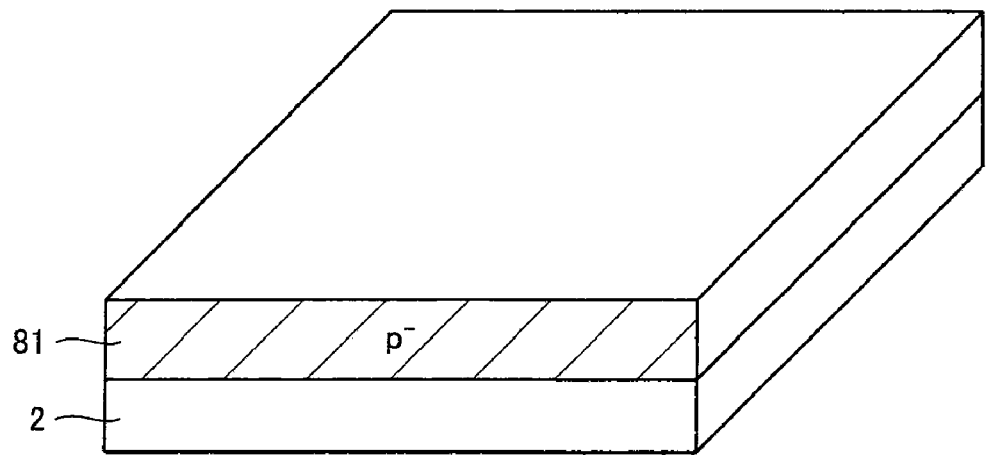
FIG. 60 is cross section showing a first step in a method of manufacturing the lateral junction field effect transistor according to the eighth embodiment.

Referring to FIG. 60, first semiconductor layer 81, which is made of SiC doped with p-type impurities, and has a layer thickness from about 3 μm to about 4 μm and an impurity concentration of about $1 \times 10^{16}$ cm$^{-3}$, is formed on semiconductor substrate 2 made of silicon and others by epitaxial growth.

Figure 61:
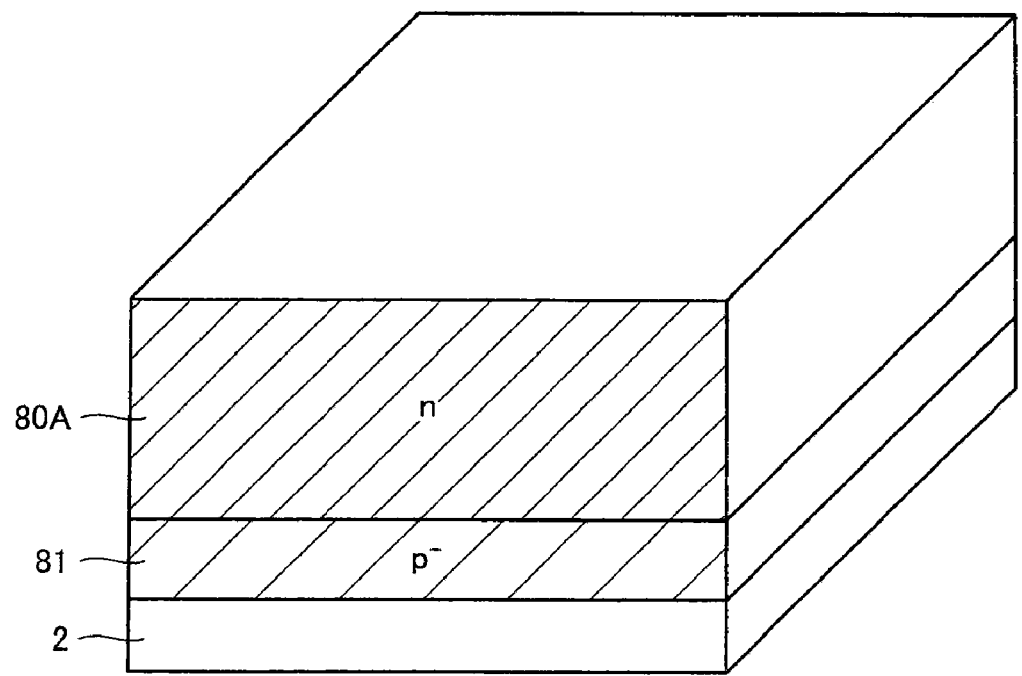
FIG. 61 is cross section showing a second step in a method of manufacturing the lateral junction field effect transistor according to the eighth embodiment.

Referring to FIG. 61, a semiconductor layer 80A, which is made of SiC doped with n-type impurities, and has a layer thickness from about 1 μm to about 2 μm and an impurity concentration from about $1 \times 10^{17}$ cm$^{-3}$ to about $3 \times 10^{17}$ cm$^{-3}$ higher than that of first semiconductor layer 81, is formed on first semiconductor layer 81 by epitaxial growth.

Figure 62:
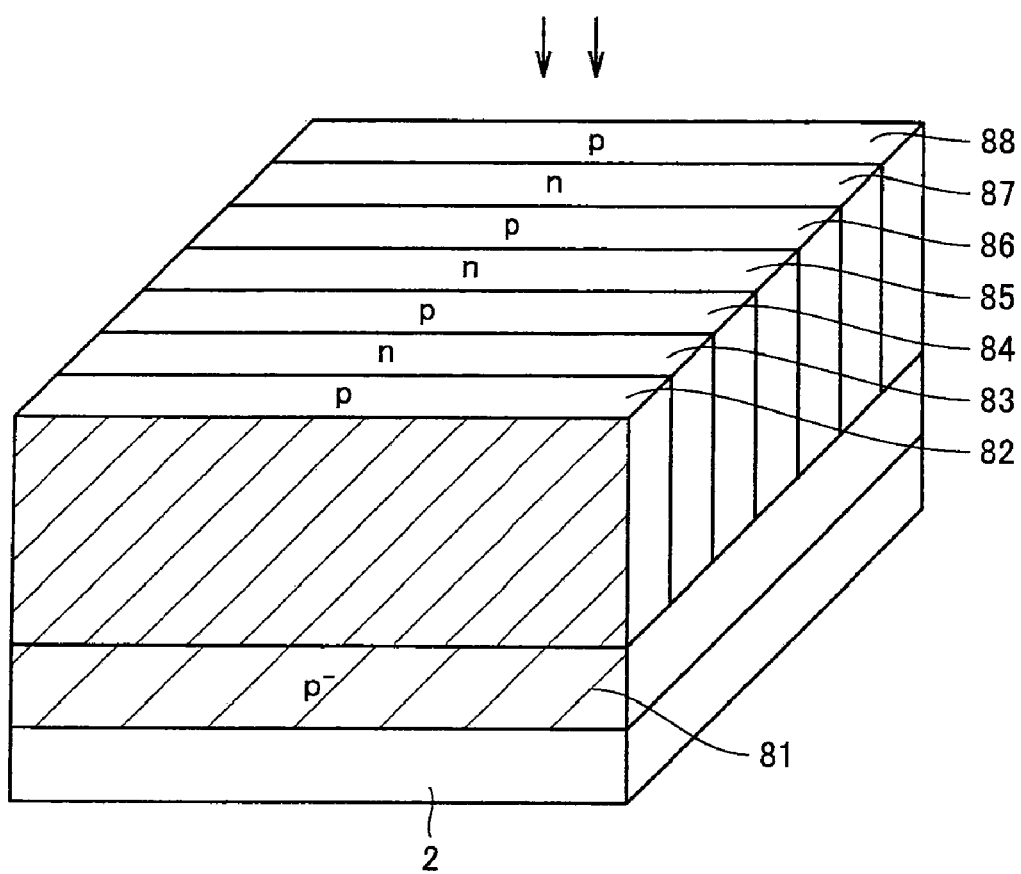
FIG. 62 is cross section showing a third step in a method of manufacturing the lateral junction field effect transistor according to the eighth embodiment.

Referring to FIG. 62, p-type impurities are implanted into predetermined regions of semiconductor layer 80A, which are spaced in a direction of a plane of substrate 2 (i.e., a direction perpendicular to a hatched section shown in FIG. 62) from each other so that second, fourth, sixth and eighth semiconductor layers 82, 84, 86 and 88 of the p-type as well as third, fifth and seventh semiconductor layers 83, 85 and 87 of the n-type are formed, has a layer thickness from about 0.5 µm to about 1.0 µm and is doped with impurities at concentration from about $1 \times 10^{17}$ cm$^{-3}$ to about $3 \times 10^{17}$ cm$^{-3}$.

Figure 63:
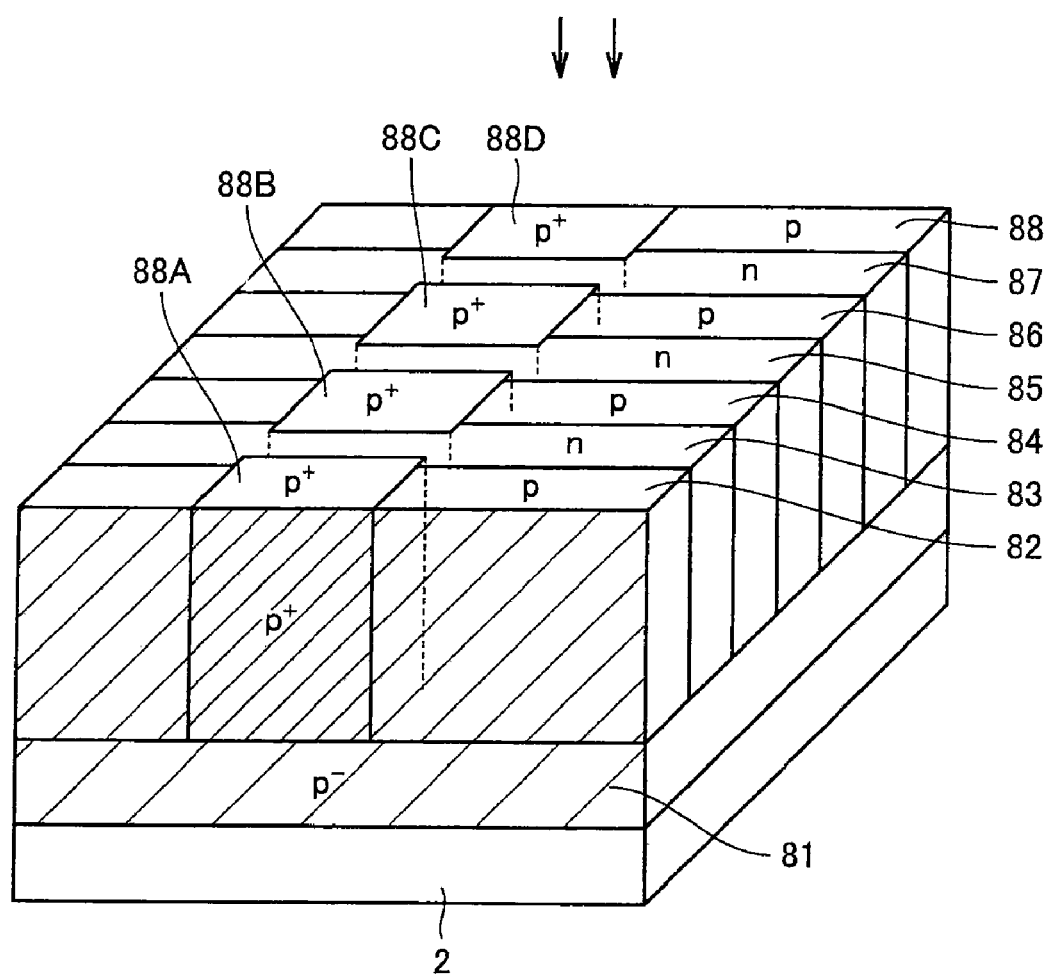
FIG. 63 is cross section showing a fourth step in a method of manufacturing the lateral junction field effect transistor according to the eighth embodiment.

Referring to FIG. 63, p-type impurities are then implanted into predetermined regions of second to eighth semiconductor layers 82, 83, 84, 85, 86, 87 and 88 to form first, second, third and fourth gate electrode layers 88A, 88B, 88C and 88D each having an impurity concentration from about $3 \times 10^{18}$ cm$^{-3}$ to about $1 \times 10^{20}$ cm$^{-3}$. First gate electrode layer 88A is located in second and third semiconductor layers 82 and 83. Second gate electrode layer 88B is located between third and fifth semiconductor layers 83 and 85, and extends thereinto. Third gate electrode layer 88C is located between fifth and seventh semiconductor layers 85 and 87, and extends thereinto. Fourth gate electrode layer 88D is located in seventh and eight semiconductor layers 87 and 88.

Figure 64:
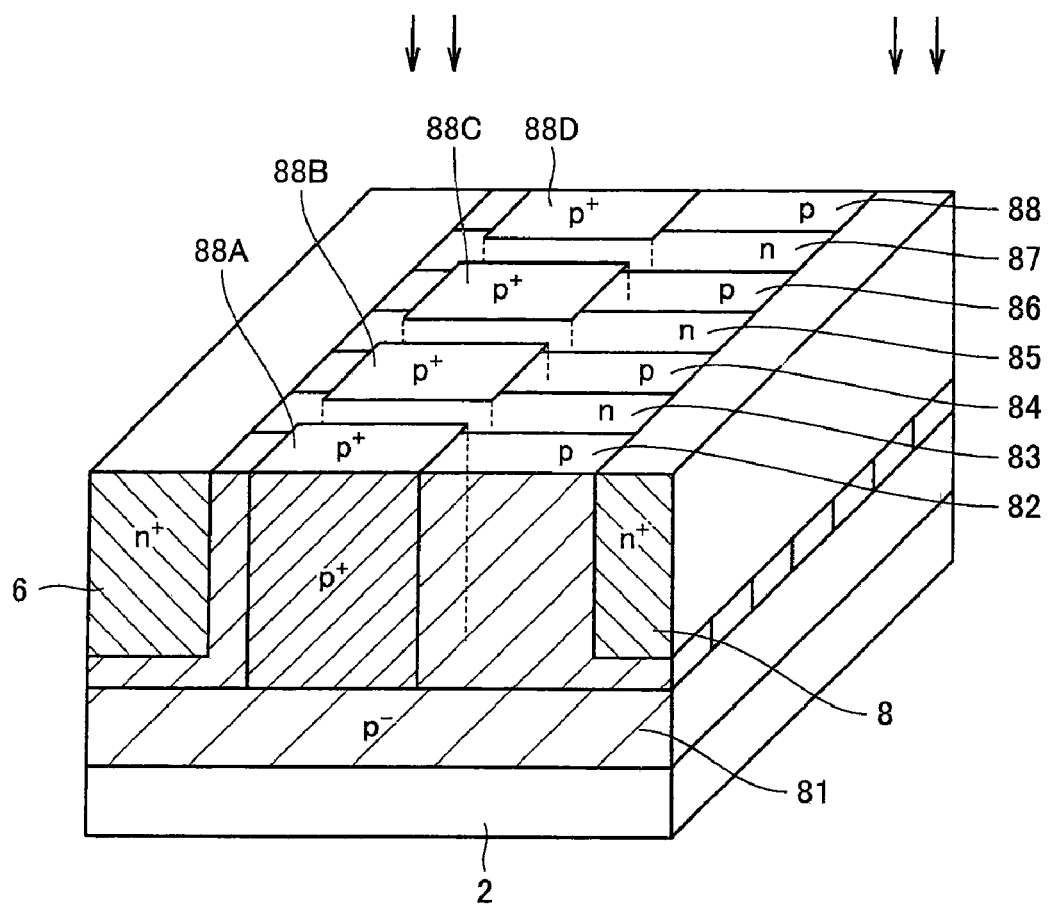
FIG. 64 is cross section showing a fifth step in a method of manufacturing the lateral junction field effect transistor according to the eighth embodiment.

Referring to FIG. 64, n-type impurities are implanted into predetermined regions of second to eighth semiconductor layers 82, 83, 84, 85, 86, 87 and 88 to form source/drain region layers 6 and 8, each extending in the direction of arrangement of second to eighth semiconductor layers 82-88. Source/drain region layers 6 and 8 are located on the opposite sides of first to fourth gate electrode layers 88A, 88B, 88C and 88D, and are doped with n-type impurities at a concentration from about $1 \times 10^{19}$ cm$^{-3}$ to about $1 \times 10^{20}$ cm$^{-3}$ higher than that of third semiconductor layer 83. Although not shown, the structure is then processed in various steps of surface thermal oxidation, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 800 of the eighth embodiment shown in FIG. 58 is completed.

(Operation and Effect)

According to the lateral junction field effect transistor having the above structure, since the respective semiconductor layers arranged on semiconductor substrate 2 neighbor to each other in the lateral direction, the transistor structure is formed in the direction of the plane of substrate. Therefore, the on-resistance of the element can be reduced, as compared with conventional structures. Further, the second, third, fourth, fifth, sixth, seventh and eighth semiconductor layers 82, 83, 84, 85, 86, 87 and 88 may have substantially the same impurity concentration and the same layer thickness so that the lateral junction field effect transistors can have the minimum on-resistance and the maximum breakdown voltage.

The numbers of the semiconductor layers and the gate electrode layers are appropriately changed depending on the required performance of the lateral JFET. For example, the structure may employ three semiconductor layers and two gate electrode layers, or may employ four semiconductor layers and three gate electrode layers.

In the manufacturing method of the sixth to eighth embodiments already described, it may be required to repeat the ion implantation several times, if the thickness of the device (i.e., the size of the second semiconductor layer determined in the vertical direction in the figure) is large. In this case, each of the steps of forming the respective semiconductor layers, respective gate electrode layers and source/drain region layers is repeated several times to form the device of an intended thickness.

Ninth Embodiment (Structure of Lateral Junction Field Effect Transistor 900)

A lateral junction field effect transistor 900 according to a ninth embodiment will now be described with reference to FIGS. 65 and 66.

Lateral junction field effect transistor 900 according to the ninth embodiment has a structural feature that pn junctions and gate electrode layers are arranged in the lateral direction, similarly to the lateral junction field effect transistor 600 already described.

Lateral junction field effect transistor 900 includes a first semiconductor layer 91, which is located on semiconductor substrate 2 made of silicon and others, and is doped with p-type impurities, a second semiconductor layer 92, which is located on first semiconductor layer 91, and is doped with p-type impurities, a third semiconductor layer 93, which is located on first semiconductor layer 91, laterally neighbors to second semiconductor layer 92 and is doped with n-type impurities, a fourth semiconductor layer 94, which is located on first semiconductor layer 91, laterally neighbors to third semiconductor layer 93 and is doped with p-type impurities, a fifth semiconductor layer 95, which is located on first semiconductor layer 91, laterally neighbors to fourth semiconductor layer 94 and is doped with n-type impurities, and a sixth semiconductor layer 96, which is located on first semiconductor layer 91, laterally neighbors to fifth semiconductor layer 95 and is doped with p-type impurities.

First semiconductor layer 91 is made of SiC, has a layer thickness from about 3 µm to about 4 µm and is doped with impurities at a concentration of about $1 \times 10^{16}$ cm$^{-3}$. Each of second, third, fourth, fifth and sixth semiconductor layers 92, 93, 94, 95 and 96 is made of SiC, has a layer thickness from about 0.5 µm to about 1.0 µm and is doped with impurities at a concentration from about $1 \times 10^{17}$ cm$^{-3}$ to about $3 \times 10^{17}$ cm$^{-3}$. The layer thicknesses of second to sixth semiconductor layers 92, 93, 94, 95 and 96 are sizes determined in a direction perpendicular to a hatched section shown in FIG. 65.

In second to sixth semiconductor layers 92, 93, 94, 95 and 96, source/drain region layers 6 and 8 are arranged with a predetermined space therebetween. Source/drain region layers 6 and 8 are doped with n-type impurities more heavily than third and fifth semiconductor layers 93 and 95. The impurity concentrations of source/drain region layers 6 and 8 are substantially in a range from about $1 \times 10^{19}$ cm$^{-3}$ to about $1 \times 10^{20}$ cm$^{-3}$.

Between source/drain region layers 6 and 8, a first gate electrode layer 98A is arranged in second semiconductor layer 92. First gate electrode layer 98A has one side surface extending in third semiconductor layer 93, and is doped with p-type impurities more heavily than third semiconductor layer 93.

Between source/drain region layers 6 and 8, a second gate electrode layer 98B doped with p-type impurities is arranged in fourth semiconductor layer 94. Second gate electrode layer 98B has one and the other side surfaces extending in third and fifth semiconductor layers 93 and 95, respectively, has substantially the same impurity concentration as first gate electrode layer 98A, and has the same potential as first gate electrode layer 98A.

Between source/drain region layers 6 and 8, a third gate electrode layer 98C doped with p-type impurities is arranged in sixth semiconductor layer 96. Third gate electrode layer 98C has one side surface extending in fifth semiconductor layer 95, has substantially the same impurity concentration as first gate electrode layer 98A, and has the same potential as first gate electrode layer 98A.

A first impurity doped region 99A of the p-type is arranged in third semiconductor layer 93 between first and second gate electrode layers 98A and 98B. First impurity doped region 99A has substantially the same impurity concentration as first gate electrode layer 98A, and has the same potential as first gate electrode layer 98A.

A second impurity doped region 99B of the p-type is arranged in fifth semiconductor layer 95 between second and third gate electrode layers 98B and 98C. Second impurity doped region 99B has substantially the same impurity concentration as first gate electrode layer 98A, and has the same potential as first gate electrode layer 98A.

Figure 65:
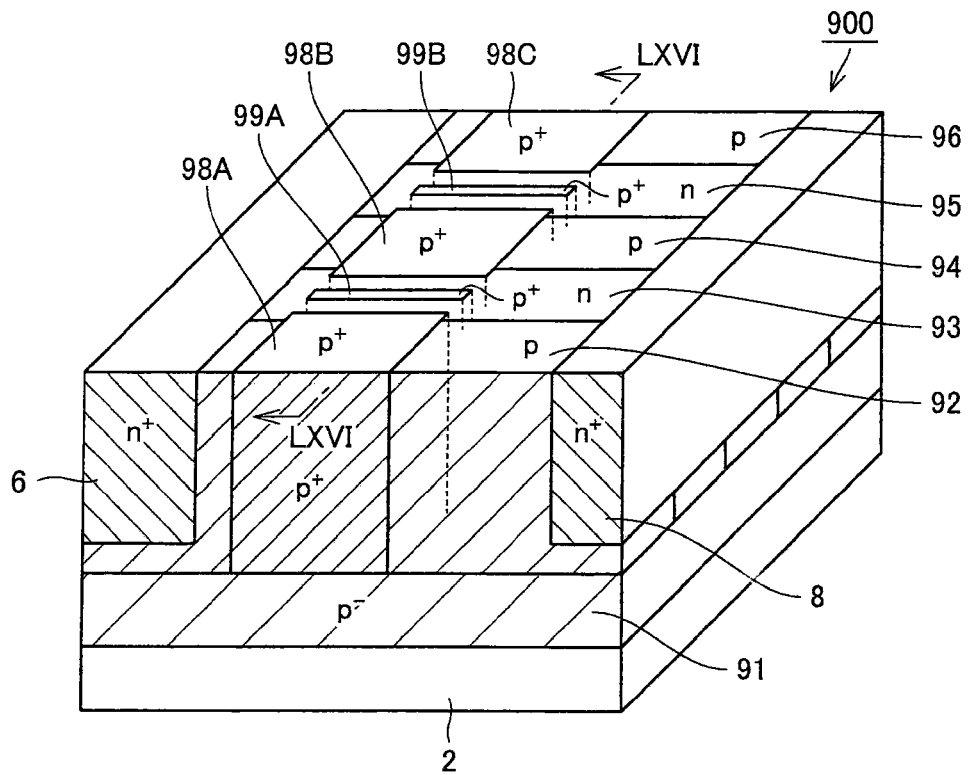
FIG. 65 is a cross section showing a structure of a lateral junction field effect transistor according to a ninth embodiment.
Figure 66:
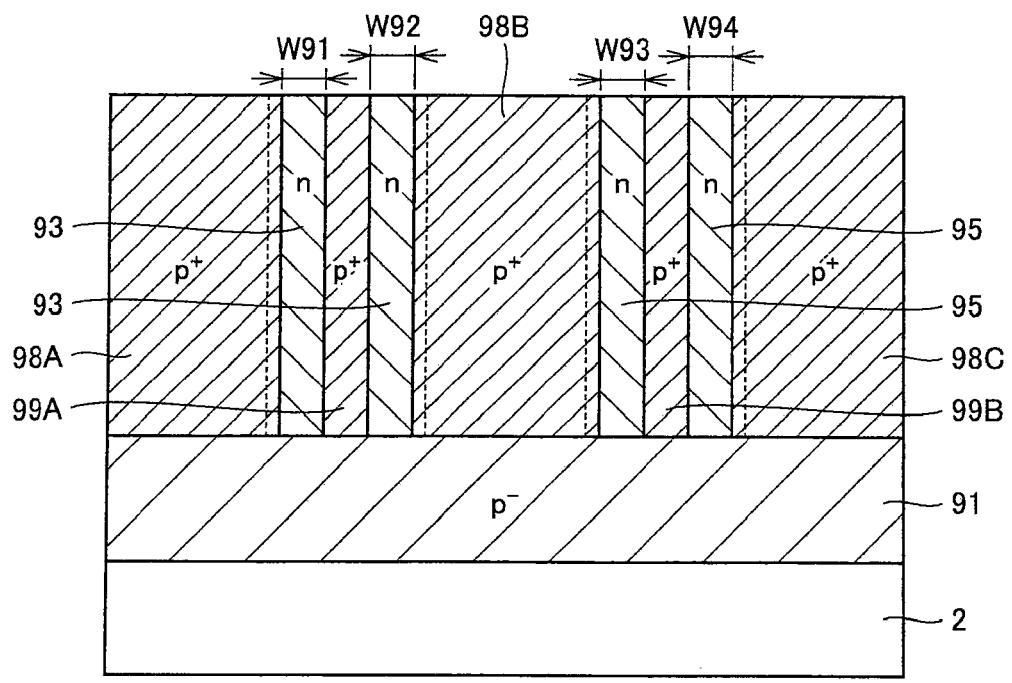
FIG. 66 is a cross section taken along line LXVI-LXVI in FIG. 65.

Although the structure shown in FIG. 65 is provided with first, second and third impurity doped regions 99A, 99B and 99C each formed of one layer, each of first, second and third impurity doped regions 99A, 99B and 99C may be formed of a plurality of layers for the purpose of achieving the normally-off type of the lateral junction field effect transistor, in which the total channel width is increased and the on-resistance is lowered.

The impurity concentrations of first, second and third gate electrode layers 98A, 98B and 98C as well as the first, second and third impurity doped regions 99A, 99B and 99C are in a range from about $3\times10^{18}$ cm$^{-3}$ to about $1\times10^{20}$ cm$^{-3}$.

The normally-off type of the lateral junction field effect transistor can be achieved by the following structure. A distance w91 between surfaces of first gate electrode layer 98A and first impurity doped region 99A, which are nearest to each other, is smaller than double a distance of a depletion layer extended by a diffused potential in a junction between third semiconductor layer 93 and first gate electrode layer 98A, and a distance w92 between first impurity doped region 99A and a surface of second gate electrode layer 98B, which are nearest to each other, is smaller than double a distance of a depletion layer extended by a diffused potential in a junction between third semiconductor layer 93 and first gate electrode layer 98A. Also, a distance w93 between surfaces of second gate electrode layer 98B and second impurity doped region 99B, which are nearest to each other, is smaller than double a distance of a depletion layer extended by a diffused potential in a junction between third semiconductor layer 93 and first gate electrode layer 98A, and a distance w94 between second impurity doped region 99B and a surface of third gate electrode layer 98C, which are nearest to each other, is smaller than double a distance of a depletion layer extended by a diffused potential in a junction between third semiconductor layer 93 and first gate electrode layer 98A.

(Method of Manufacturing Lateral Junction Field Effect Transistor 900)

A method of manufacturing lateral junction field effect transistor 900 having the above structures will now be described with reference to FIGS. 67 to 71.

Figure 67:
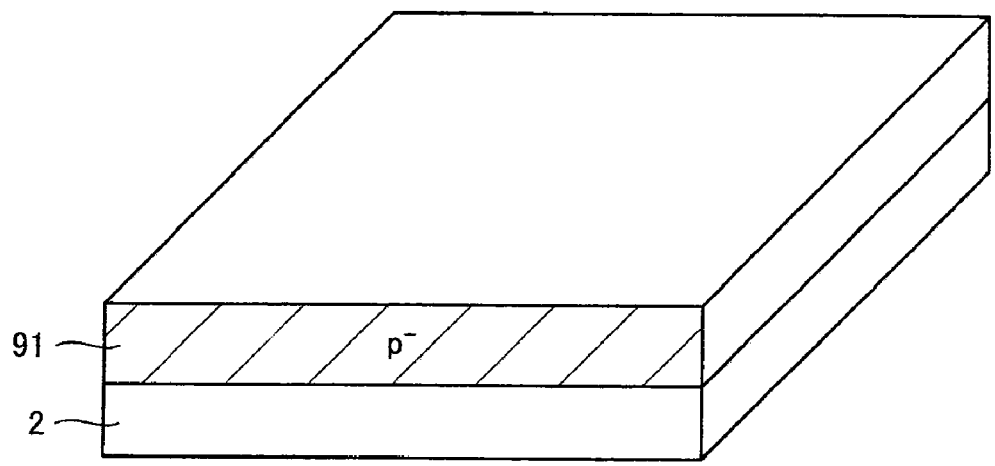
FIG. 67 is cross section showing a first step in a method of manufacturing the lateral junction field effect transistor according to the ninth embodiment.

Referring to FIG. 67, first semiconductor layer 91, which is made of SiC doped with p-type impurities, and has a layer thickness from about 3 μm to about 4 μm and an impurity concentration of about $1\times10^{16}$ cm$^{-3}$, is formed on semiconductor substrate 2 made of silicon and others by epitaxial growth.

Figure 68:
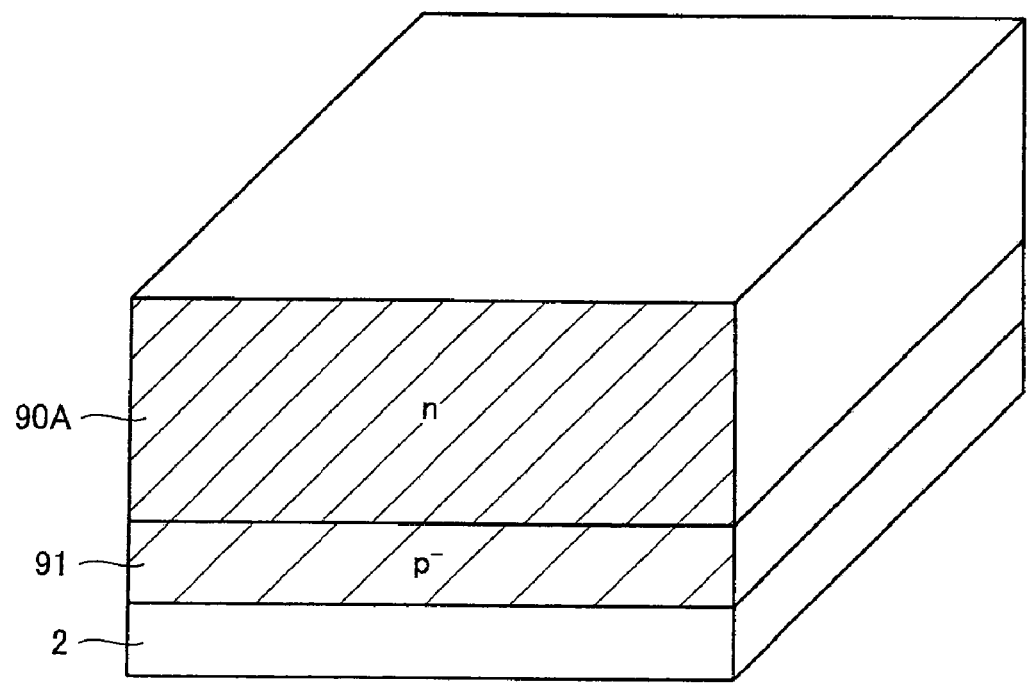
FIG. 68 is cross section showing a second step in a method of manufacturing the lateral junction field effect transistor according to the ninth embodiment.

Referring to FIG. 68, a semiconductor layer 90A, which is made of SiC doped with n-type impurities, and has a layer thickness from about 1 μm to about 2 μm and an impurity concentration from about $1\times10^{17}$ cm$^{-3}$ to about $3\times10^{17}$ cm$^{-3}$ higher than that of first semiconductor layer 91, is formed on first semiconductor layer 91 by epitaxial growth.

Figure 69:
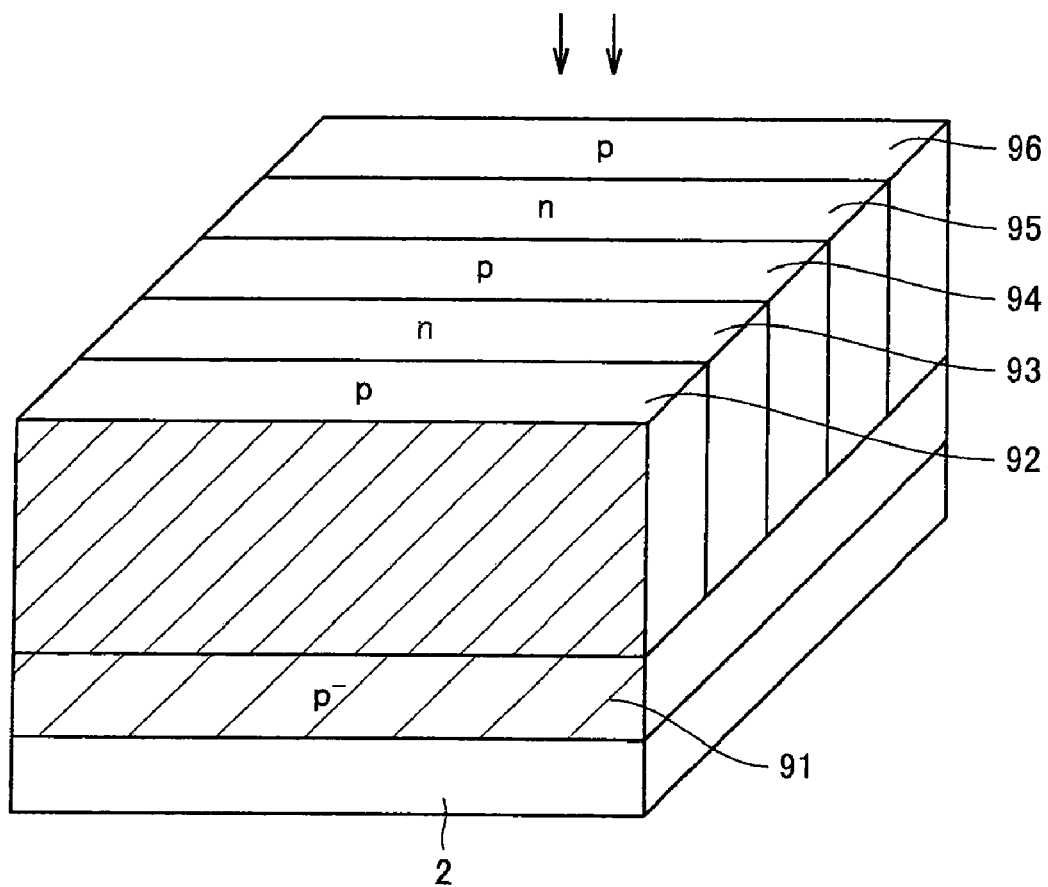
FIG. 69 is cross section showing a third step in a method of manufacturing the lateral junction field effect transistor according to the ninth embodiment.

Referring to FIG. 69, p-type impurities are implanted into predetermined regions of semiconductor layer 90A, which are spaced in a direction of a plane of substrate 2 (i.e., a direction perpendicular to a hatched section shown in FIG. 69) from each other so that second, fourth and sixth semiconductor layers 92, 94 and 96 of the p-type as well as third and fifth semiconductor layers 93 and 95 of the n-type are formed, has a layer thickness from about 0.5 μm to about 1.0 μm and is doped with impurities at concentration from about $1\times10^{17}$ cm$^{-3}$ to about $3\times10^{17}$ cm$^{-3}$.

Referring to FIG. 69, p-type impurities are then implanted into predetermined regions of second to sixth semiconductor layers 92, 93, 94, 95 and 96 to form first, second and third gate electrode layers 98A, 98B and 98C each having an impurity concentration from about $3\times10^{18}$ cm$^{-3}$ to about $1\times10^{20}$ cm$^{-3}$. First gate electrode layer 98A is located in second and third semiconductor layers 92 and 93. Second gate electrode layer 98B is located between third and fifth semiconductor layers 93 and 95, and extends thereinto. Third gate electrode layer 98C is located in fifth and sixth semiconductor layers 95 and 96. At the same time, first and second impurity doped regions 99A and 99B are formed in third and fifth semiconductor layers 93 and 95, respectively. Each of first and second impurity doped regions 99A and 99B has an impurity concentration from about $3\times10^{18}$ cm$^{-3}$ to about $1\times10^{20}$ cm$^{-3}$, which is substantially equal to those of first, second and third gate electrode layers 98A, 98B and 98C, and also has the same potential as first, second and third gate electrode layers 98A, 98B and 98C.

Figure 70:
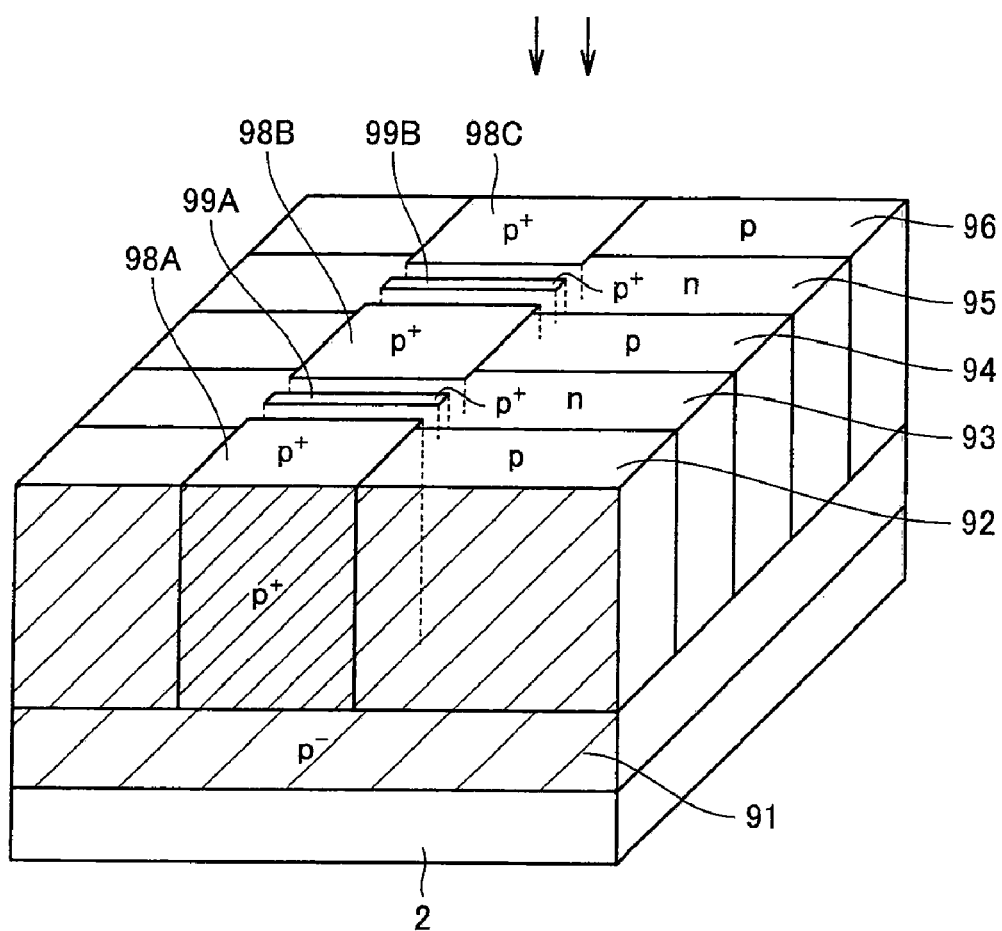
FIG. 70 is cross section showing a fourth step in a method of manufacturing the lateral junction field effect transistor according to the ninth embodiment.
Figure 71:
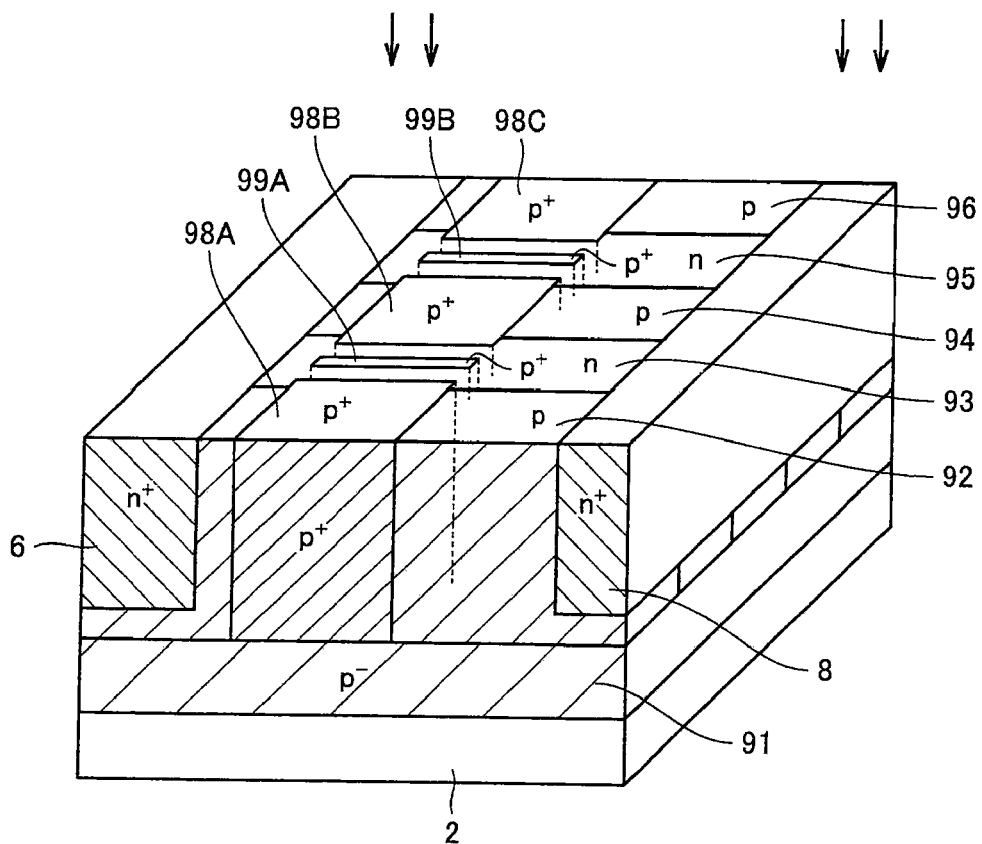
FIG. 71 is cross section showing a fifth step in a method of manufacturing the lateral junction field effect transistor according to the ninth embodiment.
Figure 72:
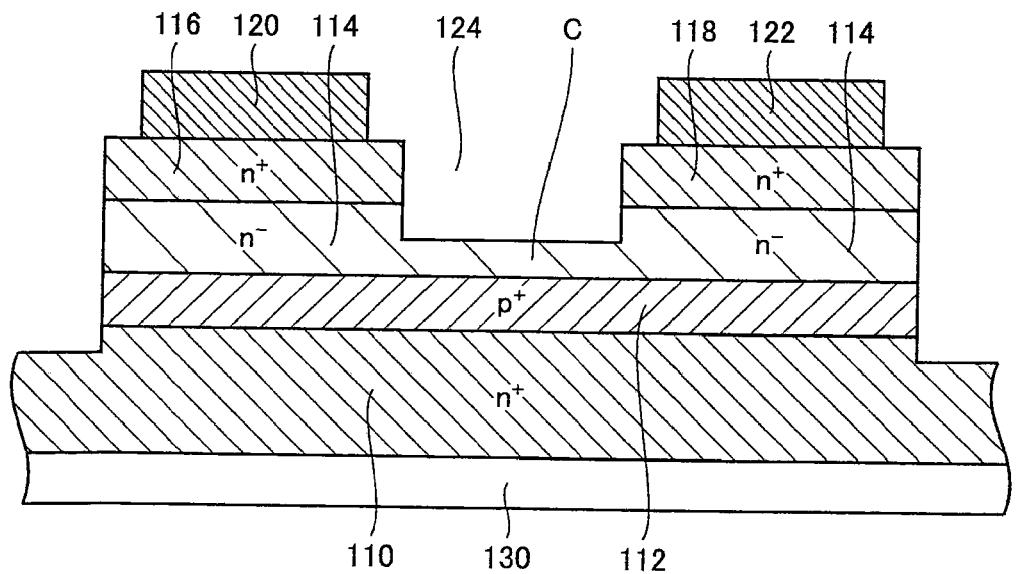
FIG. 72 is a cross section showing a structure of a lateral junction field effect transistor of a background art.

Referring to FIG. 70, n-type impurities are implanted into predetermined regions of second to sixth semiconductor layers 92, 93, 94, 95 and 96 to form source/drain region layers 6 and 8, each extending in the direction of arrangement of second to sixth semiconductor layers 92-96. Source/drain region layers 6 and 8 are located on the opposite sides of first to third gate electrode layers 98A, 98B and 98C as well as the first to third impurity doped regions 99A, 99B and 99C, and are doped with n-type impurities at a concentration from about $1\times10^{19}$ cm$^{-3}$ to about $1\times10^{20}$ cm$^{-3}$ higher than that of third semiconductor layer 93. Although not shown, the structure is then processed in various steps of surface thermal oxidization, opening, formation of Ni-electrode, formation of insulating layers (OCD and others), opening of contact holes, provision of aluminum interconnections, formation of pads, thermal processing, formation of ohmic contacts and others. Thereby, lateral junction field effect transistor 900 of the ninth embodiment shown in FIG. 65 is completed.

(Operation and Effect)

According to the lateral junction field effect transistor having the above structure as well as the method of manufacturing the same, since the respective semiconductor layers arranged on semiconductor substrate 2 neighbor to each other in the lateral direction, the transistor structure is formed in the direction of the plane of substrate. Therefore, the on-resistance of the element can be reduced, as compared with conventional structures. Further, the second, third, fourth, fifth and sixth semiconductor layers 92, 93, 94, 95 and 96 may have substantially the same impurity concentration and the same layer thickness so that the lateral junction field effect transistors can have the minimum on-resistance and the maximum breakdown voltage.

The numbers of the semiconductor layers, the gate electrode layers and the impurity doped regions are appropriately changed depending on the required performance of the lateral JFET. For example, the structure may employ three semiconductor layers, two gate electrode layers and one impurity doped region, or may employ four semiconductor layers, two gate electrode layers and two impurity doped regions.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

According to the invention, and particularly according to some aspects of the lateral junction field effect transistor and the method of manufacturing the same, the transistor structures are formed in a vertical direction, i.e., in the same direction as the stacking direction of the respective semiconductor layers on the semiconductor substrate. Therefore, the on-resistance of the element can be reduced, as compared with conventional structures.

According to some other aspects of the lateral junction field effect transistor and the method of manufacturing the same, the pn junctions are in the vertical direction, and the gate electrode layers are arranged in the lateral direction. Therefore, the on-resistance of the element can be reduced, as compared with conventional structures.

According to further aspects of the lateral junction field effect transistor and the method of manufacturing the same, the respective semiconductor layers arranged on the semiconductor substrate neighbor to each other in the lateral direction, and thereby the transistor structures are formed in the direction of the plane of the substrate so that the on-resistance of the element can be reduced, as compared with conventional structures.

The invention claimed is:

1. A lateral junction field effect transistor comprising:
   a first semiconductor layer located on a semiconductor substrate, and doped with impurities (p) of a first conductivity type;
   a second semiconductor layer located on said first semiconductor layer, and doped with impurities (n) of a second conductivity type more heavily than said first semiconductor layer;
   a third semiconductor layer located on said second semiconductor layer, and doped with impurities (p) of the first conductivity type;
   a fourth semiconductor layer located on said third semiconductor layer, and doped with impurities (n) of the second conductivity type;
   a fifth semiconductor layer located on said fourth semiconductor layer, and doped with impurities (p) of the first conductivity type;
   source/drain region layers formed in said fifth semiconductor layer, spaced from each other by a predetermined distance, having a lower surface extending on said second semiconductor layer, and doped with impurities of the second conductivity type more heavily than said second and fourth semiconductor layers;
   a first gate electrode layer arranged in said fifth semiconductor layer between said source/drain region layers, having a lower surface extending on said second semiconductor layer, and doped with impurities (p) of the first conductivity type more heavily than said second semiconductor layer; and
   a second gate electrode layer of the first conductivity type (p) arranged in said fifth semiconductor layer between said source/drain region layers, neighboring to said first gate electrode layer, having substantially the same impurity concentration as said first gate electrode layer, and having the same potential as said first gate electrode layer.

2. The lateral junction field effect transistor according to claim 1, wherein
   said second, third, fourth and fifth semiconductor layers substantially have the same impurity concentration and the same layer thickness.

3. The lateral junction field effect transistor according to claim 1, wherein
   a distance between said first and second gate electrode layers is smaller than a distance of a depletion layer extended by a diffused potential in a junction between said second semiconductor layer and said first gate electrode layer, and is smaller than double a distance of a depletion layer extended by a diffused potential in a junction between said fourth semiconductor layer and said first gate electrode layer.

4. The lateral junction field effect transistor according to claim 1, further comprising:
   one impurity doped region of the first conductivity type arranged between said first and second gate electrode layers, having a lower surface extending on said second semiconductor layer, having substantially the same impurity concentration as said first gate electrode layer, and having the same potential as said first gate electrode layer.

5. The lateral junction field effect transistor according to claim 4, wherein
   a distance between said first gate electrode layer and said impurity doped region and a distance between said impurity doped region and said second gate electrode layer are smaller that a distance of a depletion layer extended by a diffused potential in a junction between said second semiconductor layer and said first gate electrode layer and double a distance of a depletion layer extended by a diffused potential in a junction between said fourth semiconductor layer and said first gate electrode layer.

6. The lateral junction field effect transistor according to claim 5, further comprising:
   said impurity doped regions of two or more in number.

7. The lateral junction field effect transistor according to claim 5, wherein
   a distance between said first gate electrode layer and said impurity doped region nearest to said first gate electrode layer, a distance between said impurity doped regions, and a distance between said second gate electrode layer and the impurity doped region nearest to said second gate electrode layer are all smaller than a distance of a depletion layer extended by a diffused potential in a junction between said second semiconductor layer and said first gate electrode layer and double a distance of a depletion layer extended by a diffused potential in a junction between said fourth semiconductor layer and said first gate electrode layer.

8. The lateral junction field effect transistor according to claim 5, wherein
   one or more structure(s) being substantially the same as the structure having said third and fourth semiconductor layers is arranged between said fourth and fifth semiconductor layers.

* * * * *